(12) United States Patent
Takayama et al.

(10) Patent No.: US 11,948,823 B2
(45) Date of Patent: Apr. 2, 2024

(54) SUBSTRATE TREATING APPARATUS

(71) Applicant: SCREEN Holdings Co., Ltd., Kyoto (JP)

(72) Inventors: Yuichi Takayama, Kyoto (JP); Kazuhiko Nakazawa, Kyoto (JP); Hiromichi Kaba, Kyoto (JP); Toshihito Morioka, Kyoto (JP); Takuya Sato, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 18/051,144

(22) Filed: Oct. 31, 2022

(65) Prior Publication Data

US 2023/0089805 A1 Mar. 23, 2023

Related U.S. Application Data

(63) Continuation of application No. 17/014,072, filed on Sep. 8, 2020, now Pat. No. 11,521,881.

(30) Foreign Application Priority Data

Sep. 20, 2019 (JP) .................................. 2019-171513

(51) Int. Cl.
*H01L 21/677* (2006.01)
*B65G 47/91* (2006.01)
(Continued)

(52) U.S. Cl.
CPC ...... *H01L 21/67778* (2013.01); *B65G 47/911* (2013.01); *H01L 21/67196* (2013.01);
(Continued)

(58) Field of Classification Search
CPC ......... H01L 21/67778; H01L 21/67766; H01L 21/68707; H01L 21/67769; H01L 21/6838; B65G 47/911
See application file for complete search history.

(56) References Cited

U.S. PATENT DOCUMENTS 4,882,933 A * 11/1989 Petersen ............. G01P 15/0802
73/514.33
5,409,348 A 4/1995 Suzuki ..................... 414/416.03
(Continued)

FOREIGN PATENT DOCUMENTS

CN 1242753 A 1/2000
JP H11-071025 A 3/1999
(Continued)

OTHER PUBLICATIONS

Office Action dated Apr. 8, 2022 for Korean Patent Application No. 10-2020-0119879.
(Continued)

*Primary Examiner* — Gerald McClain
(74) *Attorney, Agent, or Firm* — Ostrolenk Faber LLP

(57) ABSTRACT

A substrate treating apparatus includes a carrier platform, a transport mechanism, and a controller. The carrier platform places a carrier thereon. The carrier includes a plurality of shelves arranged in an up-down direction. The shelves are each configured to place one substrate thereon in a horizontal posture. The transport mechanism is configured to transport a substrate to a carrier placed on the carrier platform. The controller controls the transport mechanism. The transport mechanism includes a hand and a hand driving unit. The hand supports a substrate. The hand driving unit moves the hand. The controller changes a height position of the hand when the hand is inserted between two of the shelves adjacent to each other in the up-down direction, depending on a shape of a substrate taken from or placed on one of the shelves by the transport mechanism.

7 Claims, 31 Drawing Sheets

(51) Int. Cl.
  *H01L 21/67* (2006.01)
  *H01L 21/687* (2006.01)
  *H01L 21/683* (2006.01)

(52) U.S. Cl.
  CPC .. *H01L 21/67766* (2013.01); *H01L 21/68707* (2013.01); *H01L 21/67167* (2013.01); *H01L 21/67769* (2013.01); *H01L 21/6838* (2013.01)

(56) References Cited

U.S. PATENT DOCUMENTS

| | | | |
|---|---|---|---|
| 6,144,926 | A | 11/2000 | Ishizawa ..................... 702/94 |
| 6,203,617 | B1 | 3/2001 | Tanoue ..................... 118/320 |
| 6,208,909 | B1 | 3/2001 | Kato et al. ................. 700/218 |
| 6,950,721 | B2 | 9/2005 | Tashiro ..................... 414/935 |
| 7,104,579 | B2 | 9/2006 | Casarotti ................... 294/185 |
| 7,596,456 | B2 | 9/2009 | Mollenkopf ................. 702/33 |
| 8,167,521 | B2 * | 5/2012 | Nakao ............ H01L 21/68707 414/172 |
| 8,196,983 | B2 | 6/2012 | Nagasaka .................. 294/64.2 |
| 9,202,732 | B2 | 12/2015 | Enomoto |
| 9,373,531 | B2 | 6/2016 | Murata |
| 11,004,713 | B2 | 5/2021 | Houng |
| 11,521,881 | B2 * | 12/2022 | Takayama ........... H01L 21/6732 |
| 2004/0150237 | A1 | 8/2004 | Casarotti ................... 294/185 |
| 2007/0029227 | A1 | 2/2007 | Bonora ...................... 206/711 |
| 2007/0118300 | A1 | 5/2007 | Mollenkopf ................. 702/33 |
| 2008/0045015 | A1 | 2/2008 | Sekiya ...................... 438/691 |
| 2008/0267741 | A1 | 10/2008 | Nagasaka et al. ........... 414/217 |
| 2016/0049326 | A1 | 2/2016 | Onishi et al. |
| 2020/0098604 | A1 | 3/2020 | Sugimoto |
| 2020/0101624 | A1 * | 4/2020 | Sakata ............. H01L 21/67766 |
| 2021/0086222 | A1 | 3/2021 | Takayama |
| 2021/0035896 | A1 | 11/2021 | Kakinuma |
| 2022/0020614 | A1 | 1/2022 | Masuda |

FOREIGN PATENT DOCUMENTS

| | | | |
|---|---|---|---|
| JP | 2003-051525 | A | 2/2003 |
| JP | 2003-261221 | A | 9/2003 |
| JP | 2005-228863 | A | 8/2005 |
| JP | 2007-266033 | A | 10/2007 |
| JP | 2008-047695 | A | 2/2008 |
| JP | 2008-270626 | A | 11/2008 |
| JP | 2009-071041 | A | 4/2009 |
| JP | 2010-287783 | A | 12/2010 |
| JP | 2017-011178 | A | 1/2017 |
| JP | 2018-207032 | A | 12/2018 |
| JP | 6486779 | B2 | 3/2019 |
| JP | 6486779 | B2 * | 3/2019 |
| JP | 2021-048360 | A | 3/2021 |
| KR | 10-2005-0070379 | A | 7/2005 |
| KR | 102014-0085707 | A | 7/2014 |
| TW | 200849459 | A | 12/2008 |
| TW | 201618899 | A | 6/2016 |
| TW | 201901842 | A | 1/2019 |
| WO | WO 2018/207599 | A1 | 11/2018 |
| WO | WO 2018233825 | A1 | 12/2018 |

OTHER PUBLICATIONS

Office Action dated Sep. 16, 2021 for Taiwan Patent Application No. 109128501.

Office Action dated Apr. 25, 2023 for corresponding Japanese Patent Application No. 2019-171513.

* cited by examiner

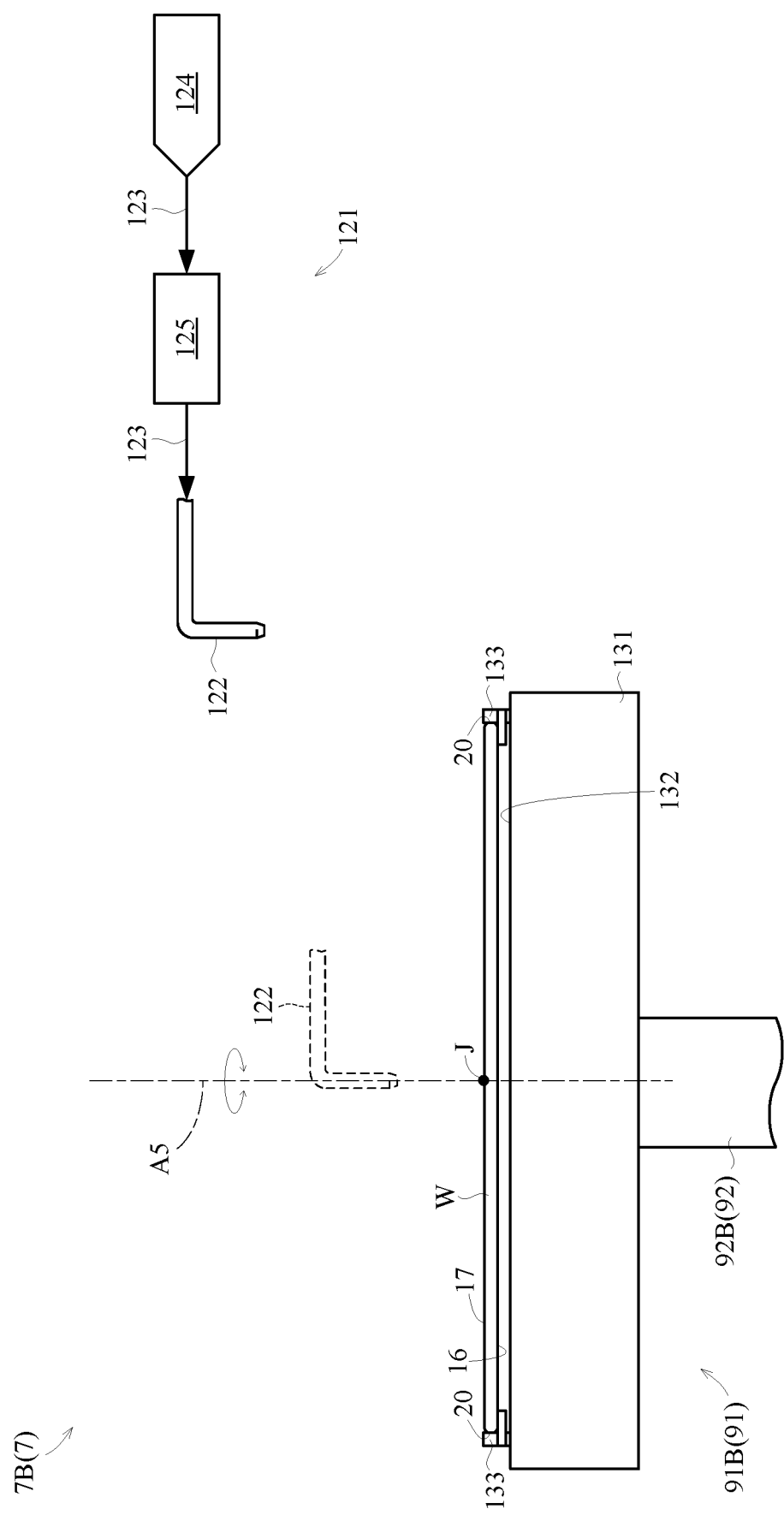

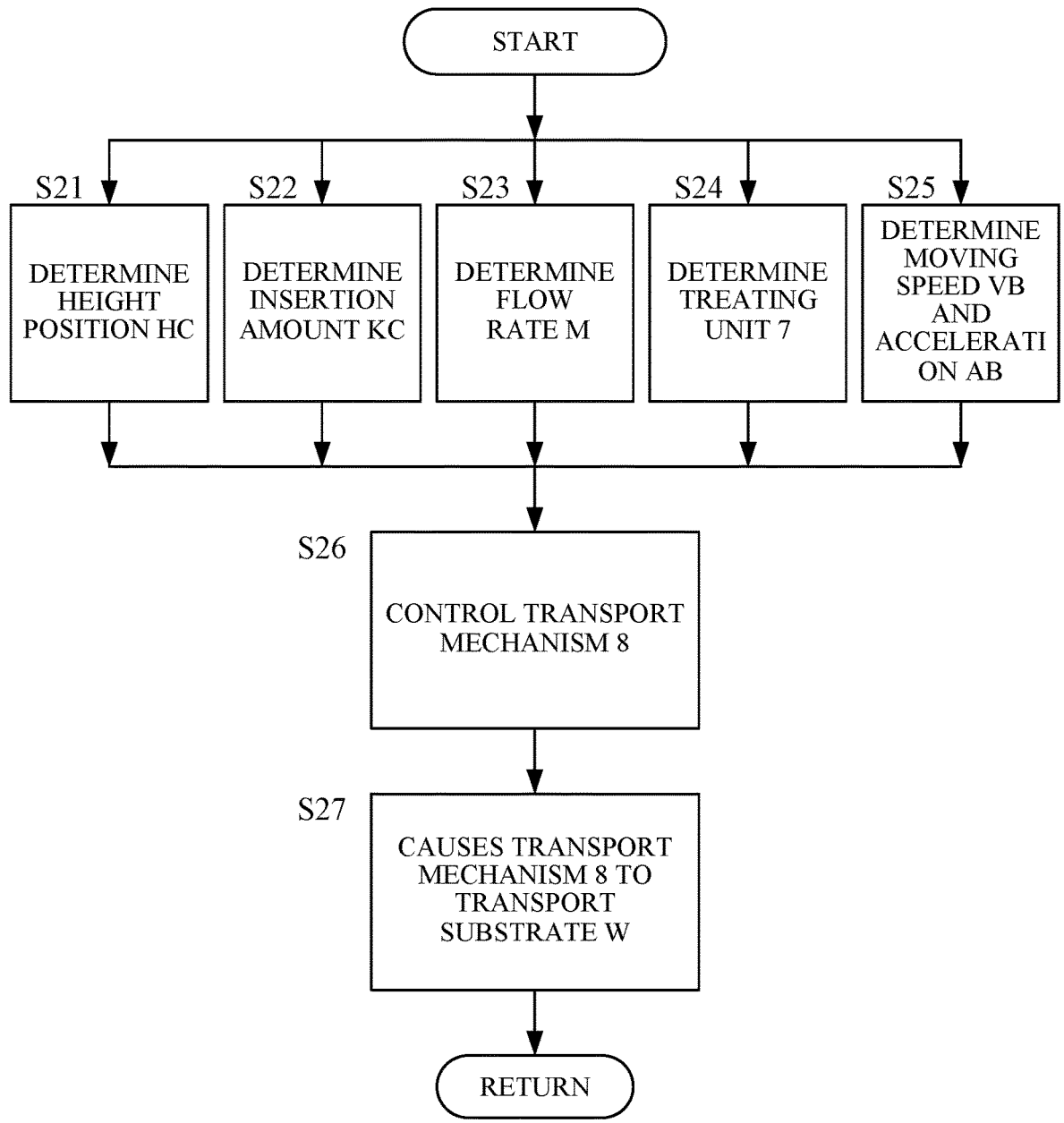

SUBSTRATE TREATING APPARATUS

CROSS-REFERENCE TO RELATED APPLICATIONS

This is a continuation of U.S. patent application Ser. No. 17/014,072, filed Sep. 8, 2020, which is based on Japanese Patent Application No. 2019-171513, filed Sep. 20, 2019, the contents of all of which are incorporated by reference herein.

BACKGROUND OF THE INVENTION

Field of the Invention

The present invention relates to a substrate treating apparatus that performs treatment to substrates. Examples of the substrates include a semiconductor wafer, a substrate for liquid crystal display, a substrate for organic electroluminescence (EL), a substrate for flat plasma display (FPD), a substrate for optical display, a magnetic disk substrate, an optical disk substrate, a magneto-optical disk substrate, a substrate for photomask, and a solar cell substrate.

Background Art

Japanese Unexamined Patent Publication No. 2008-270626A discloses a substrate treating apparatus. Hereinunder, numerals in Japanese Unexamined Patent Publication Application No. 2008-270626A are expressed in parentheses. A substrate treating apparatus (1) includes a load port (16) and an inspecting device. The load port (16) houses a cassette (C). The cassette (C) houses a plurality of wafers (W). The inspecting device includes a main chuck (13) and a probe card (14). A substrate (W) is placed on the main chuck (13). The probe card (14) is provided above the main chuck (13).

The substrate treating apparatus (1) further includes a substrate transport device (18). The substrate transport device (18) holds a substrate (W) in accordance with the Bernoulli's principle. The substrate transport device (18) transports a substrate (W) between the cassette (C) housed in the load port (16) and the main chuck (13).

The substrate transport device (18) includes tweezers (17) and a suction device (171). The suction device (171) is installed on a lower surface of the tweezers (17). The suction device (171) is in communication with a high pressure air source. The high pressure air source supplies high pressure air to the suction device (171). When the suction device (171) is positioned above a substrate (W), high pressure air flows out from the suction device (171) through a gap between the suction device (171) and an upper face of the substrate (W). This causes the suction device (171) to hold the upper face of the substrate (W).

SUMMARY OF THE INVENTION

In recent years, substrates have become thinner and larger in diameter. A bending amount of a substrate is remarkably larger as the substrate is thinner and the diameter thereof is larger. Consequently, the currently-used substrate transport device (18) may have difficulty in transporting a substrate to the cassette suitably.

The present invention has been made regarding the state of the art noted above, and its one object is to provide a substrate treating apparatus that enables suitable transportation of a substrate.

Solution to Problem

To achieve the object, the present invention provides a configuration as follows. One aspect of the present invention provides a substrate treating apparatus, including a carrier platform configured to place a carrier thereon, a transport mechanism configured to transport a substrate to the carrier placed on the carrier platform, and a controller configured to control the transport mechanism. The carrier includes a plurality of shelves arranged in an up-down direction, the shelves being each configured to place one substrate thereon in a horizontal posture. The transport mechanism includes a hand configured to support a substrate, and a hand driving unit configured to move the hand. The controller changes a height position of the hand when the hand is inserted between two of the shelves adjacent to each other in an up-down direction, depending on at least either a shape of a substrate taken from one of the shelves by the transport mechanism or a shape of a substrate placed on one of the shelves by the transport mechanism.

The substrate treating apparatus includes the carrier platform, the transport mechanism, and the controller. The transport mechanism is configured to transport a substrate to a carrier placed on the carrier platform. The carrier includes the shelves arranged in the up-down direction. The controller changes the height position of the hand when the hand is inserted between two of the shelves adjacent to each other in the up-down direction, depending on the shape of the substrate. More specifically, the controller changes a height position of the hand when the hand is inserted between two of the shelves adjacent to each other in the up-down direction, depending on at least either a shape of a substrate taken from one of the shelves by the transport mechanism or a shape of a substrate placed on one of the shelves by the transport mechanism. Accordingly, the hand can enter between two of the shelves adjacent to each other in the up-down direction suitably regardless of the shape of the substrate. Consequently, the transport mechanism can transport the substrate to the carrier suitably.

As described above, the substrate treating apparatus can transport a substrate suitably.

Another aspect of the present disclosure provides a substrate treating apparatus, including: a mount table; a transport mechanism configured to transport a substrate to the mount table; and a controller configured to control the transport mechanism, wherein the mount table includes: a plurality of shelves arranged in an up-down direction, the shelves are each configured to place one substrate thereon in a horizontal posture, the transport mechanism includes: a hand configured to support a substrate; and a hand driving unit configured to move the hand, and the controller changes a height position of the hand when the hand is inserted between two of the shelves adjacent to each other in an up-down direction, depending on at least either a shape of a substrate taken from one of the shelves by the transport mechanism or a shape of a substrate placed on one of the shelves by the transport mechanism.

The substrate treating apparatus includes the mount table, the transport mechanism, and the controller. The transport mechanism is configured to transport a substrate to the mount table. The mount table includes the shelves arranged in the up-down direction. The controller changes the height position of the hand when the hand is inserted between two of the shelves adjacent to each other in the up-down direction, depending on the shape of the substrate. More specifically, the controller changes a height position of the hand when the hand is inserted between two of the shelves adjacent to each other in the up-down direction, depending on at least either a shape of a substrate taken from one of the shelves by the transport mechanism or a shape of a substrate placed on one of the shelves by the transport mechanism. Accordingly, the hand can enter between two of the shelves adjacent to each other in the up-down direction suitably regardless of the shape of the substrate. Consequently, the transport mechanism can transport the substrate W to the mount table suitably.

As described above, the substrate treating apparatus can transport a substrate suitably.

In the above-described substrate treating apparatus, it is preferred that the controller changes the height position of the hand when the hand is inserted between two of the shelves adjacent to each other in the up-down direction in accordance with a thickness of a main portion of a substrate, the main part located inward of a peripheral portion of the substrate. The hand can enter between two of the shelves adjacent to each other in the up-down direction suitably regardless of the thickness of the main portion of the substrate. Consequently, the transport mechanism can transport the substrate suitably.

In the above-described substrate treating apparatus, it is preferred that a plurality of the substrates include: a first substrate that has a recess and does not include a protective plate made of glass, the recess being formed by a main portion of the substrate, located inward of a peripheral portion of the substrate, being recessed than the peripheral portion of the substrate, and a second substrate that does not have the recess. When a substrate taken from or placed on one of the shelves by the transport mechanism corresponds to the first substrate, the hand enters between two of the shelves adjacent to each other in the up-down direction at a first height position When a substrate taken from or placed on one of the shelves by the transport mechanism corresponds to the second substrate, the hand enters between two of the shelves adjacent to each other in the up-down direction at a second height position higher than the first height position. When the transport mechanism takes the first substrate from one of the shelves, the hand enters between two of the shelves adjacent to each other in the up-down direction at the first height position. When the transport mechanism places the first substrate on one of the shelves, the hand enters between two of the shelves to each other in the up-down direction at the first height position. When the transport mechanism takes the second substrate from one of the shelves, the hand enters between two of the shelves adjacent to each other in the up-down direction at the second height position. When the transport mechanism places the second substrate on one of the shelves, the hand enters between two of the shelves to each other in the up-down direction at the second height position. Here, the first height position is lower than the second height position. Accordingly, when the transport mechanism takes the first substrate from one of the shelves, the hand can enter between two of the shelves adjacent to each other in the up-down direction suitably. When the transport mechanism places the first substrate on one of the shelves, the hand can enter between two of the shelves to each other in the up-down direction suitably. The second height position is higher than the first height position. Accordingly, when the transport mechanism takes the second substrate from one of the shelves, the hand can enter between two of the shelves adjacent to each other in the up-down direction suitably. When the transport mechanism places the second substrate on one of the shelves, the hand can enter between two of the shelves to each other in the up-down direction suitably.

In the above-described substrate treating apparatus, it is preferred that a plurality of the substrates include: a first substrate that has a recess and does not include a protective plate made of glass, the recess being formed by a main portion of the substrate, located inward of a peripheral portion of the substrate, being recessed than the peripheral portion of the substrate, and a third substrate that has a recess and includes a protective plate made of glass, when a substrate taken from or placed on one of the shelves by the transport mechanism corresponds to the first substrate, the hand enters between two of the shelves adjacent to each other in the up-down direction at a first height position, and when a substrate taken from or placed on one of the shelves by the transport mechanism corresponds to the third substrate, the hand enters between two of the shelves adjacent to each other in the up-down direction at a third height position higher than the first height position. When the transport mechanism takes the first substrate from one of the shelves or places the first substrate on one of the shelves, the hand enters between two of the shelves adjacent to each other in the up-down direction at the first height position. When the transport mechanism takes the third substrate from one of the shelves or places the third substrate on one of the shelves, the hand enters between two of the shelves adjacent to each other in the up-down direction at the third height position. Here, the first height position is lower than the third height position. Accordingly, the transport mechanism takes the first substrate from one of the shelves or places the third substrate on one of the shelves, the hand can enter between two of the shelves adjacent to each other in the up-down direction suitably. The third height position is higher than the first height position. Accordingly, the transport mechanism takes the third substrate from one of the shelves or places the third substrate on one of the shelves, the hand can enter between two of the shelves adjacent to each other in the up-down direction suitably.

In the above-described substrate treating apparatus, it is preferred that the controller changes an insertion amount of the hand when the hand is inserted between two of the shelves adjacent to each other in the up-down direction, depending on at least either a shape of a substrate taken from one of the shelves by the transport mechanism or a shape of a substrate placed on one of the shelves by the transport mechanism. The controller changes the insertion amount of the hand when the hand is inserted between two of the shelves adjacent to each other in the up-down direction, depending on the shape of the substrate. More specifically, the controller changes the insertion amount of the hand when the hand is inserted between two of the shelves adjacent to each other in the up-down direction, depending on at least either a shape of a substrate taken from one of the shelves by the transport mechanism or a shape of a substrate placed on one of the shelves by the transport mechanism. Accordingly, the hand can take the substrate from one of the shelves at a suitable position regardless of the shape of the substrate. Moreover, the hand can place the substrate on one of the shelves at a suitable position regardless of the shape of the substrate.

In the above-described substrate treating apparatus, it is preferred that a plurality of the substrates include: a normal diameter substrate; and a large diameter substrate that has a diameter larger than a diameter of the normal diameter substrate, when a substrate taken from or placed on one of the shelves by the transport mechanism corresponds to the normal diameter substrate, the insertion amount of the hand inserted between two of the shelves adjacent to each other in the up-down direction corresponds to a first insertion amount, and when a substrate taken from or placed on one of the shelves by the transport mechanism corresponds to the large diameter substrate, the insertion amount of the hand inserted between two of the shelves adjacent to each other in the up-down direction corresponds to a second insertion amount larger than the first insertion amount. When the transport mechanism takes the normal diameter substrate from one of the shelves, the hand is inserted between two of the shelves to each other in the up-down direction by the first insertion amount. When the transport mechanism places the normal diameter substrate on one of the shelves, the hand is inserted between two of the shelves to each other in the up-down direction by the first insertion amount. When the transport mechanism takes the large diameter substrate from one of the shelves, the hand is inserted between two of the shelves to each other in the up-down direction by the second insertion amount. When the transport mechanism places the large diameter substrate on one of the shelves, the hand is inserted between two of the shelves to each other in the up-down direction by the second insertion amount. Here, the first insertion amount is smaller than the second insertion amount. Conversely, the second insertion amount is larger than the first insertion amount. Accordingly, the hand can take the substrate from one of the shelves at a suitable position regardless of the diameter of the substrate. Moreover, the hand can place the substrate on one of the shelves at a suitable position regardless of the diameter of the substrate.

In the above-described substrate treating apparatus, it is preferred that the hand supports a substrate by contacting at least either a back face of the substrate or an edge of the substrate. Even when the hand supports the substrate in such a manner as above, the hand can place the substrate on one of the shelves suitably and can take the substrate from one of the shelves suitably.

In the above-described substrate treating apparatus, it is preferred that the hand includes: two rods extending in a first horizontal direction, and configured to support the substrate, the rods each have a length equal to or larger than a diameter of the substrate, the rods each have a cross-sectional shape that is uniform along the first direction, and when the hand enters between two of the shelves adjacent to each other in the up-down direction, the hand moves along the first direction. Even if the space between two of the shelves adjacent to each other in the up-down direction is small, the rods can enter between the two of the shelves adjacent to each other in the up-down direction suitably.

In the above-described substrate treating apparatus, it is preferred that the hand includes a suction portion configured to flow gas along a first face of the substrate, and configured to suck the substrate without contacting the substrate. The hand can support a substrate suitably.

In the above-described substrate treating apparatus, it is preferred that the shelves each include: a first shelf configured to receive a first side portion of the substrate; and a second shelf configured to receive a second side portion of the substrate. Even when the shelves support substrates in such a manner as above, the transport mechanism can transport the substrates to the shelves suitably.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIG. 24 is a diagram schematically showing a second treating unit.
FIG. 33 is another flow chart showing procedures of control by the controller and operation of the transport mechanism.

DESCRIPTION OF EMBODIMENTS

The following describes a substrate treating apparatus of the present invention with reference to the drawings.

Outline of Substrate Treating Apparatus

Figure 1:
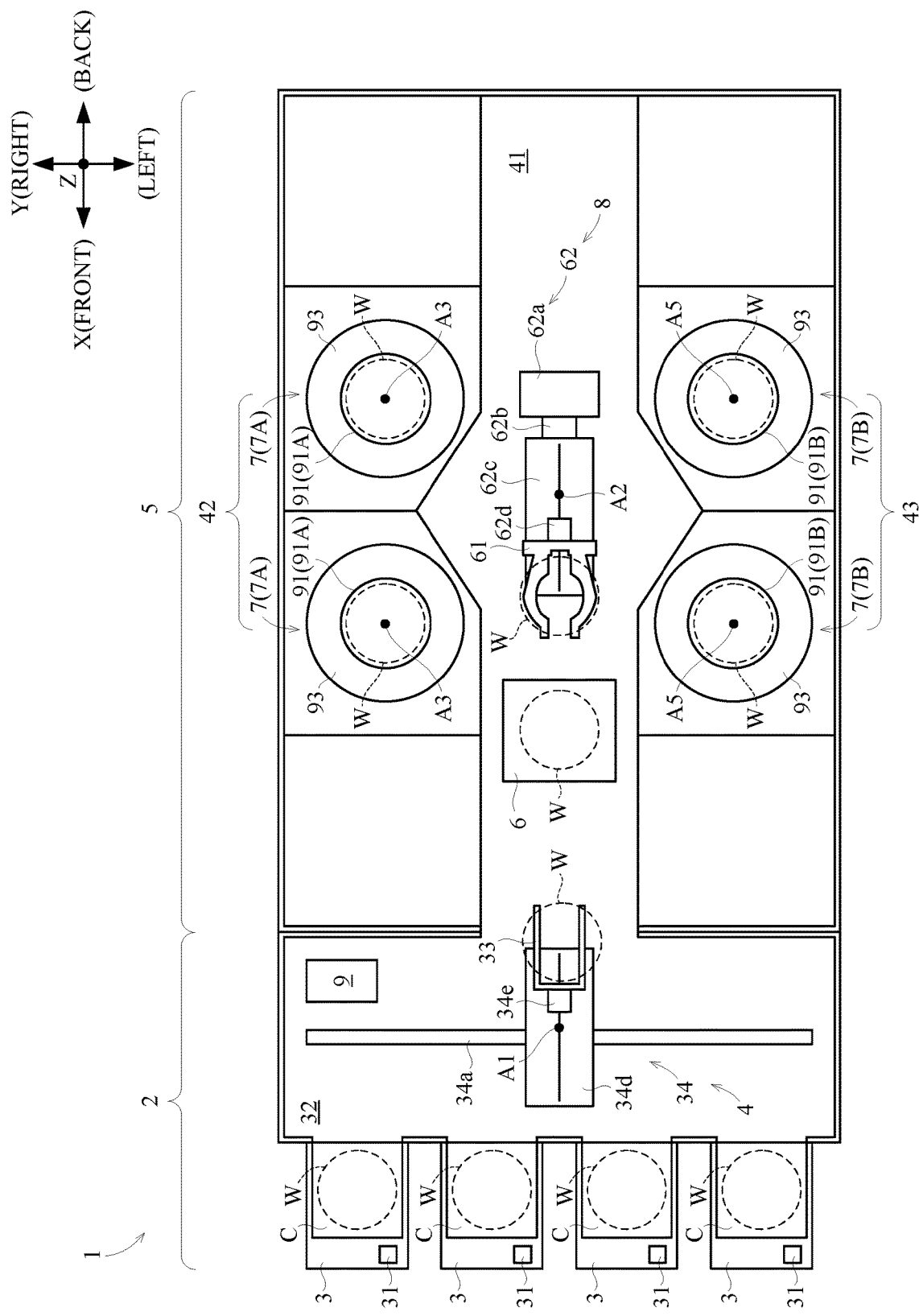
FIG. 1 is a plan view of the substrate treating apparatus according to one embodiment.

FIG. 1 is a plan view of the substrate treating apparatus according to one embodiment. A substrate treating apparatus 1 performs treatment on substrates W.

Examples of the substrates W include a semiconductor wafer, a substrate for liquid crystal display, a substrate for organic electroluminescence (EL), a substrate for flat plasma display (FPD), a substrate for optical display, a magnetic disk substrate, an optical disk substrate, a magneto-optical disk substrate, a substrate for photomask, and a solar cell substrate.

The substrate treating apparatus 1 includes an indexer 2. The indexer 2 includes a plurality of (e.g., four) carrier platforms 3. The carrier platforms 3 each place one carrier C thereon. The carrier C accommodates a plurality of substrates W. The carrier C is, for example, a front opening unified pod (FOUP). The indexer 2 includes a transport mechanism 4. The transport mechanism 4 is capable of accessing the carriers C placed on all the carrier platforms 3.

The substrate treating apparatus 1 includes a treating block 5. The treating block 5 is connected to the indexer 2.

The treating block 5 includes a mount table 6. The mount table 6 places the substrates W thereon. The treating block 5 includes a plurality of treating units 7.

The treating units 7 each perform treatment on one substrate W. The treating block 5 includes a transport mechanism 8. The transport mechanism 8 is accessible to the mount table 6 and all the treating units 7. The transport mechanism 8 transports the substrate W to the mount table 6 and the treating units 7.

The mount table 6 is disposed between the transport mechanism 4 and the transport mechanism 8. The transport mechanism 4 is also accessible to the mount table 6. The transport mechanism 4 transports substrates W to the mount table 6. The mount table 6 places the substrates W transported between the transport mechanism 4 and the transport mechanism 8.

The substrate treating apparatus 1 includes a controller 9. The controller 9 controls the transport mechanisms 4, 8 and the treating units 7.

Figure 2:
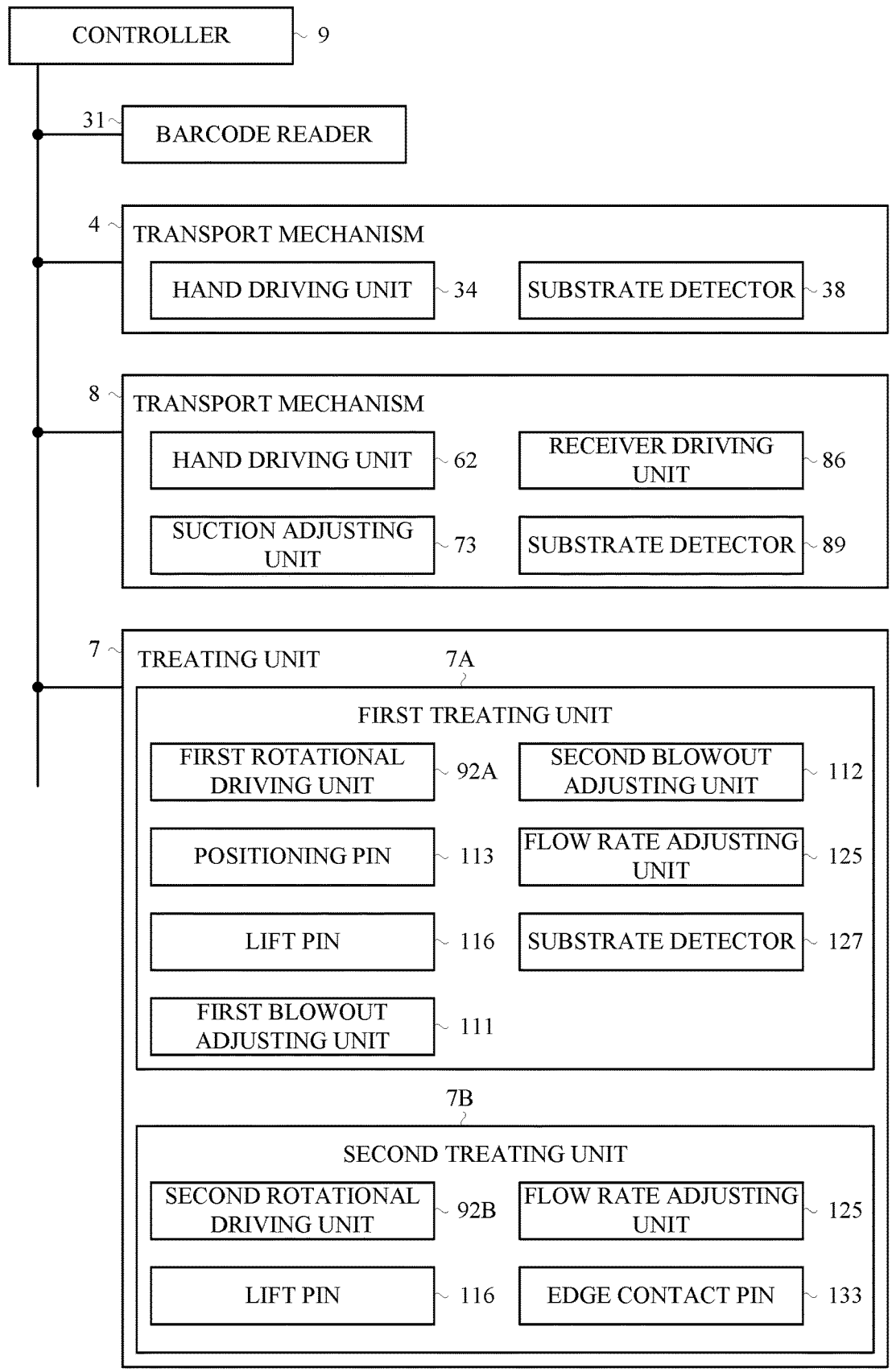
FIG. 2 is a control block diagram of the substrate treating apparatus.

FIG. 2 is a control block diagram of the substrate treating apparatus 1. The controller 9 is communicatively connected with the transport mechanisms 4, 8 and the treating units 7.

The controller 9 is implemented by a central processing unit (CPU) that performs various processes, a RAM (Random-Access Memory) as a workspace of arithmetic processing, and a storage medium such as a fixed disk. The storage medium stores various kinds of information in advance. The storage medium stores, for example, information on operating conditions of the transport mechanisms 4, 8 and the treating units 7. The information on the operating conditions of the treating units 7 is, for example, a treatment recipe (processing program) for treating the substrates W. The storage medium stores information on identification of the substrates W, for example.

The following describes one example of operation of the substrate treating apparatus 1. The transport mechanism 4 transports a substrate W from a carrier C on the carrier platform 3 to the mount table 6. The transport mechanism 8 transports the substrate W from the mount table 6 to one of the treating units 7. The treating unit 7 treats the substrate W. The transport mechanism 8 transports the substrate W from the treating unit 7 to the mount table 6. The transport mechanism 4 transports the substrate W from the mount table 6 to a carrier C on the carrier platform 3.

The transport mechanism 4 is one example of the second transport mechanism in the present invention. The transport mechanism 8 is one example of the first transport mechanism in the present invention. The mount table 6 is disposed in one position as one example of either the first position or the second position in the present invention. The treating unit 7 is disposed in the other position as one example of either the first position or the second position in the present invention.

Reference is made to FIG. 1. In this specification, the direction in which the indexer 2 and the treating block 5 are arranged is referred to as a "front-back direction X" for convenience. The front-back direction X is horizontal. One direction of the front-back direction X from the indexer 2 to the treating block 5 is referred to as a "forward direction". The direction opposite to the forward direction is referred to as a "rearward direction". A horizontal direction orthogonal to the front-back direction X is referred to as a "width direction Y" or a "lateral direction". Moreover, one direction of the width direction Y is referred to as a "rightward direction" appropriately. The direction opposite to the rightward direction is referred to as a "leftward direction". Moreover, a vertical direction is referred to as an "up-down direction Z". The up-down direction Z is orthogonal to the front-back direction X and the width direction Y. In each of the drawings, the terms front, back, right, left, up, and down are indicated appropriately.

Shape of Substrate W

Figure 3:
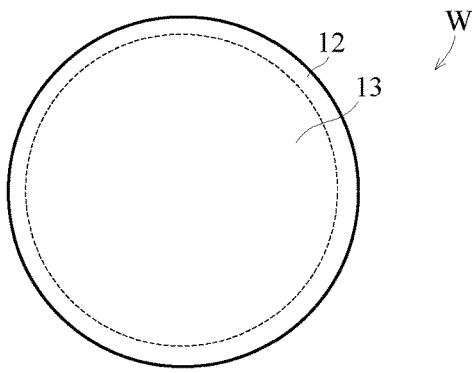
FIG. 3 is a plan view of a substrate.

FIG. 3 is a plan view of a substrate W. The following describes a basic shape of the substrate W. The substrate W has a thin flat shape. The substrate W has a substantially circular shape in plan view. The substrate W includes a peripheral portion 12 and a main portion 13. The main portion 13 is a part of the substrate W located inward of the peripheral portion 12. Semiconductor devices are formed in the main portion 13. FIG. 3 shows the borders of the peripheral portion 12 and the main portion 13 by dotted lines for convenience.

In this specification, the substrate W is classified into several types in accordance with the shapes thereof. Firstly, the substrate W is classified into a first substrate W1, a second substrate W2, and a third substrate W3 depending on a thickness of the main portion 13 of the substrate W.

Figure 4A:
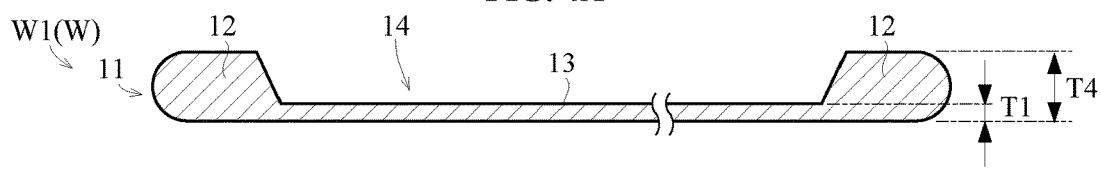
FIG. 4A is a cross-sectional view of a first substrate.
Figure 4B:
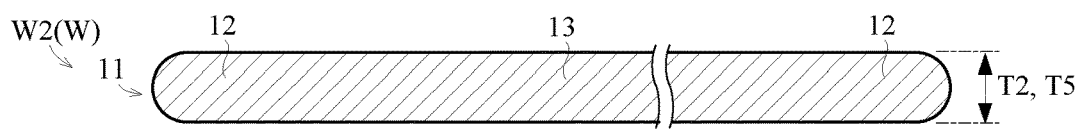
FIG. 4B is a cross-sectional view of a second substrate.
Figure 4C:
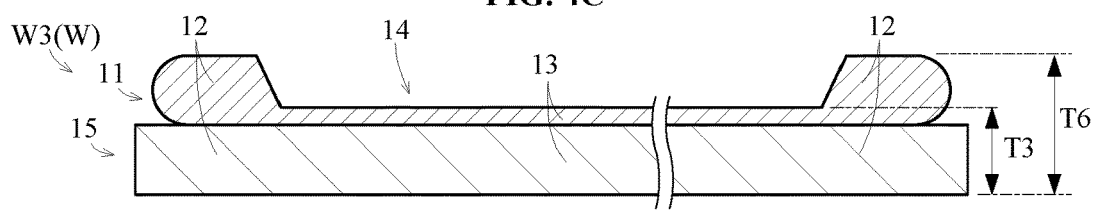
FIG. 4C is a cross-sectional view of a third substrate.

FIG. 4A is a cross-sectional view of the first substrate W1. FIG. 4B is a cross-sectional view of the second substrate W2. FIG. 4C is a cross-sectional view of the third substrate W3. The first substrate W1 is a substrate W having a recess 14 formed by the main portion 13 of the substrate W being recessed than the peripheral portion 12, and not including a protective plate 15 made of glass. The recess 14 is formed, for example, by a grinding process. The second substrate W2 is a substrate W not including the recess 14. The third substrate W3 is a substrate W including the recess 14 and the protective plate 15 made of glass. Here, the first substrate W1 may be formed by a substrate body 11 only. Alternatively, the first substrate W1 may include, in addition to the substrate body 11, at least either of a resin coating, a resin tape, a resin sheet, and a resin film. Moreover, the second substrate W2 may be formed by the substrate body 11 only. Alternatively, the second substrate W2 may include, in addition to the substrate body 11, at least either of a resin coating, a resin tape, a resin sheet, a resin film, and a protective plate 15. The third substrate W3 includes the substrate body 11 and the protective plate 15. The protective plate 15 adheres to the substrate body 11, for example. The third substrate W3 may also include at least either of a resin coating, a resin tape, a resin sheet, and a resin film.

The main portion 13 of the first substrate W1 is thinner than the main portion 13 of the second substrate W2. The main portion 13 of the first substrate W1 is thinner than the main portion 13 of the third substrate W3. The first substrate W1 is less rigid than the second substrate W2 and the third substrate W3. The first substrate W1 is more flexible than the second substrate W2 and the third substrate W3.

Specifically, the main portion 13 of the first substrate W1 has a thickness T1. The main portion 13 of the second substrate W2 has a thickness T2. The main portion 13 of the third substrate W3 has a thickness T3. The thickness T1 is smaller than the thickness T2. The thickness T1 is smaller than the thickness T3. The thickness T1 is, for example, 10 μm or more and 200 μm or less. The thickness T2 is, for example, 600 μm or more and 1000 μm or less. The thickness T3 is, for example, 800 μm or more and 1200 μm or less.

The peripheral portion 12 of the first substrate W1 has a thickness T4. The peripheral portion 12 of the second substrate W2 has a thickness T5. The peripheral portion 12 of the third substrate W3 has a thickness T6. The thickness T4 is, for example, equal to the thickness T5. The thickness T4 is smaller than the thickness T6. The thickness T4 is, for example, 600 μm or more and 1000 μm or less. The thickness T5 is, for example, 600 μm or more and 1000 μm or less. The thickness T6 is, for example, 1400 μm or more and 2200 μm or less.

Secondary, the substrate W is classified into a normal diameter substrate WN and a large diameter substrate WL depending on a diameter D thereof.

Figure 5A:
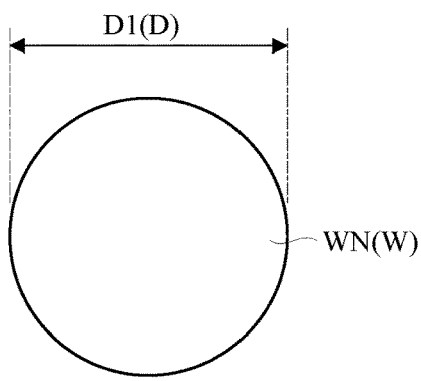
FIG. 5A is a plan view of a normal diameter substrate.
Figure 5B:
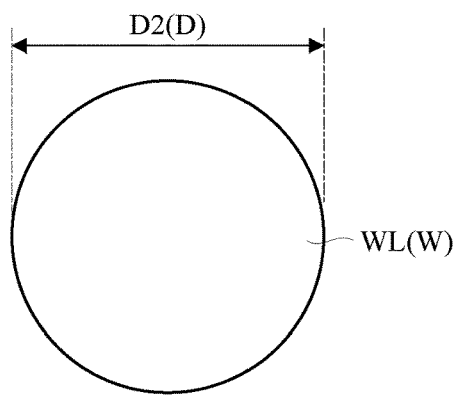
FIG. 5B is a plan view of a large diameter substrate.

FIG. 5A is a plan view of the normal diameter substrate WN. FIG. 5B is a plan view of the large diameter substrate WL. The normal diameter substrate WN has a diameter D1. The large diameter substrate WL has a diameter D2. The diameter D2 is larger than the diameter D1.

The diameter D1 is, for example, 300 mm. The diameter D2 is, for example, 301 mm.

For instance, the first substrate W1 and the second substrate W2 correspond to the normal diameter substrates WN. For instance, the third substrate W3 corresponds to the large diameter substrate WL.

The substrate treating apparatus 1 performs treatment on the first substrate W1, the second substrate W2, and the third substrate W3. The substrate treating apparatus 1 performs treatment on the normal diameter substrate WN and the large diameter substrate WL.

Carrier C

Figure 6:
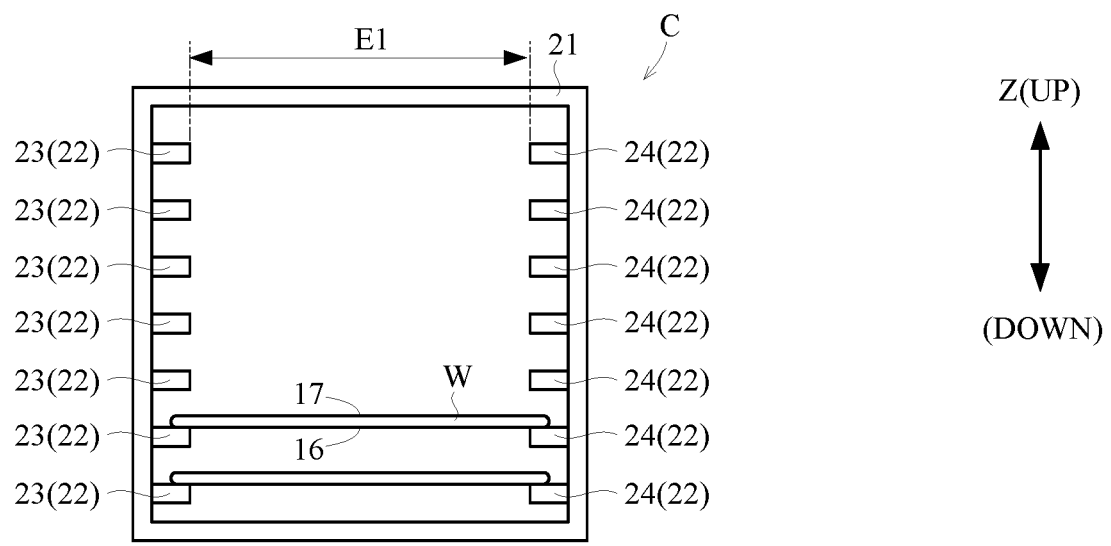
FIG. 6 is a front view of a carrier.

FIG. 6 is a front view of the carrier C. The carrier C includes a container 21 and a plurality of shelves 22. The shelves 22 are installed inside the container 21. The shelves 22 are arranged to align in the up-down direction Z. Two of the shelves 22 adjacent to each other in the up-down direction Z are close to each other. A gap between two of the shelves 22 adjacent to each other in the up-down direction Z is, for example, 10 mm.

The shelves 22 are each configured to place one substrate W thereon in a horizontal posture. The shelves 22 are each in contact with a back face 16 of the substrate W. For instance, one shelf 22 is in contact with the back face 16 at the peripheral portion 12 of the substrate W. The shelf 22 does not contact a top face 17 of the substrate W. The shelf 22 supports the substrate W in such a manner. When the shelf 22 supports the substrate W, the shelf 22 allows the substrate W to move upward with respect to the shelf 22.

The shelves 22 each includes a first shelf 23 and a second shelf 24. The first shelf 23 and the second shelf 24 are spaced apart from each other. The first shelf 23 and the second shelf 24 face each other in the horizontal direction. A distance E1 between the first shelf 23 and the second shelf 24 arranged in the horizontal direction is smaller than the diameter D of the substrate W.

Figure 7:
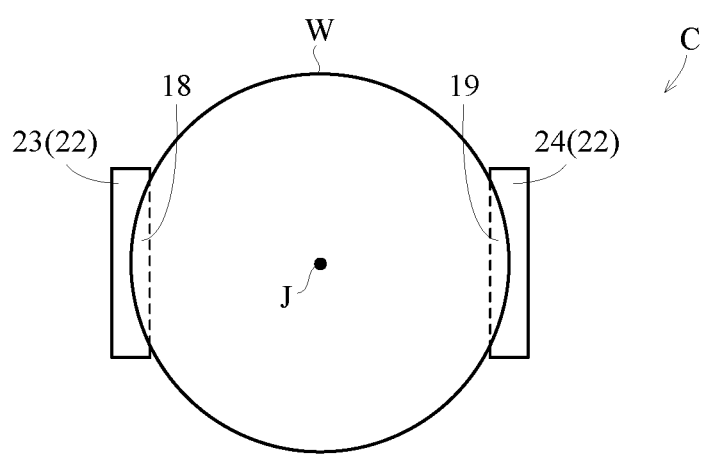
FIG. 7 is a plan view of a shelf of the carrier.

FIG. 7 is a plan view of the shelf 22 in the carrier C. The first shelf 23 supports a first side portion 18 of the substrate W. The second shelf 24 supports a second side portion 19 of substrate W. The second side portion 19 is located opposite to the first side portion 18 with respect to the center J of the substrate W. The first side portion 18 and the second side portion 19 each include a part of the peripheral portion 12 of the substrate W. The first side portion 18 and the second side portion 19 may each include also a part of the main portion 13 of the substrate W.

The carrier C has a bar code (not shown). The bar code is, for example, an identifier for identifying a carrier C. The bar code is, for example, an identifier for identifying a substrate W in the carrier C. The bar code is, for example, attached to the container 21.

The following describes each element of the substrate treating apparatus 1.

Indexer 2

Reference is made to FIG. 1. The carrier platforms 3 are arranged in line in the width direction Y. The indexer 2 includes barcode readers 31. The barcode readers 31 read bar codes attached to the carriers C placed on the carrier platforms 3 individually. The barcode readers 31 are attached to the carrier platforms 3, for example.

The indexer 2 includes a transportation space 32. The transportation space 32 is disposed behind the carrier platforms 3. The transportation space 32 extends in the width direction Y. The transport mechanism 4 is disposed in the transportation space 32. The transport mechanism 4 is disposed rearward of the carrier platform 3.

The transport mechanism 4 includes a hand 33 and a hand driving unit 34. The hand 33 supports one substrate W in a horizontal posture. The hand 33 supports the substrate W by contacting a back face 16 of the substrate W. The hand driving unit 34 is connected to the hand 33. The hand driving unit 34 moves the hand 33.

Figure 8:
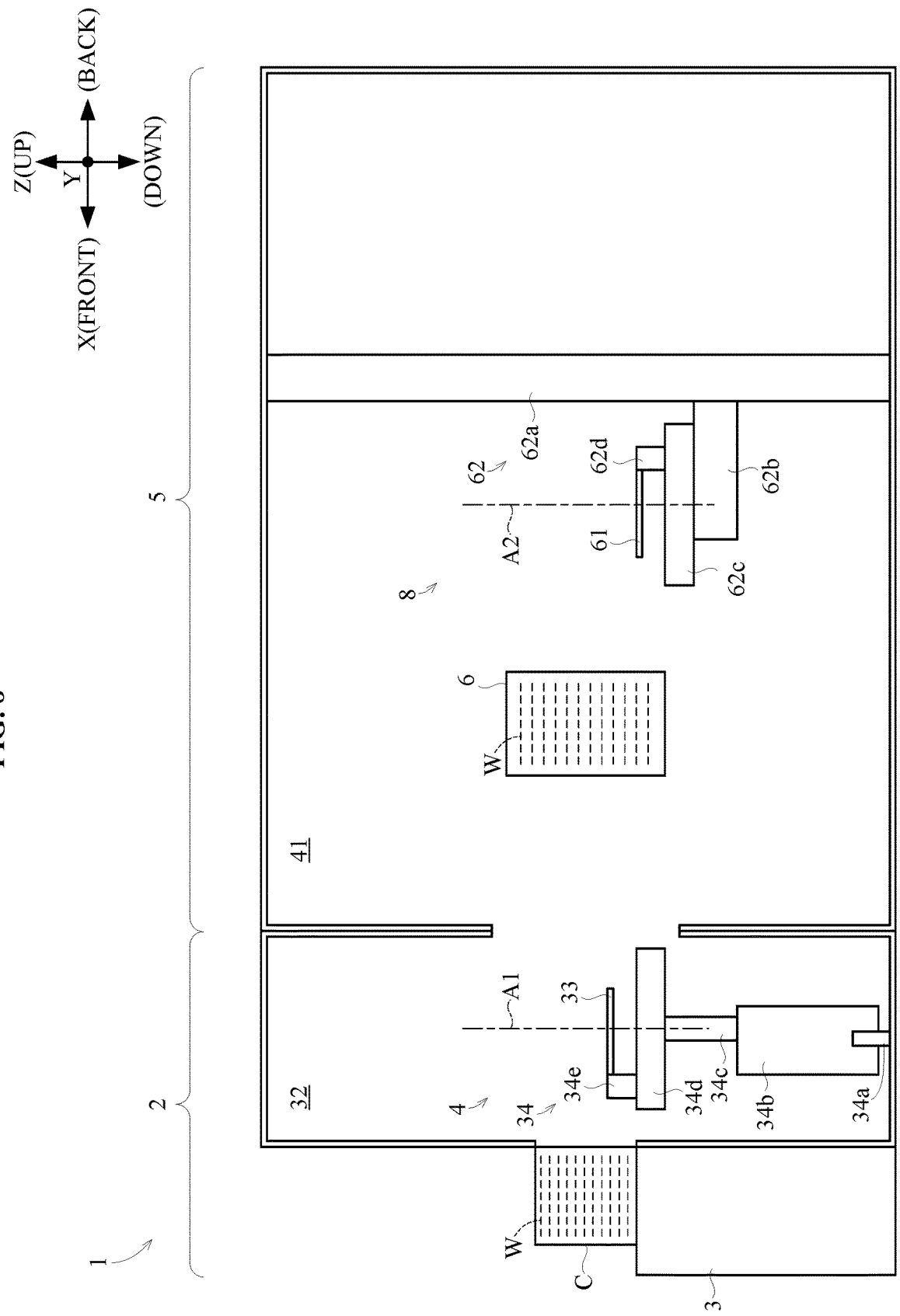
FIG. 8 is a left side view showing a central portion of the substrate treating apparatus in a width direction.

Reference is made to FIGS. 1 and 8. FIG. 8 is a left side view of a middle portion of the substrate treating apparatus 1 in the width direction Y. The hand driving unit 34 includes a rail 34a, a horizontal moving portion 34b, a vertical moving portion 34c, a rotating portion 34d, and an advancing/retreating portion 34e. The rail 34a is fixedly installed. The rail 34a is disposed at the bottom of the transportation space 32. The rail 34a extends in the width direction Y. The horizontal moving portion 34b is supported by the rail 34a. The horizontal moving portion 34b moves in the width direction Y with respect to the rail 34a. The vertical moving portion 34c is supported by the horizontal moving portion 34b. The vertical moving portion 34c moves in the up-down direction Z with respect to the horizontal moving portion 34b. The rotating portion 34d is supported by the vertical moving portion 34 c. The rotating portion 34d rotates with respect to the vertical moving portion 34c. The rotating portion 34d rotates around a rotation axis A1. The rotation axis A1 is parallel to the up-down direction Z. The advancing/retreating portion 34e reciprocates in a horizontal direction defined by the orientation of the rotating portion 34d.

The hand 33 is fixed to the advancing/retreating portion 34e. The hand 33 is movable in parallel in the horizontal direction and in the up-down direction Z. The hand 33 is rotatable around the rotation axis A1.

Figure 9:
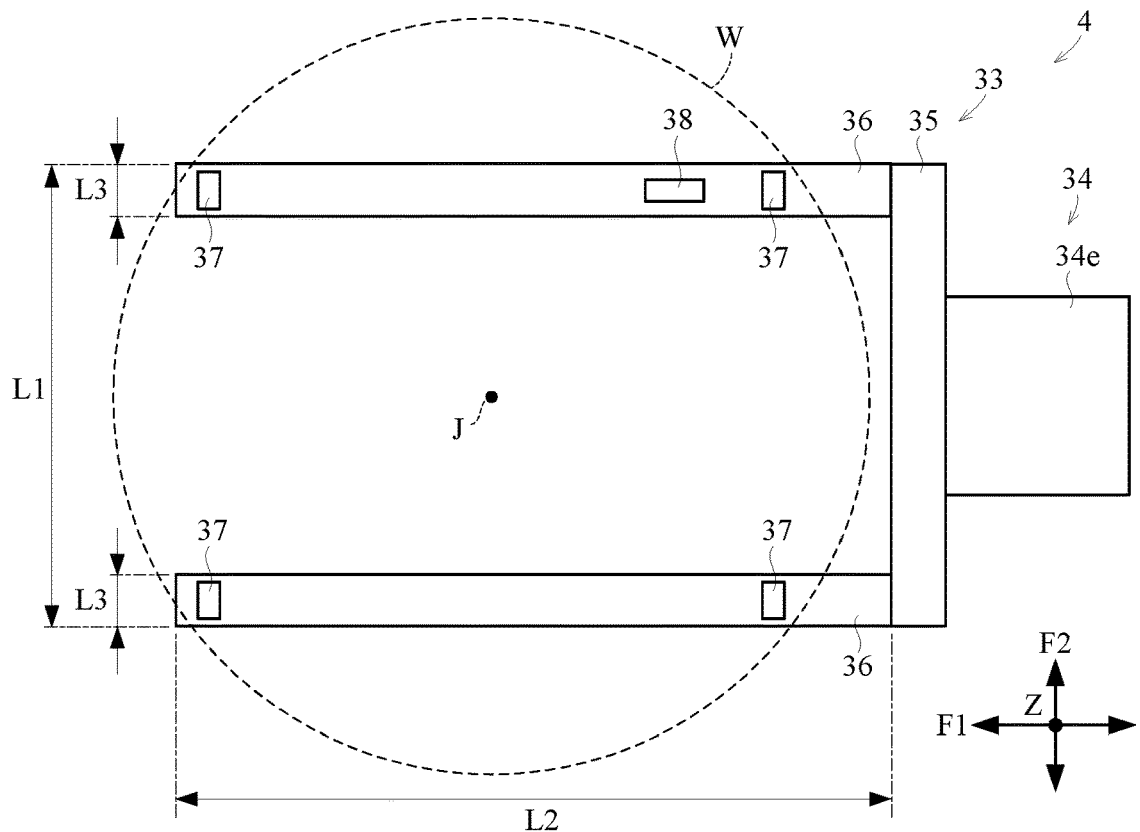
FIG. 9 is a plan view of a hand.
Figure 10:
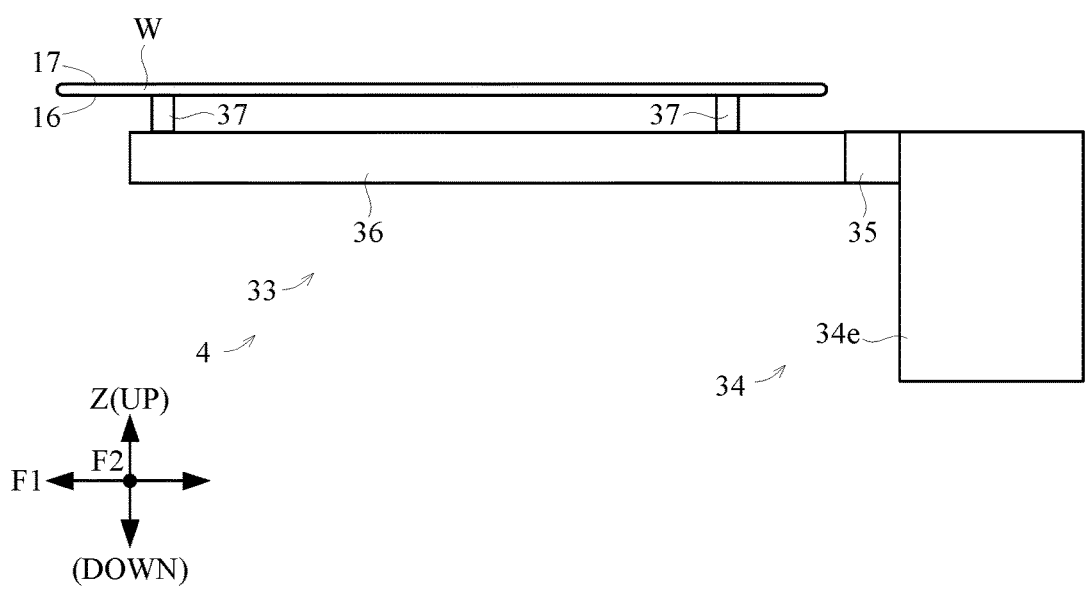
FIG. 10 is a side view of the hand.

FIG. 9 is a plan view of the hand 33. FIG. 10 is a side view of the hand 33. The following describes a structure of the hand 33. The hand 33 includes a connecting portion 35. The connecting portion 35 is connected to the advancing/retreating portion 34e.

The hand 33 includes two rods 36. The rods 36 are each supported on the connecting portion 35. The two rods 36 are spaced apart from each other. The two rods 36 each extend linearly. The two rods 36 each extends from the connecting part 35 in the same direction. The two rods 36 are parallel to each other. Here, the direction where the rods 36 extend is referred to as a first direction F1. The first direction F1 is horizontal. The first direction F1 is the same direction as a direction where the advancing/retreating portion 34e reciprocates with respect to the rotating portion 34d. A horizontal direction perpendicular with respect to the first direction F1 is referred to as a second direction F2. The two rods 36 are aligned in the second direction F2.

An entire length L1 of the two rods 36 in the second direction F2 is less than the distance E1. Accordingly, the two rods 36 can pass in the up-down direction Z through a gap between the first shelf 23 and the second shelf 24 facing each other horizontally.

The rods 36 each have a length substantially equal to the diameter D of the substrate W. That is, a length L2 of the rod 36 in the first direction F1 is substantially equal to the diameter D of the substrate W.

Each of the rods 36 is thin. That is, a length L3 of one rod 36 in the second direction F2 is short. The length L3 is, for example, 10 mm. The length L3 is substantially constant along the first direction F1. That is, the length L3 is substantially constant from a proximal end to a distal end of the rod 36. Each of the rods 36 has a cross-sectional shape which is substantially uniform along the first direction F1. That is, the cross-sectional shape of the rod 36 is substantially uniform from the proximal end to the distal end of the rod 36.

The hand 33 includes a plurality of (e.g., four) contact portions 37. The contact portions 37 are attached to the rod 36 individually. Each of the contact portions 37 protrudes upward from the rod 36. The contact portions 37 each contact a back face 16 of a substrate W. More specifically, each of the contact portions 37 contacts the back face 16 at the peripheral portion 12 of the substrate W. This causes the hand 33 to support one substrate W in the horizontal posture. Each of the contact portions 37 does not contact a top face 17 of the substrate W. The hand 33 allows the substrate W to move upward with respect to the hand 33. When the hand 33 supports a substrate W, the contact portion 37 and the rods 36 overlap the substrate W in plan view.

The hand 33 includes a substrate detector 38. The substrate detector 38 detects a substrate W to be supported by the hand 33. The substrate detector 38 is attached to the rod 36.

Reference is made to FIG. 2. The barcode reader 31 is communicatively connected to the controller 9. The hand driving unit 34 and the substrate detector 38 of the transport mechanism 4 are communicatively connected with the controller 9. The controller 9 receives detected results from the barcode reader 31 and the substrate detector 38. The controller 9 controls the hand driving unit 34.

Treating Block 5

Reference is made to FIG. 1. The following describes arrangement of elements of the treating block 5. The treating block 5 includes a transportation space 41. The transportation space 41 is disposed at the center of the treating block in the width direction Y. The transportation space 41 extends in the front-back direction X. The transportation space 41 is in contact with the transportation space 32 of the indexer 2.

The mount table 6 and the transport mechanism 8 are disposed in the transportation space 41. The mount table 6 is disposed in front of the transport mechanism 8. The mount table 6 is disposed behind the transport mechanism 4. The mount table 6 is disposed between the transport mechanism 4 and the transport mechanism 8.

The treating units 7 are arranged on both sides of the transportation space 41. The treating units 7 are arranged so as to surround the transport mechanism 8 laterally. Specifically, the treating block 5 includes a first treatment section 42 and a second treatment section 43. The first treatment section 42, the transportation space 41, and the second treatment section 43 are arranged in the width direction Y in this order. The first treatment sections 42 are disposed rightward of the transportation space 41. The second treatment section 43 is disposed leftward of the transportation space 41.

Figure 11:
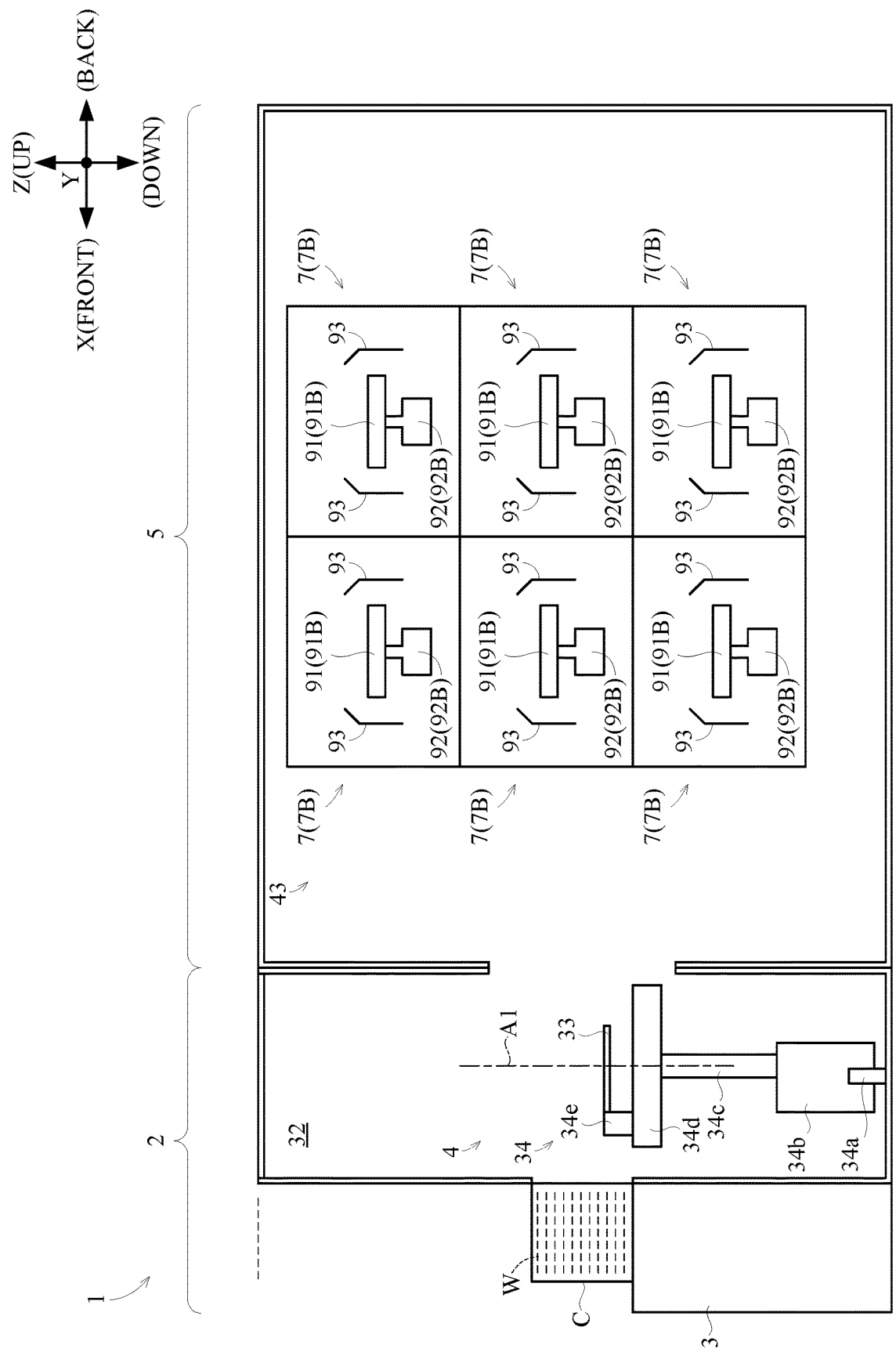
FIG. 11 is a left side view showing a left portion of the substrate treating apparatus.

FIG. 11 is a left side view of a left portion of the substrate treating apparatus 1. In the second treatment section 43, a plurality of treating units 7 are arranged in a matrix array in the front-back direction X and the up-down direction Z. For instance, in the second treatment section 43, six treating units 7 are arranged in two rows in the front-back direction X and three stages in the up-down direction Z.

In the first treatment section 42, a plurality of treating units 7 are arranged in a matrix array in the front-back direction X and the up-down direction Z, which illustration is omitted. For instance, in the first treatment section 42, six treating units 7 are arranged in two rows in the front-back direction X and three stages in the up-down direction Z.

Figure 12:
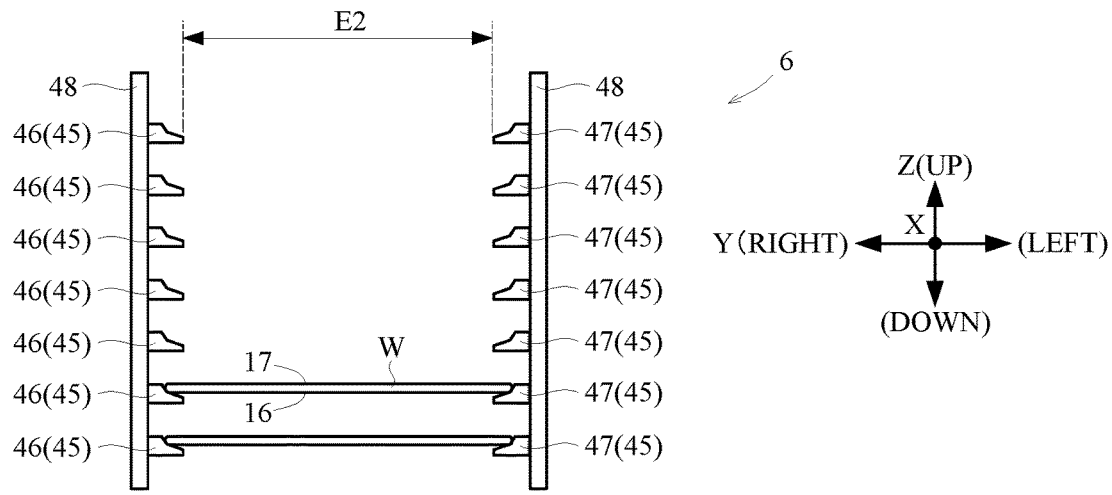
FIG. 12 is a front view of a mount table.

FIG. 12 is a front view of the mount table 6. The following describes a structure of the mount table 6. The mount table 6 is capable of placing a plurality of substrates W. The mount table 6 includes a plurality of shelves 45 and support walls 48. The support walls 48 support the shelves 45. The shelves 45 are arranged to be aligned in the up-down direction Z.

Two of the shelves 45 adjacent to each other in the up-down direction Z are close to each other.

Each of the shelves 45 is configured to place one substrate W thereon in a horizontal posture. The shelves 45 are each in contact with a back face 16 of the substrate W. For instance, one shelf 45 is in contact with the back face 16 at the peripheral portion 12 of the substrate W. The shelf 45 does not contact a top face 17 of the substrate W. The shelf 45 supports the substrate W in such a manner. When the shelf 45 supports the substrate W, the shelf 45 allows the substrate W to move upward with respect to the shelf 45.

The shelves 45 each includes a first shelf 46 and a second shelf 47. The first shelf 46 and the second shelf 47 are spaced apart from each other. The first shelf 46 and the second shelf 47 face each other in the horizontal direction (specifically, the width direction Y). A distance E2 between the first shelf 46 and the second shelf 47 arranged in the horizontal direction is smaller than the diameter D of the substrate W. The distance E2 is larger than the length L1.

Figure 13:
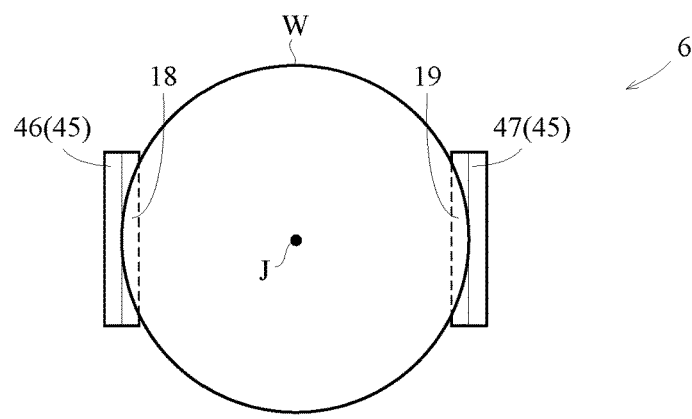
FIG. 13 is a plan view of a shelf of the mount table.

FIG. 13 is a plan view of the shelf 45 in the mount table 6. The first shelf 46 supports a first side portion 18 of substrate W. The second shelf 47 supports a second side portion 19 of substrate W.

Figure 14:
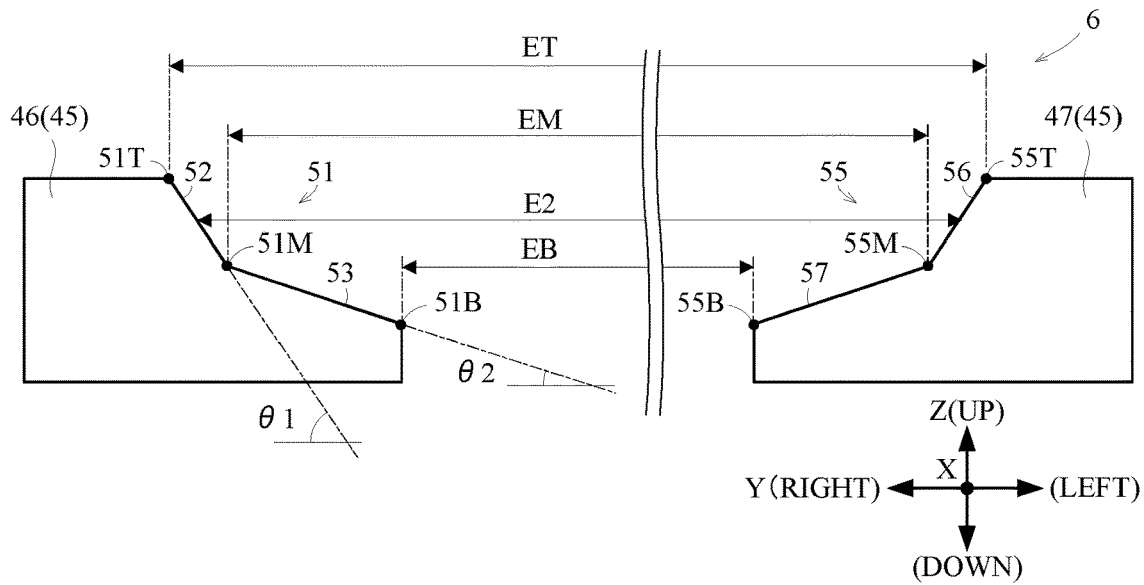
FIG. 14 is a detailed view of the shelf of the mount table.

FIG. 14 is a detailed view of the shelf 45 in the mount table 6. The first shelf 46 includes a first slope 51. The second shelf 47 includes a second slope 55. The first slope 51 and the second slope 55 are spaced apart from each other. The second slope 55 faces the first slope 51 in the horizontal direction (specifically, the width direction Y). The first slope 51 and the second slope 55 are symmetrical in front view. The first slope 51 and the second slope 55 are symmetrical when seen in the front-back direction X. The first slope 51 is in contact with the first side portion 18 of the substrate W. The second slope 55 is in contact with the second side portion 19 of the substrate W.

The distance E2 corresponds to a distance between the first slope 51 and the second slope 55 in the horizontal direction. The distance E2 decreases downward.

The first slope 51 has an upper end 51T. The second slope 55 has an upper end 55T. A distance ET between the upper end 51T and the upper end 55T in the horizontal direction is larger than the diameter D of the substrate W. For instance, the distance ET is 306 mm. For instance, a difference between the distance ET and the diameter D of the substrate W is not less than 1% of the diameter D of the substrate W. For instance, the difference between the distance ET and the diameter D of the substrate W is 2 mm or more.

The first slope 51 includes a lower end 51B. The second slope 55 includes a lower end 55B. A distance EB between the lower end 51B and the lower end 55B in the horizontal direction is smaller than the distance ET. The distance EB is smaller than the diameter D of the substrate W.

An angle of the first slope 51 is not constant over the first slope 51. The first slope 51 has an upper slope surface 52 and a lower slope surface 53. The lower slope surface 53 is disposed below the upper slope surface 52. The lower slope surface 53 contacts a lower end of the upper slope face 52. The upper slope surface 52 is inclined at a first angle $\theta 1$ with respect to the horizontal plane. The lower slope surface 53 is inclined at a second angle $\theta 2$ with respect to the horizontal plane. The second angle $\theta 2$ is smaller than the first angle $\theta 1$. The lower slope surface 53 is more horizontal than the upper slope surface 52.

Likewise, the second slope 55 has an upper slope surface 56 and a lower slope surface 57. The second slope 55 has the same shape as that of the first slope 51 except that they are symmetrical. Moreover, the upper slope surface 56 and the lower slope surface 57 also have the same shape as that of the upper slope surface 52 and the lower slope surface 53, respectively, except that they are symmetrical.

The first slope 51 includes a middle point 51M. The middle point 51M is a connecting position between the upper slope surface 52 and the lower slope surface 53. The second slope 55 includes a middle point 55M. The middle point 55M is a connecting position between the upper slope surface 56 and the lower slope surface 57. A distance EM between the middle point 51M and the middle point 55M in the horizontal direction is substantially equal to the diameter D of the substrate W.

Reference is made to FIGS. 1 and 7. The following describes a structure of the transport mechanism 8.

The transport mechanism 8 includes a hand 61 and a hand driving unit 62. The hand 61 supports one substrate W in a horizontal posture. The hand driving unit 62 is connected to the hand 61. The hand driving unit 62 moves the hand 61.

The hand driving unit 62 includes a strut 62a, a vertical moving portion 62b, a rotating portion 62c, and an advancing/retreating portion 62d. The strut 62a is fixedly installed. The strut 62a extends in the upward/downward direction Z. The vertical moving portion 62b is supported by the strut 62a. The vertical moving portion 62c moves in the up-down direction Z with respect to the strut 62a. The rotating portion 62c is supported by the vertical moving portion 62b. The rotating portion 62c rotates with respect to the vertical moving portion 62b. The rotating portion 62c rotates around a rotation axis A2. The rotation axis A2 is parallel to the up-down direction Z. The advancing/retreating portion 62d reciprocates in a horizontal direction defined by the orientation of the rotating portion 62c.

The hand 61 is fixed to the advancing/retreating portion 62d. The hand 61 is movable in parallel in the horizontal direction and in the up-down direction Z. The hand 61 is rotatable around the rotation axis A2.

Figure 15:
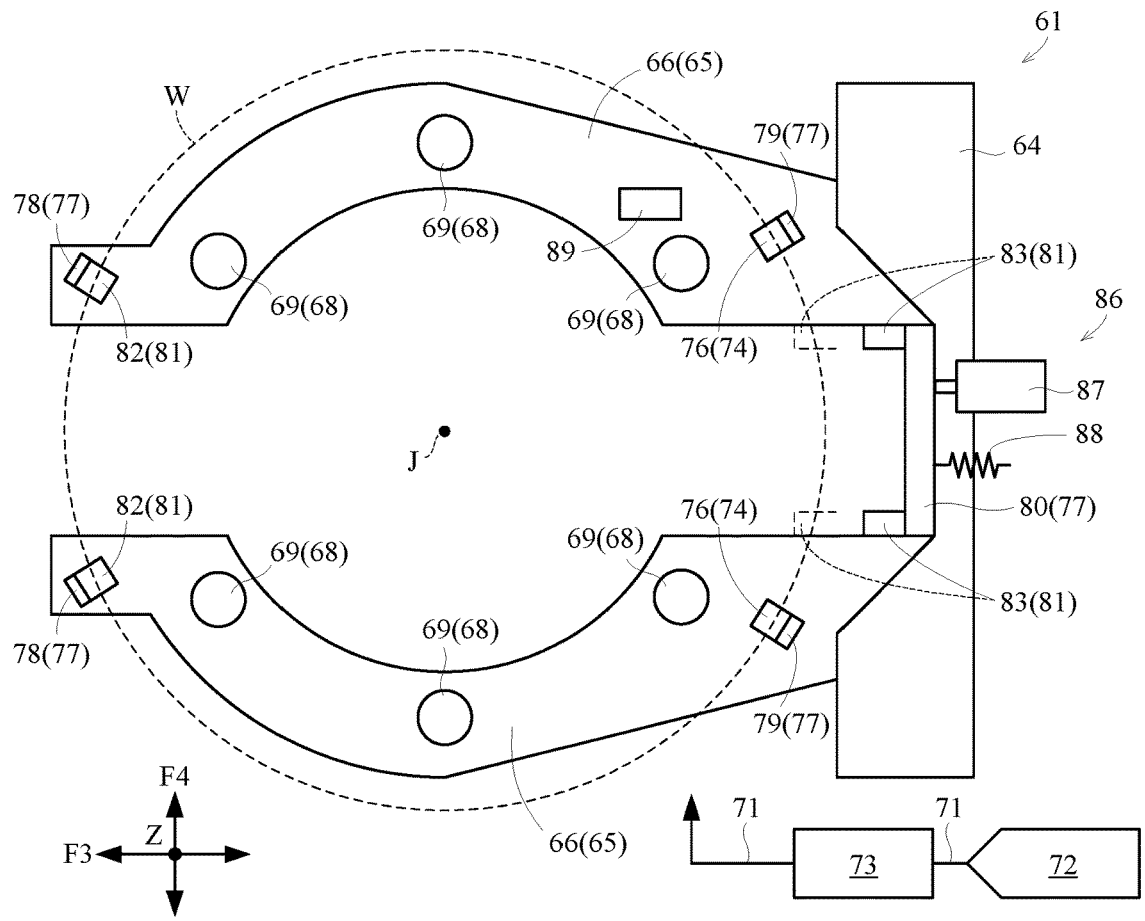
FIG. 15 is a bottom view of the hand.
Figure 16A:
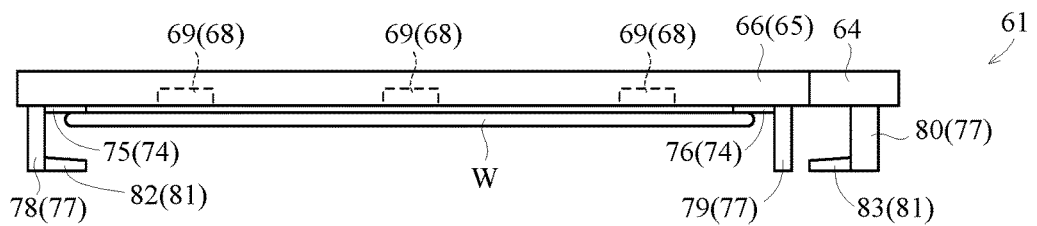
FIG. 16A and FIG. 16B are each a side view of the hand.
Figure 16B:
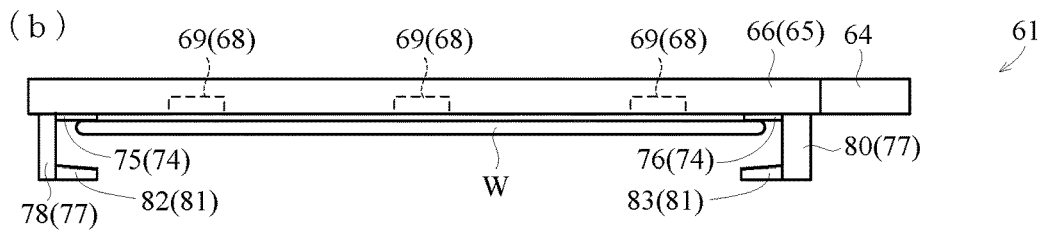

FIG. 15 is a bottom view of the hand 61. FIGS. 16A and 16B are each a side view of the hand 61. The following describes a structure of the hand 61. The hand 61 includes a connecting portion 64. The connecting portion 64 is connected to the advancing/retreating portion 62d.

The hand 61 includes a base 65. The base 65 is supported by the connecting portion 64. The base 65 extends in the horizontal direction from the connecting portion 64.

The base 65 includes two branches 66. The branches 66 are spaced apart from each other. The branches 66 extend in the same direction from the connecting portion 64. Here, the direction where the branches 66 extend is referred to as a third direction F3. The third direction F3 is horizontal. The third direction F3 is the same direction as a direction where the advancing/retreating portion 62d reciprocates with respect to the rotating portion 62c. A horizontal direction perpendicular with respect to the third direction F3 is referred to as a fourth direction F4. The two branches 66 are aligned in the fourth direction F4. The two branches 66 are axial symmetric in plan view with respect to a virtual line that passes between the two branches 66 and is parallel to the third direction F3. The branches 66 are curved. The branches 66 each include a curved portion formed so as to be away from each other. In other words, each of the branches 66 includes a curved portion formed so as to bulge outward the fourth direction F4.

The hand 61 includes a suction portion 68. The suction portion 68 is attached to the base 65. The suction portion 68 blows gas. The suction portion 68 blows gas downward. The suction portion 68 blows gas to the substrate W from positions above the substrate W. Here, the "position above the substrate W" is a position that is higher than the substrate W and that overlaps the substrate W in plan view. FIG. 15 shows the substrate W suctioned by the suction portion 68 by dotted lines. The suction portion 68 blows gas to the top face 17 of the substrate W. The suction portion 68 flows gas over the top face 17 of the substrate W. This causes the suction portion 68 to suck the substrate W without contacting the substrate W. Specifically, a negative pressure is formed by the gas flowing over the top face 17 of the substrate W. That is, the pressure on the top face 17 of the substrate W is less than the pressure on the back face 16 of the substrate W. In accordance with the Bernoulli's principle, an upward force acts on the substrate W. That is, the substrate W is sucked upward. The substrate W is sucked toward the suction portion 68. However, the suction portion 68 does not contact the substrate W sucked by the suction portion 68. The base 65 also does not contact the substrate W sucked by the suction portion 68.

The suction portion 68 includes a plurality of (six) suction pads 69. The suction pads 69 are provided on a back face of the base 65. The suction pads 69 are embedded in the base 65. The suction pads 69 are spaced apart from each other. The suction pads 69 are arranged on a circumference about the center J of the substrate W sucked by the suction portion 68 in plan view.

The suction pads 69 are circular in plan view. Each of the suction pads 69 has a cylindrical shape with a center axis that is parallel to the up-down direction Z. Each of the suction pads 69 has a lower portion that is open downward. The suction pad 69 blows gas from the lower portion thereof. The suction pad 69 may form a swirling flow. The swirling flow is an air flow that swirls inside the suction pad 69 about the center axis of the suction pad 69. For instance, the suction pad 69 may form a swirling flow before the suction pad 69 blows gas. For instance, the suction pad 69 may form a swirling flow, and thereafter, may release the swirling flow to the outside of the suction pad 69.

The transport mechanism 8 includes a gas feed channel 71. The gas feed channel 71 supplies gas to the suction portion 68. The gas feed channel 71 includes a first end and a second end. The first end of the gas feed channel 71 is connected to a gas supplying source 72. The second end of the gas feed channel 71 is connected to the suction portion 68. The second end of the gas feed channel 71 is connected to each of the suction pads 69. The gas supplied to the suction portion 68 is, for example, a nitrogen gas or air. The gas supplied to the suction portion 68 is, for example, a high-pressure gas or a compressed gas.

The transport mechanism 8 includes a suction adjusting unit 73. The suction adjusting unit 73 is provided in the gas feed channel 71. The suction adjusting unit 73 adjusts a flow rate of the gas supplied to the suction portion 68. That is, the suction adjusting unit 73 adjusts the flow rate of the gas blown through the suction portion 68. The suction adjusting unit 73 may adjust the flow rate of the gas supplied to the suction portion 68 in a stepless manner. The suction adjusting unit 73 may adjust the flow rate of the gas supplied to the suction portion 68 in a stepwise manner. A suction force acting on the substrate W increases as the flow rate of the gas supplied to the suction portion 68 increases. The suction adjusting unit 73 includes, for example, a flow rate regulating valve. The suction adjusting unit 73 may also include an on-off valve.

The hand 61 includes a contacting portion 74. The contacting portion 74 is attached on the back face of the base 65. The contacting portion 74 protrudes downward from the base 65. The contacting portion 74 protrudes to a position lower than the suction portion 68. The contacting portion 74 is disposed at a position overlapping the substrate W sucked by the suction portion 68 in plan view. The contacting portion 74 contacts the top face 17 of the substrate W sucked by the suction portion 68. More specifically, the contacting portion 74 contacts the top face 17 at the peripheral portion 12 of the substrate W. The contacting portion 74 does not contact the lower face 16 of the substrate W sucked by the suction portion 68. The contacting portion 74 permits the substrate W to move downward with respect to the contacting portion 74.

The suction portion 68 sucks the substrate W upward and the contacting portion 74 contacts the top face 17 of the substrate W, whereby the substrate W is supported and held in a given position. That is, the suction portion 68 sucks the substrate W upward and the contacting portion 74 contacts the top face 17 of the substrate W, whereby the hand 61 holds the substrate W.

The contacting portion 74 is disposed farther from the center J of the substrate W sucked by the suction portion 68 than the suction portion 68. The contacting portion 74 is disposed more outward than the suction portion 68 in a radial direction of the substrate W sucked by the suction portion 68.

The contacting portion 74 includes a plurality of (e.g., two) first contact portions 75 and a plurality of (e.g., two) second contact portions 76. In bottom view, the first contact portions 75 are disposed at substantially the same positions as those of first receivers 82, which is to be described later. The first contact portions 75 and the second contact portions 76 are spaced apart from each other. The first contact portions 75 are each attached to a distal end of the base 65. The first contact portions 75 are each disposed farther from the connecting portion 64 than the suction portion 68. The second contact portions 76 are each attached to a proximal end of the base 65. The second contact portion 76 is disposed closer to the connecting portion 64 than the suction portion 68.

The hand 61 includes a wall 77. The wall 77 is attached on the back face of the base 65. The wall 77 extends downward from the base 65. The wall 77 protrudes to a position lower than the contacting portion 74. The wall 77 extends to a position lower than the substrate W sucked by the suction portion 68. The wall 77 is disposed at a position not overlapping the substrate W sucked by the suction portion 68 in plan view. The wall 77 is disposed laterally of the substrate W sucked by the suction portion 68. The wall 77 does not contact the substrate W sucked by the suction portion 68. However, when the substrate W is shifted in the horizontal direction by a predetermined distance or more, the wall 77 contacts the substrate W. Thus, the wall 77 prevents the substrate W from being displaced in the horizontal direction by the predetermined value or more. The predetermined distance is, for example, 3 mm.

The wall 77 is disposed farther from the center J of the substrate W sucked by the suction portion 68 than the contacting portion 74. The wall 77 is disposed more outward than the contacting portion 74 in a radial direction of the substrate W sucked by the suction portion 68.

The wall 77 includes a plurality of (e.g., two) first walls 78 and a plurality of (e.g., two) second walls 79. The first walls 78 and the second walls 79 are fixed to the base 65. The first walls 78 and the second walls 79 are spaced apart from each other. The first walls 78 each are attached to a distal end of the base 65. The first walls 78 are each disposed farther from the connecting portion 64 than the suction portion 68. The second walls 79 each are attached to a proximal end of the base 65. The second wall 79 is disposed closer to the connecting portion 64 than the suction portion 68.

The first walls 78 are connected to the first contact portions 75. The first walls 78 extend downward from the first contact portions 75. The second walls 79 are connected to the second contact portions 76. The second walls 79 extend downward from the second contact portions 76.

The hand 61 includes a receiver 81. The receiver 81 is supported on the base. The receiver 81 is disposed below the substrate W sucked by the suction portion 68. The receiver 81 does not contact the substrate W sucked by the suction portion 68. The receiver 81 can receive the back face 16 of the substrate W. That is, the receiver 81 can contact the back face 16 of the substrate W. The receiver 81 can support the substrate W. The receiver 81 does not contact the top face 17 of the substrate W. The receiver 81 allows the substrate W to move upward with respect to the receiver 81.

The receiver 81 includes a plurality of (e.g., two) first receivers 82. The first receivers 82 are supported on the base 65. The first receivers 82 are fixed to the base 65. The first receivers 82 are immovable with respect to the base 65. The first receivers 82 are disposed below the substrate W sucked by the suction portion 68. The first receivers 82 can receive the back face 16 of the substrate W. That is, the first receivers 82 can contact the back face 16 of the substrate W.

The first receivers 82 are disposed farther from the center J of the substrate W sucked by the suction portion 68 than the suction portion 68. The first receivers 82 are disposed more outward than the suction portion 68 in a radial direction of the substrate W sucked by the suction portion 68. The first receivers 82 are disposed at a distal end of the base 65. The first receivers 82 are disposed farther from the connecting portions 64 than the suction portion 68.

The first receivers 82 are disposed below the first contact portions 75. The first receivers 82 overlap the first contact portions 75 in plan view.

The first receivers 82 are connected to the first walls 78. The first receivers 82 extend from the first walls 78 in the horizontal direction. The first receivers 82 extend from the first walls 78 toward the center J of the substrate W sucked by the suction portion 68 in plan view.

The first contact portion 75, the first wall 78, and the first receiver 82 described above are formed integrally. The first contact portion 75, the first wall 78, and the first receiver 82 are inseparable from each other. The second contact portion 76 and the second wall 79 are formed integrally. The second contact portion 76 and the second wall 79 are inseparable from each other.

The receiver 81 includes a plurality of (e.g., two) second receivers 83. The second receivers 83 are supported on the base 65. The second receivers 83 are disposed below the substrate W sucked by the suction portion 68. The second receivers 83 can receive the back face 16 of the substrate W. That is, the second receivers 83 can contact the back face 16 of the substrate W.

The second receivers 83 are disposed farther from the center J of the substrate W sucked by the suction portion 68 than the suction portion 68. The second receivers 83 are disposed more outward than the suction portion 68 in a radial direction of the substrate W sucked by the suction portion 68. The second receivers 83 are disposed at the proximal end of the base 65. The second receivers 83 are disposed closer to the connecting portion 64 than the suction portion 68. The second receivers 83 are disposed between the two branches 66. The second receivers 83 are disposed between the two second contact portions 76.

The second receivers 83 are movable with respect to the base 65. The second receivers 83 are movable with respect to the base 65 in the horizontal direction. Specifically, the second receivers 83 are movable between a drop-preventing position and a retreating position. FIG. 15 shows the second receivers 83 in the drop-preventing position by dotted lines. FIG. 15 shows the second receivers 83 in the retreating position by solid lines. When the second receivers 83 move from the retreating position to the drop-preventing position, the second receivers 83 approach the first receivers 82. When the second receivers 83 move from the drop-preventing position to the retreating position, the second receivers 83 move away from the first receivers 82. When the second receivers 83 are in the retreating position, the second receivers 83 do not overlap the substrate W sucked by the suction portion 68 in plan view.

Figure 17:
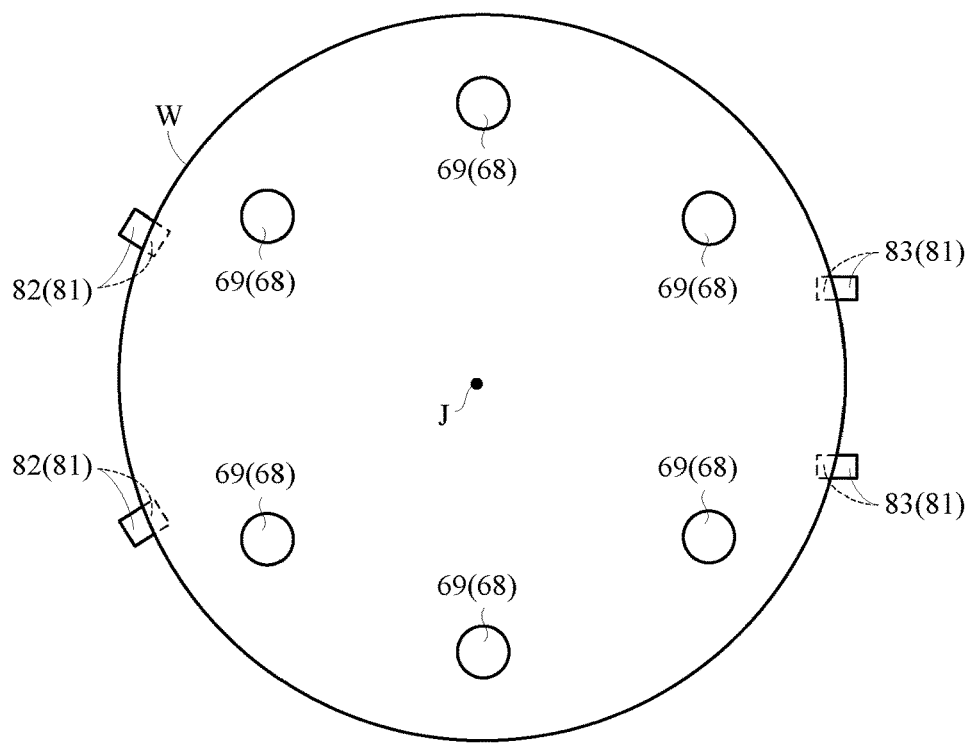
FIG. 17 is a plan view of a suction portion, a substrate sucked by the suction portion, and a receiver.

FIG. 17 is a plan view of the suction portion 68, the substrate W sucked by the suction portion 68, and the receiver 81. In FIG. 17, the second receivers 83 are in the drop-preventing position. The first receivers 82 at least partially overlap the substrate W sucked by the suction portion 68 in plan view. When the second receivers 83 are in the drop-preventing position, the second receivers 83 at least partially overlap the substrate W sucked by the suction portion 68 in plan view. The second receivers 83 are disposed opposite to the first receivers 82 with respect to the center J of the substrate W sucked by the suction portion 68.

Figure 18:
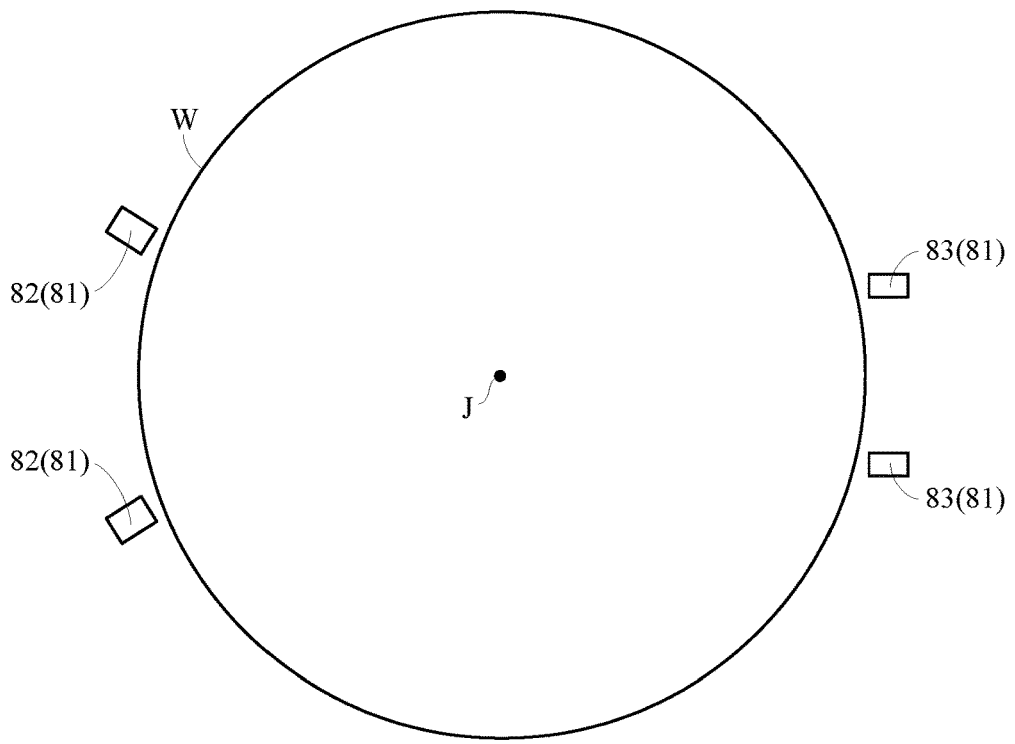
FIG. 18 is a plan view of the receiver.

FIG. 18 is a plan view of the receiver 81. In FIG. 18, the second receivers 83 are in the retreating position. When the second receivers 83 are in the retreating position, a space between a first receiver 82 and a second receiver 83 is larger than the diameter of the substrate W. When the second receivers 83 are in the retreating position, the substrate W is in a horizontal posture and is able to deliver the substrate in the up-down direction Z through the space between the first receivers 82 and the second receivers 83. FIG. 18 shows the substrate W for convenience. Note that the position of the substrate W shown in FIG. 18 differs from the position of the substrate W sucked by the suction portion 68.

Reference is made to FIGS. 15, 16A, and 16B. The wall 77 further includes a third wall 80. The third wall 80 is connected to the second receivers 83. The third wall 80 extends upward from the second receivers 83. The second receivers 83 extend from the third wall 80 in the horizontal direction. The second receivers 83 extend from the third wall 80 toward the center J of the substrate W sucked by the suction portion 68 in plan view.

The second receivers 83 and the third wall 80 are formed integrally. The second receivers 83 and the third wall 80 are inseparable from each other. The second receivers 83 and the third wall 80 move integrally. The third wall 80 is also movable with respect to the base 65.

The hand 61 includes a receiver driving unit 86. The receiver driving unit 86 is supported, for example, on the base 65. The receiver driving unit 86 is connected to the second receivers 83. For instance, the receiver driving unit 86 is connected to the second receivers 83 via the third wall 80. The receiver driving unit 86 moves the second receivers 83 with respect to the base 65. The receiver driving unit 86 moves the second receivers 83 in the horizontal direction. The receiver driving unit 86 reciprocates the second receivers 83 in the third direction F3. The receiver driving unit 86 causes the second receivers 83 to access the first receivers 82 and to move away from the first receivers 82. The receiver driving unit 86 moves the second receivers 83 to the drop-preventing position and the retreating position.

The receiver driving unit 86 includes an actuator 87. The actuator 87 moves the second receivers 83 by a power source applied to the actuator 87. The actuator 87 moves the second receivers 83 from the retreating position to the drop-preventing position, and vice versa. The actuator 87 is, for example, an air cylinder. The power source of the air cylinder is air pressure. The actuator 87 is, for example, an electric motor. The power source of the electric motor is electric power.

The receiver driving unit 86 further includes an elastic member 88. The elastic member 88 causes the second receivers 83 to be biased from the retreating position toward the drop-preventing position. The elastic member 88 is, for example, a spring. The elastic member 88 may be disposed outside the actuator 87. Alternatively, the elastic member 88 may be disposed inside the actuator 87.

When the power source of the actuator 87 is stopped, the second receivers 83 are kept in the retreating position by the elastic member 88.

The hand 61 includes a substrate detector 89. The substrate detector 89 detects a substrate W supported by the hand 61. The substrate detector 89 is attached to the base 65.

Reference is made to FIG. 2. The controller 9 is communicatively connected with the hand driving unit 62, the suction adjusting unit 73, the receiver driving unit 86 (the actuator 87), and the substrate detector 89 of the transport mechanism 8. The controller 9 receives detected results of the substrate detector 89. The controller 9 controls the hand driving unit 62, the suction adjusting unit 73, and the receiver driving unit 86 (the actuator 87).

Reference is made to FIGS. 1 and 11. The following describes a basic configuration of the treating units 7. The treating units 7 each includes a substrate holder 91, a rotational driving unit 92, and a guard 93. The substrate holder 91 holds one substrate W. The substrate holder 91 holds the substrate W in a horizontal posture. The rotational driving unit 92 is connected to the substrate holder 91. The rotational driving unit 92 rotates the substrate holder 91. The guard 93 is arranged so as to surround the side of the substrate holder 91 laterally. The guard 93 receives a treatment liquid.

The treating units 7 are classified into first treating units 7A and second treating units 7B depending on the configuration of the substrate holder 91. The substrate holder 91 of the first treating unit 7A is referred to as a Bernoulli chuck, or a Bernoulli gripper. The Bernoulli chuck is suitable for holding a thinner substrate W. The substrate holder 91 of the second treating unit 7B is referred to as a mechanical chuck or a mechanical gripper. The mechanical chuck is suitable for holding a thicker substrate W.

For instance, the six the treating units 7 disposed in the first treatment section 42 are each a first treating unit 7A. For instance, the six the treating units 7 disposed in the second treatment section 43 are each a second treating unit 7B.

Hereinafter, the substrate holder 91 of the first treating unit 7A is referred to as a "first substrate holder 91A" as appropriate. The rotational driving unit 92 of the first treating unit 7A is referred to as a "first rotational driving unit 92A" as appropriate. The substrate holder 91 of the second treating unit 7B is referred to as a "second substrate holder 91B" as appropriate. The rotational driving unit 92 of the second treating unit 7B is referred to as a "second rotational driving unit 92B" as appropriate.

Figure 19:
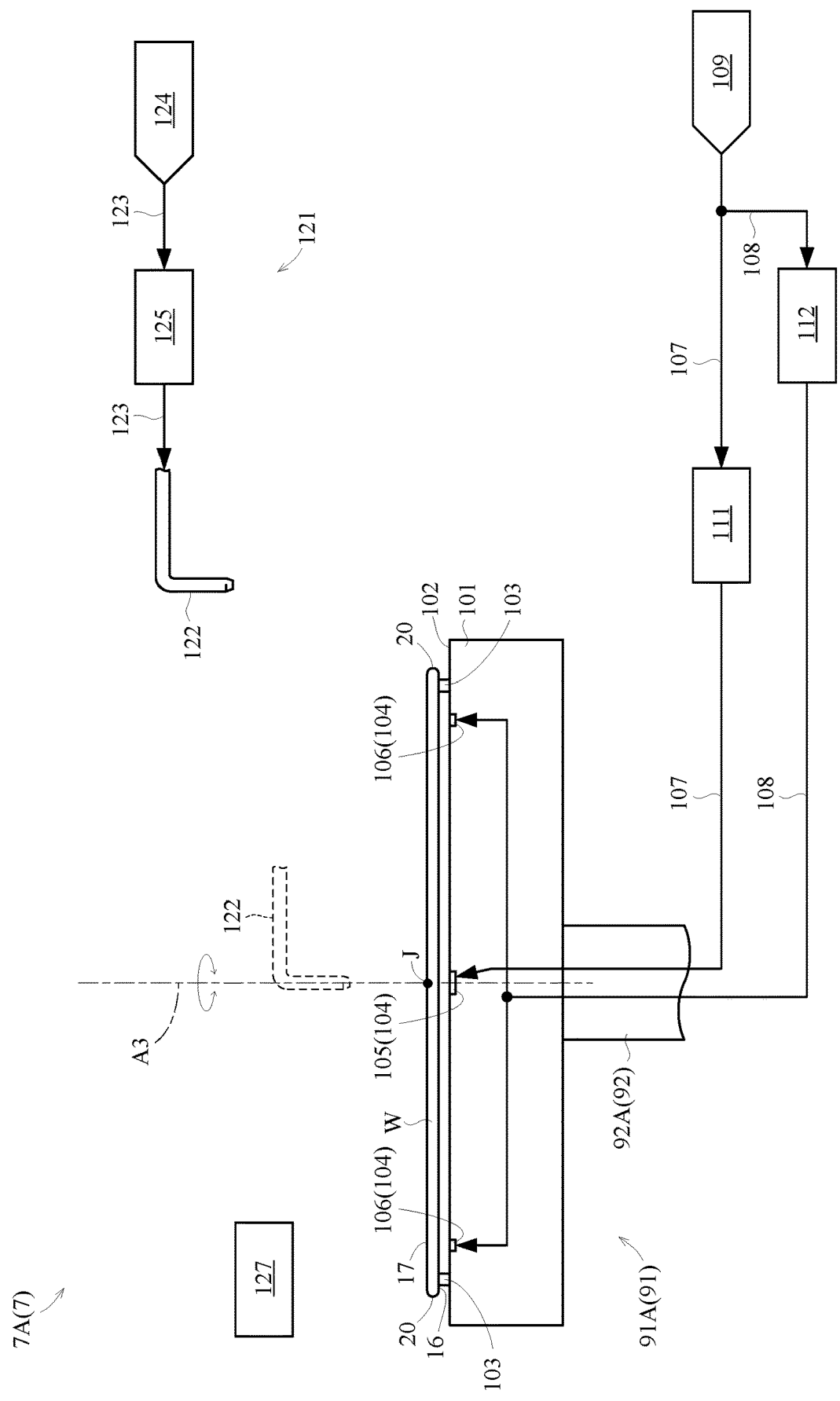
FIG. 19 is a diagram schematically showing a first treating unit.

FIG. 19 is a diagram schematically showing the first treating unit 7A. FIG. 19 omits illustration of the guard 93. The following describes the configuration of the first treating unit 7A.

The first substrate holder 91A includes a first plate 101. The first plate 101 is substantially discal. The first plate 101 includes a top face 102. The top face 102 is substantially horizontal. The top face 102 is substantially flat.

The first rotational driving unit 92A is connected to a lower portion of the first plate 101. The first rotational driving unit 92A rotates the first plate 101. The first rotational driving unit 92A causes the first plate 101 to rotate about a rotation axis A3. The rotation axis A3 is parallel to the up-down direction Z. The rotation axis A3 passes through the center of the first plate 101.

Figure 20:
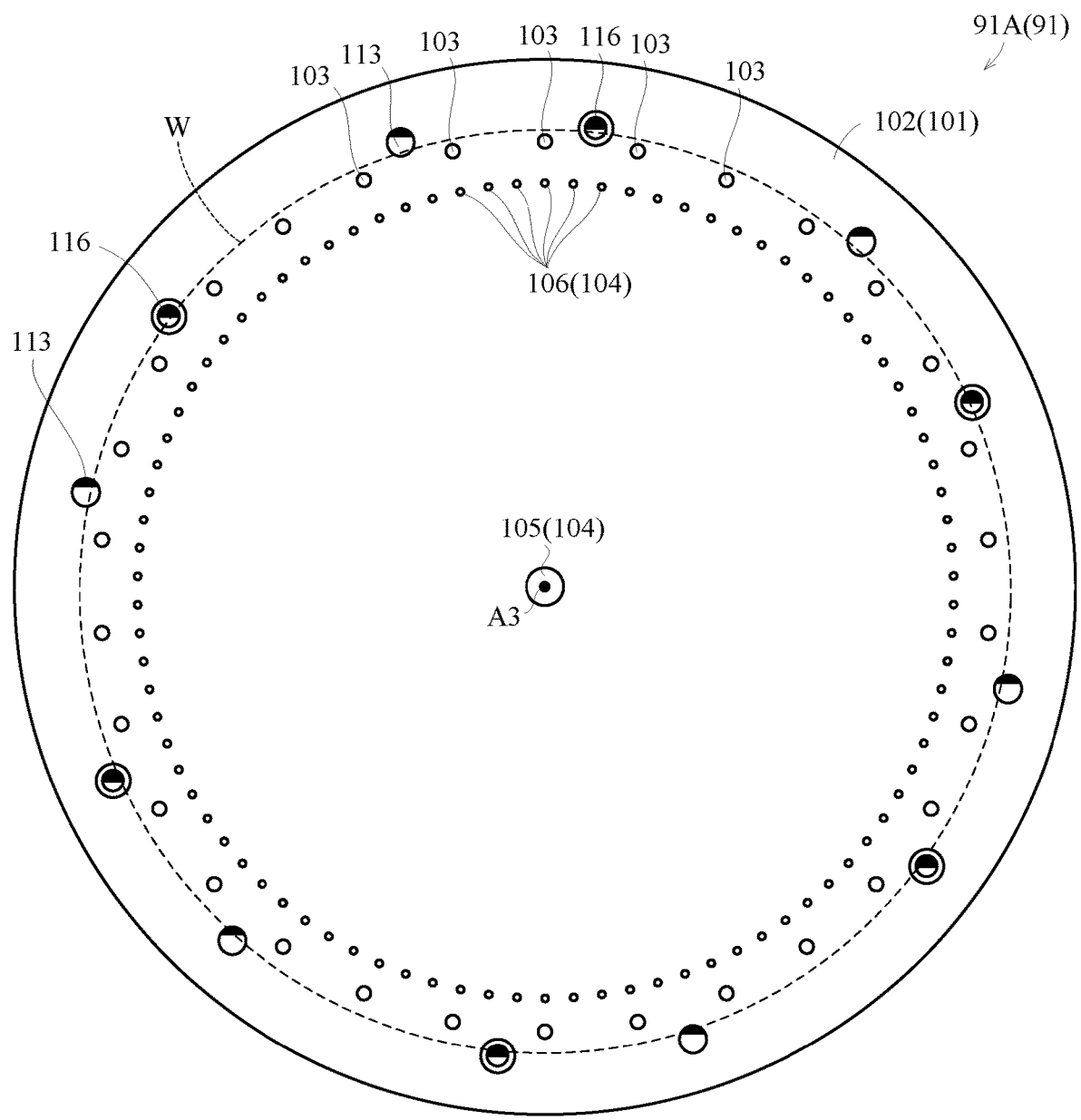
FIG. 20 is a plan view of a first plate.

FIG. 20 is a plan view of the first plate 101. The top face 102 of the first plate 101 is circular in plan view. The top face 102 of the first plate 101 is larger than the substrate W in plan view.

The first substrate holder 91A includes a plurality of (e.g., 30 pieces) fixing pins 103. The fixing pins 103 support a substrate W. The fixing pins 103 are fixed to the first plate 101. The fixing pins 103 are immovable with respect to the first plate 101. The fixing pins 103 are not rotatable with respect to the first plate 101. The fixing pins 103 include no movable portion that is movable with respect to the first plate 101.

The fixing pins 103 are disposed at a peripheral portion of the top face 102 of the first plate 101. The fixing pins 103 are arranged on a circumference about the rotation axis A3 in plan view. The fixing pins 103 are spaced apart from one another.

Reference is made to FIGS. 19 and 20. The fixing pins 103 protrude upward from the top face 102 of the first plate 101. The fixing pins 103 contact a back face 16 of the substrate W. More specifically, the fixing pins 103 contact the back face 16 at the peripheral portion 12 of the substrate W. This causes the fixing pins 103 to support the substrate W at a position higher than the top face 102 of the first plate 101. FIG. 20 shows the substrate W supported by the fixing pins 103 by dotted lines.

The fixing pins 103 do not contact the top face 17 of the substrate W. The fixing pins 103 allow the substrate W to move upward with respect to the fixing pins 103. The fixing pins 103 do not contact an edge 20 of the substrate W. The fixing pins 103 allow the substrate W to slide with respect to the fixing pins 103. In such a manner as above, the fixing pins 103 do not hold the substrate W.

The first substrate holder 91A includes a gas outlet 104. The gas outlet 104 is formed on the top face 102 of the first plate 101. The gas outlet 104 is positioned so as to overlap the substrate W supported by the fixing pins 103 in plan view. The gas outlet 104 blows gas upward. The gas outlet 104 blows gas between the top face 102 of the first plate 101 and the back face 16 of the substrate W supported by the fixing pins 103. The gas outlet 104 blows the gas to the substrate W from below the substrate W supported by the fixing pins 103. The gas is supplied between the top face 102 of the first plate 101 and the back face 16 of the substrate W supported by the fixing pins 103. The gas flows over the back face 16 of the substrate W supported by the fixing pins 103. Thus, the gas outlet 104 sucks the substrate W. Specifically, a negative pressure is formed by the gas flowing over the back face 16 of the substrate W. That is, the pressure on the back face 16 of the substrate W is less than the pressure on the top face 17 of the substrate W. With the Bernoulli's principle, a downward force acts on the substrate W. That is, the substrate W is sucked downward. The substrate W is sucked toward the gas outlet 104 and the first plate 101. However, the gas outlet 104 does not contact the substrate W. The first plate 101 also does not contact the substrate W.

The gas outlet 104 sucks the substrate W downward and the fixing pins 103 contact the back face 16 of the substrate W, whereby the substrate W is supported and held in a given position. Due to a suction force acting on the substrate W, the substrate W does not slide in the horizontal direction with respect to the fixing pins 103. That is, the gas outlet 104 sucks the substrate W downward and the fixing pins 103 contact the back face 16 of the substrate W, whereby the first substrate holder 91A holds substrate W.

The gas outlet 104 includes one first outlet 105 and a plurality of second outlets 106. The first outlet 105 is disposed at the center of the top face 102 of the first plate 101. The first outlet 105 is disposed on the rotation axis A3. The second outlets 106 are disposed more outward than the first outlet 105 in a radial direction of the rotation axis A3. The second outlets 106 are disposed more inward than the fixing pins 103 in the radial direction of the rotation axis A3. The second outlets 106 are arranged on a circumference about the rotation axis A3 in plan view.

The first treating unit 7A includes a first gas feed channel 107 and a second gas feed channel 108. The first gas feed channel 107 supplies gas to the first outlet 105. The second gas feed channel 108 supplies gas to the second outlets 106. The first gas feed channel 107 and the second gas feed channel 108 are partially formed inside the first plate 101. The first gas feed channel 107 includes a first end and a second end. The first end of the first gas feed channel 107 is connected to a gas supplying source 109. The second end of the first gas feed channel 107 is connected to the first outlet 105. The second gas feed channel 108 includes a first end and a second end. The first end of the second gas feed channel 108 is connected to a gas supplying source 109. The second end of the second gas feed channel 108 is connected to the second outlet 106. The gas supplied to the first outlet 105 and the second outlets 106 is, for example, a nitrogen gas or air. The gas supplied to the first outlet 105 and the second outlets 106 is, for example, a high pressure gas or a compressed gas.

The first treating unit 7A includes a first blowout adjusting unit 111 and a second blowout adjusting unit 112. The first blowout adjusting unit 111 is provided in the first gas feed channel 107. The second blowout adjusting unit 112 is provided in the second gas feed channel 108. The first blowout adjusting unit 111 adjusts a flow rate of the gas blown through the first outlet 105. That is, the first blowout adjusting unit 111 adjusts the flow rate of the gas supplied to the first outlet 105. The second blowout adjusting unit 112 adjusts a flow rate of the gas blown through the second outlets 106. That is, the second blowout adjusting unit 112 adjusts the flow rate of the gas supplied to the second outlets 106. A suction force acting on the substrate W increases as the flow rate of the gas blown through the first outlet 105 increases. A suction force acting on the substrate W increases as the flow rate of the gas blown through the second outlet 106 increases.

The first blowout adjusting unit 111 cannot adjust a flow rate of the gas blown through the second outlets 106. The second blowout adjusting unit 112 cannot adjust a flow rate of the gas blown through a first outlet 105. The first blowout adjusting unit 111 and the second blowout adjusting unit 112 are operable independently of each other. Accordingly, the flow rate of the gas blown through the first outlet 105 and the flow rate of the gas blown through the second outlets 106 can be adjusted independently of each other. The first blowout adjusting unit 111 and the second blowout adjusting unit 112 each include, for example, a flow rate regulating valve. The first blowout adjusting unit 111 and the second blowout adjusting unit 112 each may further include an on-off valve.

Reference is made to FIG. 20. The treating unit 7 includes a plurality of (e.g., six) positioning pins 113. The positioning pins 113 are supported by the first plate 101. The positioning pins 113 are movable in the horizontal direction relative to the first plate 101. The positioning pins 113 move with respect to the first plate 101, whereby the positioning pins 113 can be in contact with substrate W supported by the fixing pins 103, and can move away from the substrate W supported by the fixing pins 103. More specifically, the positioning pins 113 can contact the edge of the substrate W supported by the fixing pins 103. The positioning pins 113 adjust the position of the substrate W supported by the fixing pins 103. The positioning pins 113 adjust the position of the substrate W in the horizontal direction. The positioning pins 113 position the center J of the substrate W supported by the fixing pins 103 on the rotation axis A3.

In this specification, a position of the positioning pin 113 contacting the substrate W is referred to as an "adjusting position". A position of the positioning pin 113 away from the substrate W is referred to as a "retreating position". The positioning pins 113 each are movable between the adjusting position and the retreating position.

The positioning pins 113 are disposed at the peripheral portion of the top face 102 of the first plate 101. The positioning pins 113 are arranged on a circumference about the rotation axis A3 in plan view. The positioning pins 113 are disposed at substantially the same height position as the substrate W supported by the fixing pins 103.

Figure 21A:
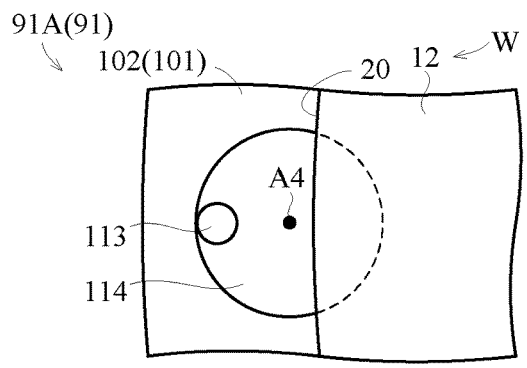
FIG. 21A and FIG. 21B are each a detailed plan view of a positioning pin.
Figure 21B:
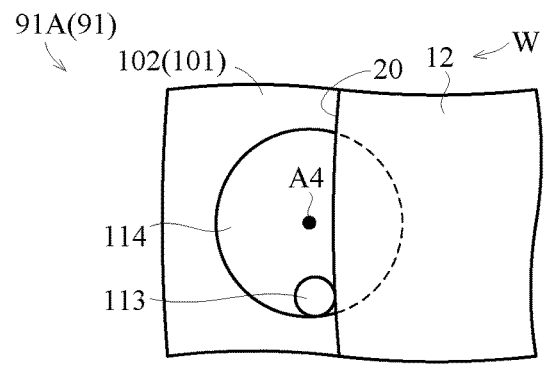
Figure 22A:
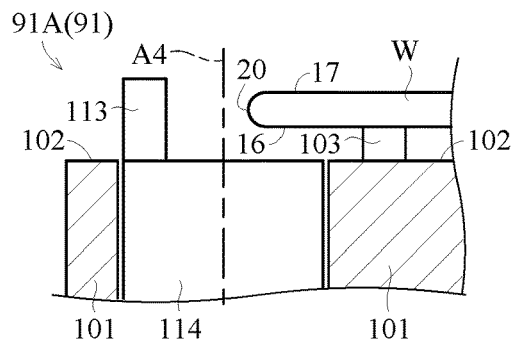
FIG. 22A and FIG. 22B are each a side view of the positioning pin.
Figure 22B:
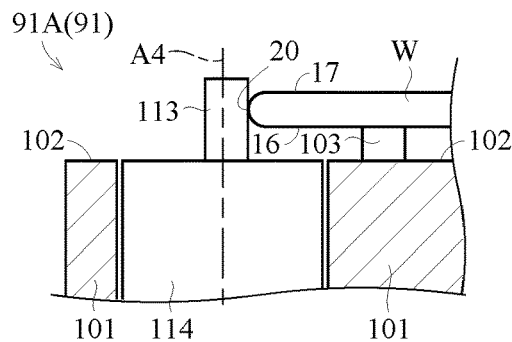

FIGS. 21A and 21B are each a detailed plan view of the positioning pin. FIGS. 22 A and 22B are each a side view of the positioning pin. FIGS. 21A and 22A show the positioning pin 113 in the retreating position. FIGS. 21B and 22B show the positioning pin 113 in the adjusting position. The positioning pin 113 is fixed to a shaft 114. The shaft 114 extends downward from the positioning pin 113. The shaft 114 is supported by the first plate 101. The positioning pins 113 are supported by the first plate 101 via the shaft 114. The shaft 114 is rotatable with respect to the first plate 101. The shaft 114 is rotatable about the rotation axis A4. The rotation axis A4 is parallel to the up-down direction Z. The rotation axis A4 passes through the center of the shaft 114. The positioning pins 113 are disposed at a position eccentric from the rotation axis A4. The shaft 114 rotates with respect to the first plate 101, whereby the positioning pins 113 are movable in the horizontal direction relative to the first plate 101. Specifically, the positioning pins 113 pivot about the rotation axis A4. Thus, the positioning pins 113 approach the rotation axis A3 and move away from the rotation axis A3. Since the positioning pins 113 approach the rotation axis A3, thereby moving to the adjusting position. When the positioning pins 113 are in the adjusting position, the positioning pins 113 contact the edge 20 of the substrate W supported by the fixing pins 103. Moreover, the positioning pins 113 push the edge 20 of the substrate W, which contacts the positioning pins 113, toward the rotation axis A3. The positioning pin 113 provided at different positions push the edge 20 of the substrate W, whereby the substrate W is adjusted to a predetermined position. The positioning pins 113 move away from the rotation axis A3, thereby moving to the retreating position. When the positioning pin 113 is in the retreating position, the positioning pins 113 are away from the edge 20 of the substrate W supported by the fixing pins 103. When the positioning pin 113 is in the retreating position, the positioning pins 113 do not contact the substrate W supported by the fixing pins 103.

Reference is made to FIG. 20. The treating unit 7 includes a plurality of (e.g., six) lift pins 116. The lift pins 116 are disposed at a peripheral portion of the top face 102 of the first plate 101. The lift pins 116 are arranged on a circumference about the rotation axis A3 in plan view.

Figure 23A:
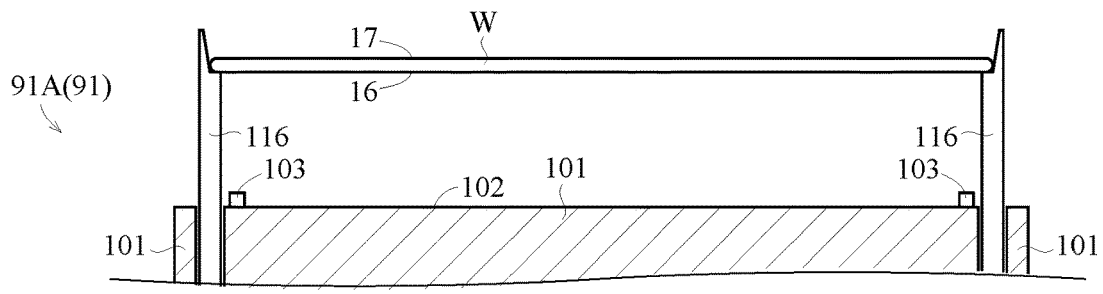
FIG. 23A and FIG. 23B are each a side view of a lift pin.
Figure 23B:
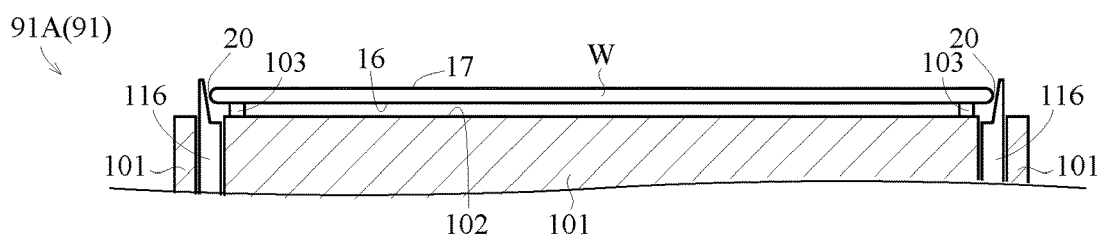

FIGS. 23A and 23B are side views of the lift pins 116. The lift pins 116 are supported by the first plate 101. The lift pins 116 are supported movably in the up-down direction Z with respect to the first plate 101. The lift pins 116 support a substrate W. The lift pins 116 move the substrate W supported by the lift pins 116 in the up-down direction Z.

FIG. 23A shows the lift pins 116 located in an upper position. The lift pins 116 are movable to the upper position. The upper position is higher than the fixing pins 103. The lift pins 116 are capable of supporting the substrate W at the upper position. When the lift pins 116 support the substrate W at the upper positions, the substrate W is positioned higher in level than the fixing pins 103.

Reference is made to FIG. 23B. The lift pins 116 are movable downward from the upper position. The lift pins 116 lower the substrate W. Specifically, the lift pins 116 lower the substrate W from a position higher in level than the fixing pins 103. This causes the lift pins 116 to deliver the substrate W to the fixing pins 103. In such a manner as above, the lift pins 116 move downward from the upper position while supporting the substrate W, whereby the lift pins 116 deliver the substrate W to the fixing pins 103. After the lift pins 116 deliver the substrate W to the fixing pins 103, the lift pins 115 move further downward with respect to the first plate 101 and away from the substrate W supported by the fixing pins 103.

In this specification, a position of the lift pin 116 not contacting the substrate W supported by the fixing pins 103 is referred to as a lower position. FIG. 23B shows the lift pins 116 in the lower position. The lower position is lower than the upper position. The lift pins 116 are movable to the lower position.

The lift pins 116 take the substrate W from the fixing pins 103 by moving upward from the lower position.

In such a manner as above, the lift pins 116 move between the upper and lower positions. This causes the lift pins 116 to deliver the substrate W to the fixing pins 103 and to take the substrate W from the fixing pins 103.

Reference is made to FIG. 19. The first treating unit 7A includes a treatment liquid supplying unit 121. The treatment liquid supplying unit 121 supplies a treatment liquid to the substrate W.

The treatment liquid supplying unit 121 includes a nozzle 122. The nozzle 122 dispenses the treatment liquid to the substrate W. The nozzle 122 is provided so as to be movable between a treating position and a retreating position. FIG. 19 illustrates the nozzle 122 at the treatment position by dotted lines. FIG. 19 illustrates the nozzle 122 at the retreating position by solid lines. The treating position is a position above the substrate W held by the first substrate holder 91A. When the nozzle 122 is in the treating position, the nozzle 122 overlaps the substrate W held by the first substrate holder 91A in plan view. When the nozzle 122 is in the retreating position, the nozzle 122 does not overlap the substrate W held by the first substrate holder 91A in plan view.

The treatment liquid supplying unit 121 includes a pipe 123. The pipe 123 supplies the treatment liquid to the nozzle 122. The pipe 123 includes a first end and a second end. The first end of the pipe 123 is connected to a treatment liquid supply source 124. The second end of the pipe 123 is connected to the nozzle 122.

The first treating unit 7A includes a flow rate adjusting unit 125. The flow rate adjusting unit 125 is provided in the pipe 123. The flow rate adjusting unit 125 adjusts a flow rate of the treatment liquid supplied by the treatment liquid supplying unit 121 to the substrate W. That is, the flow rate adjusting unit 125 adjusts the flow rate of the treatment liquid dispensed by the nozzle 122.

The first treating unit 7A includes a substrate detector 127. The substrate detector 127 detects a substrate W supported by the fixing pins 103. Moreover, the substrate detector 127 detects a position of the substrate W supported by the fixing pins 103. The substrate detector 127 images, for example, the edge 20 of the substrate W supported by the fixing pins 103. The substrate detector 127 is, for example, an image sensor. The substrate detector 127 is disposed above the first substrate holder 91A, for example.

Reference is made to FIG. 2. The controller 9 is communicatively connected with the first rotational driving unit 92A, the positioning pins 113, the lift pins 116, the first blowout adjusting unit 111, the second blowout adjusting unit 112, the flow rate adjusting unit 125, and the substrate detector 127 of the first treating unit 7A. The controller 9 receives detected results from the substrate detector 127. The controller 9 controls the first rotational driving unit 92A, the positioning pins 113, the lift pins 116, the first blowout adjusting unit 111, the second blowout adjusting unit 112, and the flow rate adjusting unit 125.

The fixing pin 103 is one example of a supporting member in the present invention. The positioning pin 113 is one example of a position adjusting member in the present invention. The lift pin 116 is one example of a lifting member in the present invention.

FIG. 24 is a diagram schematically showing the configuration of the second treating unit 7B. FIG. 24 omits illustration of the guard 93. The following describes in detail the configuration of the second treating unit 7B. Like numerals are used to identify like components which are the same as that of the first treating unit 7A, and the components will not particularly be described.

The second substrate holder 91B includes a second plate 131. The second plate 131 is substantially discal. The second plate 131 includes a top face 132. The top face 132 is substantially horizontal. The top face 132 is substantially flat.

The second rotational driving unit 92B is connected to a lower portion of the second plate 131. The second rotational driving unit 92B rotates the second plate 131. The second rotational driving unit 92B causes the second plate 131 to rotate about a rotation axis A5. The rotation axis A5 is parallel to the up-down direction Z. The rotation axis A5 passes through the center of the second plate 131.

Figure 25:
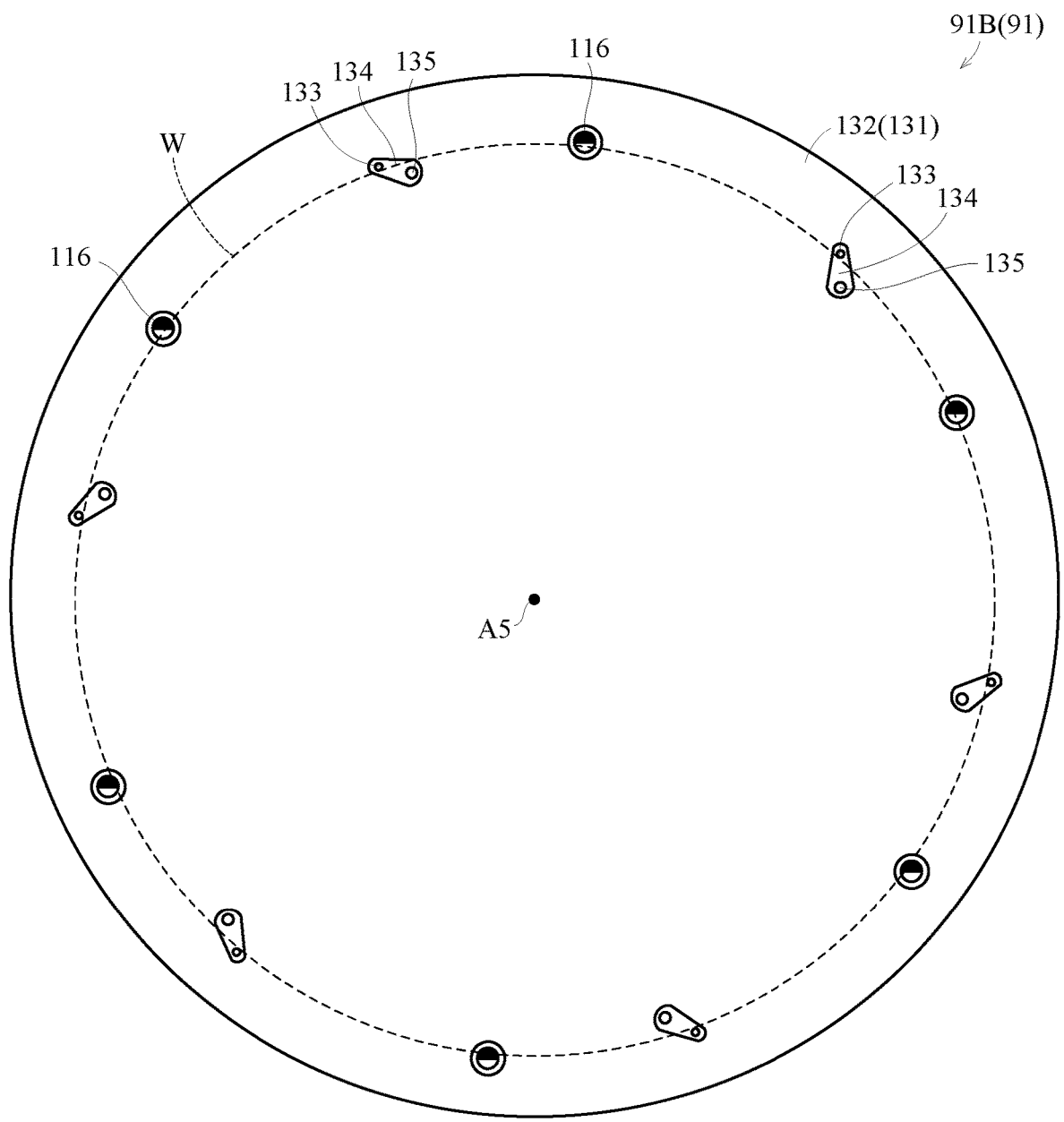
FIG. 25 is a plan view of a second plate.

FIG. 25 is a plan view of the second plate 131. The top face 132 of the second plate 131 is circular in plan view. The top face 132 of the second plate 131 is larger than the substrate W in plan view.

The second substrate holder 91B includes a plurality of (e.g., six) edge contact pins 133. The edge contact pins 133 are attached to the second plate 131. The edge contact pins 133 are supported on the second plate 131. The edge contact pins 133 are movable with respect to the second plate 131. The edge contact pins 133 can contact the edge 20 of the substrate W. For instance, when the second rotational driving unit 92B rotates the second substrate holder 91B, the edge contact pins 133 contact the edge 20 of the substrate W.

When the second rotational driving unit 92B rotates the second substrate holder 91B, the edge contact pins 133 hold the edge 20 of the substrate W in such a manner that the substrate W does not slip with respect to the edge contact pins 133. FIG. 25 shows the substrate W held by the edge contact pins 133 by dotted lines.

The edge contact pins 133 are disposed at a peripheral portion of the second plate 131. The edge contact pins 133 are arranged on a circumference about the rotation axis A5 in plan view.

Figure 26A:
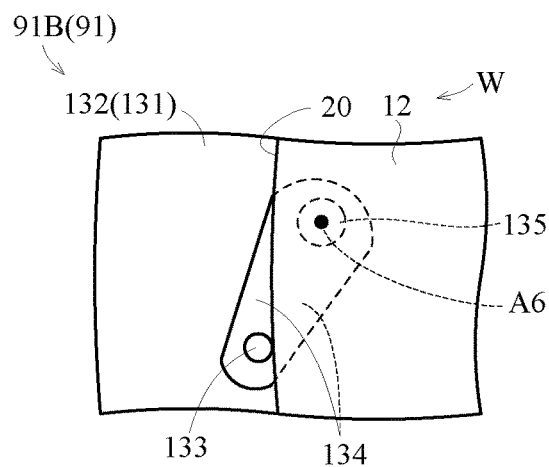
FIG. 26A and FIG. 26B are each a detailed plan view of an edge contact pin.
Figure 26B:
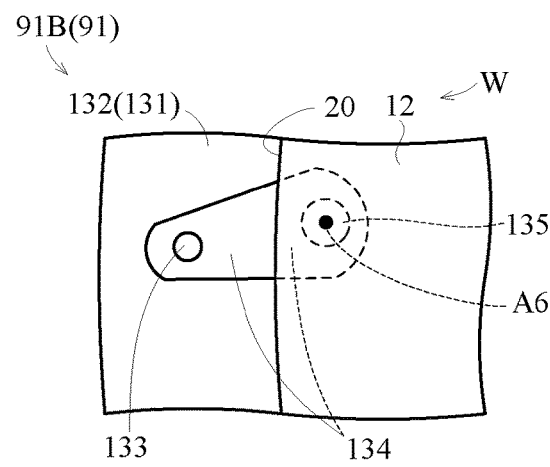
Figure 27A:
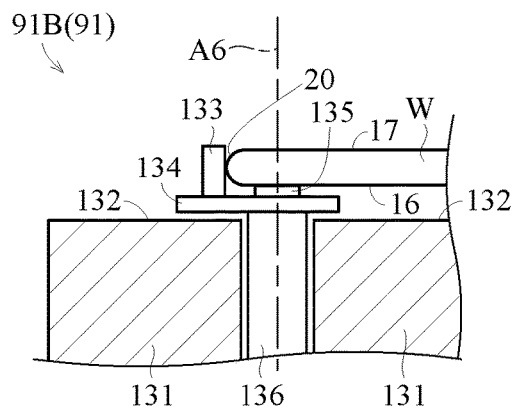
FIG. 27A and FIG. 27B are each a side view of the edge contact pin.
Figure 27B:
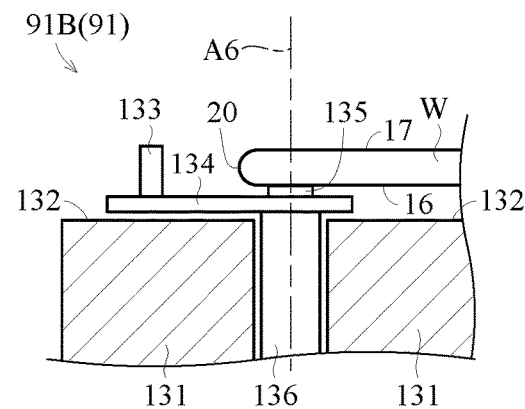

FIG. 26A and FIG. 26B are each a detailed plan view of the edge contact pin 133. FIG. 27A and FIG. 27B are each a side view of the edge contact pin 133. The edge contact pin 133 and configurations associated with the edge contact pin 133 are to be exemplified.

The edge contact pins 133 are fixed to small pieces 134, respectively. The small piece 134 is sufficiently smaller than the second plate 131. The small piece 134 has a wedge shape in plan view. The small piece 134 extends in the horizontal direction.

The small piece 134 also supports a back face contact pin 135. The back face contact pin 135 is also fixed to the small piece 134. The edge contact pin 133 and the back face contact pin 135 each protrude upward from the small piece 134. The back face contact pin 135 contacts the back face 16 of the substrate W. More specifically, the back face contact pin 135 contacts the back face 16 at the peripheral portion 12 of substrate W. This causes the back face contact pin 135 to support the substrate W. The back face contact pin 135 does not contact the top face 17 of the substrate W. The back face contact pin 135 allows the substrate W to move upward with respect to the back face contact pin 135.

The small piece 134 is fixed to a shaft 136. The shaft 136 extends downward from the small piece 134. The shaft 136 is supported by the second plate 131. The edge contact pin 133 and the back face contact pin 135 are supported by the second plate 131 via the shaft 136. The shaft 136 is rotatable with respect to the second plate 131. The shaft 136 is rotatable about a rotation axis A6. The rotation axis A6 is parallel to the up-down direction Z. The rotation axis A6 passes through the center of the shaft 136.

The back face contact pin 135 is disposed on the rotation axis A6. The rotation axis A6 passes through the center of the back face contact pin 135. When the shaft 136 rotates with respect to the second plate 131, the back face contact pin 135 also rotates relative to the second plate 131. However, the position of the back face contact pin 135 with respect to the second plate 131 does not substantially change. A distance between the back face contact pin 135 and the rotation axis A5 does not change.

The edge contact pin 133 is disposed at a position eccentric from the rotation axis A6. The shaft 136 rotates relative to the second plate 131, whereby the edge contact pin 133 moves in the horizontal direction with respect to the second plate 131. Specifically, the edge contact pin 133 approaches the rotation axis A5 and moves away from the rotation axis A5.

Reference is made to FIGS. 26A and 27A. The edge contact pin 133 approaches the rotation axis A5, thereby contacting the edge 20 of the substrate W supported by the back face contact pin 135. Moreover, the edge contact pin 133 may push the edge 20 of the substrate W, which contacts the edge contact pin 133, toward the rotation axis A5.

Reference is made to FIGS. 26B and 27B. The edge contact pin 133 moves away from the rotation axis A5, thereby moving away from the edge 20 of the substrate W supported by the back face contact pin 135.

When the second rotational driving unit 92B rotates the second substrate holder 91B, the edge contact pin 133 does not move away from the substrate W. The second rotational driving unit 92B rotates the second substrate holder 91B while the edge contact pin 133 is in contact with the edge 20 of the substrate W. This prevents the substrate W from slipping with respect to the edge contact pin 133 when the second substrate holder 91B rotates. That is, the edge contact pin 133 holds the edge 20 of the substrate W.

In the second substrate holder 91B, the lift pins 116 are capable of supporting the substrate W at a position higher than the back face contact pins 135. The lift pins 116 can deliver the substrate W to the back face contact pins 135, and can also take the substrate W from the back face contact pins 135.

Here, the second substrate holder 91B does not suck the substrate W held by the edge contact pins 133. The second substrate holder 91B does not blow gas between the top face 132 of the second plate 131 and the back face 16 of the substrate W held by the edge contact pin 133. The second plate 131 has no gas outlet.

Reference is made to FIG. 2. The controller 9 is communicatively connected with the second rotational driving unit 92B, the lift pins 116, the flow rate adjusting unit 125, and the edge contact pins 133 of the second treating unit 7B. The controller 9 controls the second rotational driving unit 92B, the lift pins 116, the flow rate adjusting unit 125, and the edge contact pins 133.

The edge contact pin 133 is one example of an edge contact portion in the present invention.

Exemplary Operation of Substrate Treating Apparatus 1
The following describes exemplary operation in order.
a) Exemplary operation in which the controller 9 obtains a shape of a substrate W
b) Exemplary operation of the transport mechanism 4
c) Exemplary operation of the transport mechanism 8
d) Exemplary operation of the first treating unit 7A
e) Exemplary operation of the second treating unit 7B Exemplary Operation of Obtaining Shape of Substrate W by Controller 9

Figure 28:
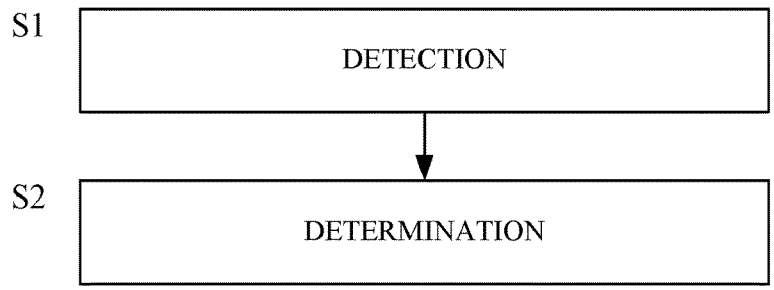
FIG. 28 is a flowchart showing procedures in which a controller obtains a shape of a substrate.

FIG. 28 is a flowchart showing exemplary operation in which the controller 9 obtains a shape of a substrate W.

Step S1
The barcode reader 31 reads a bar code attached to a carrier C. The barcode reader 31 outputs the detected result of the barcode reader 31 to the controller 9.

Step S2
The controller 9 determines the shape of the substrate W in accordance with the detected result of the barcode reader 31. Specifically, the controller 9 identifies which of a first substrate W1, a second substrate W2, and a third substrate W3 corresponds to the substrate W in the carrier C. The controller 9 identifies whether the substrate W in the carrier C corresponds to a normal diameter substrate WN or a large diameter substrate WL.

Here, the controller 9 performs control in association with a position of the substrate W and the shape of the substrate W even after the substrate W is unload from the carrier C. Specifically, the controller 9 controls the shape of the substrate W to be transported by the transport mechanisms 4, 8 at various times. The controller 9 controls the shape of the substrate W to be placed on the mount table 6 at various times. The controller 9 controls the shape of the substrate W to be treated by the treating unit 7 at various times. In order for the controller 9 to control the position and the shape of the substrate W, the controller 9 may refer to the detected results of the substrate detectors 38, 89, and 127 as appropriate.

Exemplary Operation of Transport Mechanism 4

Figure 29:
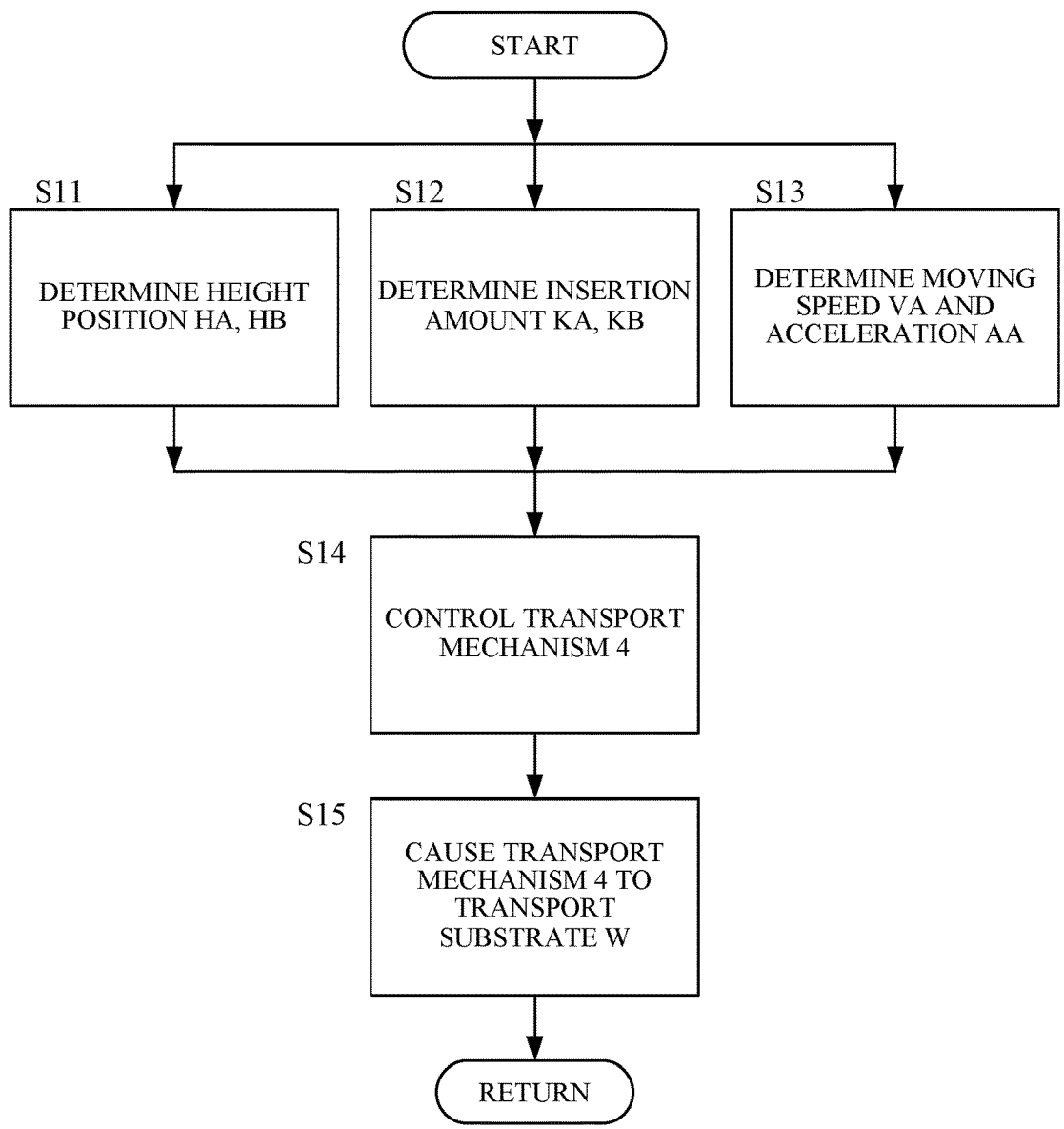
FIG. 29 is a flow chart showing procedures of control by the controller and operation of a transport mechanism.

FIG. 29 is another flow chart showing procedures of control by the controller 9 and operation of the transport mechanism 4.

Step S11

The controller 9 determines a height position of the hand 33 of the transport mechanism 4 when the hand 33 is inserted into the carrier C. Specifically, the controller 9 determines the height position of the hand 33 of the transport mechanism 4 when the hand 33 is inserted between two of the shelves 22 adjacent to each other in the up-down direction Z. Hereinafter, the height position of the hand 33 of the transport mechanism 4 when the hand 33 is inserted between two of the shelves 22 adjacent to each other in the up-down direction Z is abbreviated as a "height position HA". The controller 9 changes the height position HA in accordance with the shape of the substrate W. The controller 9 changes the height position HA in accordance with at least either the shape of the substrate W taken from one of the shelves 22 by the transport mechanism 4 or the shape of the substrate W placed on one of the shelves 22 by the transport mechanism 4.

Specifically, when the substrate W taken from or placed on one of the shelves 22 by the transport mechanism 4 is a first substrate W1, the controller 9 determines the height position HA as a first height position HA1. When the substrate W taken from or placed on one of the shelves 22 by the transport mechanism 4 is a second substrate W2, the controller 9 determines the height position HA as a second height position HA2. When the substrate W taken from or placed on one of the shelves 22 by the transport mechanism 4 is a third substrate W3, the controller 9 determines the height position HA as a third height position HA3. The second height position HA2 is higher than the first height position HA1. The third height position HA3 is higher than the first height position HA1. The third height position HA3 is equal in level to the second height position HA2.

Likewise, the controller 9 determines a height position of the hand 33 of the transport mechanism 4 when the hand 33 is inserted into the mount table 6. Specifically, the controller 9 determines the height position of the hand 33 of the transport mechanism 4 when the hand 33 is inserted between two of the shelves 45 adjacent to each other in the up-down direction Z. Hereinafter, the height position of the hand 33 of the transport mechanism 4 when the hand 33 is inserted between two of the shelves 45 adjacent to each other in the up-down direction Z is abbreviated as a "height position HB". The controller 9 changes the height position HB in accordance with the shape of the substrate W. The controller 9 changes the height position HB in accordance with at least either the shape of the substrate W taken from one of the shelves 45 by the transport mechanism 4 or the shape of the substrate W placed on one of the shelves 45 by the transport mechanism 4.

Specifically, when the substrate W taken from or placed on one of the shelves by the transport mechanism 4 is a first substrate W1, the controller 9 determines the height position HB as a first height position HB1. When the substrate W taken from or placed on one of the shelves 45 by the transport mechanism 4 is a second substrate W2, the controller 9 determines the height position HB as a second height position HB2. When the substrate W taken from or placed on one of the shelves 45 by the transport mechanism 4 is a third substrate W3, the controller 9 determines the height position HB as a third height position HB3. The second height position HB2 is higher than the first height position HB1. The third height position HB3 is higher than the first height position HB1. The third height position HB3 is equal in level to the second height position HB2.

Step S12

The controller 9 determines an insertion amount of the hand 33 of the transport mechanism 4 when the hand 33 is inserted between two of the shelves 22 adjacent to each other in the up-down direction Z. The insertion amount of the hand 33 inserted between two of the shelves 22 adjacent to each other in the up-down direction Z corresponds to an amount of movement of the hand 33 of the transport mechanism 4 in the front-back direction X when the hand 33 is inserted between two of the shelves 22 adjacent to each other in the up-down direction Z. Hereinafter, the insertion amount of the hand 33 inserted between two of the shelves 22 adjacent to each other in the up-down direction Z is abbreviated as an "insertion amount KA". The controller 9 changes the insertion amount KA in accordance with the shape of the substrate W. The controller 9 changes the insertion amount KA in accordance with at least either the shape of the substrate W taken from one of the shelves 22 by the transport mechanism 4 or the shape of the substrate W placed on one of the shelves 22 by the transport mechanism 4.

When the substrate W taken from or placed on one of the shelves 22 by the transport mechanism 4 is a normal diameter substrate WN, the controller 9 determines the insertion amount KA as a first insertion amount KA1. When the substrate W taken from or placed on one of the shelves 22 by the transport mechanism 4 is a large diameter substrate WL, the controller 9 determines the insertion amount KA as a second insertion amount KA2. The second insertion amount KA2 is larger than the first insertion amount KA1.

Likewise, the controller 9 determines an insertion amount of the hand 33 of the transport mechanism 4 when the hand 33 is inserted between two of the shelves adjacent to each other in the up-down direction Z. Hereinafter, the insertion amount of the hand 33 inserted between two of the shelves 45 adjacent to each other in the up-down direction Z is abbreviated as an "insertion amount KB". The controller 9 changes the insertion amount KB in accordance with the shape of the substrate W. The controller 9 changes the insertion amount KB in accordance with at least either the shape of the substrate W taken from one of the shelves 45 by the transport mechanism 4 or the shape of the substrate W placed on one of the shelves by the transport mechanism 4.

When the substrate W taken from or placed on one of the shelves 45 by the transport mechanism 4 is a normal diameter substrate WN, the controller 9 determines the insertion amount KB as a first insertion amount KB1. When the substrate W taken from or placed on one of the shelves 45 by the transport mechanism 4 is a large diameter substrate WL, the controller 9 determines the insertion amount KB as a second insertion amount KB2. The second insertion amount KB2 is larger than the first insertion amount KB1.

Step S13

The controller 9 determines a moving speed and an acceleration of the hand 33 of the transport mechanism 4. Hereinafter, the moving speed of the hand 33 of the transport mechanism 4 is abbreviated as a "moving speed VA". Hereinafter, the acceleration of the hand 33 of the transport mechanism 4 is abbreviated as an "acceleration AA". The controller 9 changes the moving speed VA depending on whether or not the transport mechanism 4 supports the substrate W. The controller 9 changes the acceleration AA depending on whether or not the transport mechanism 4 supports the substrate W.

When the controller 9 determines the moving speed VA and the acceleration AA, the controller 9 may refer to the detected results of the substrate detector 38 as appropriate.

When the transport mechanism 4 supports the substrate W, the controller 9 determines the moving speed VA as a first speed VA1. When the transport mechanism 4 does not support the substrate W, the controller 9 determines the moving speed VA as a second speed VA2. The second speed VA2 is higher than the first speed VA1. The first speed VA1 is, for example, 50% or less of the second speed VA2.

When the transport mechanism 4 supports the substrate W, the controller 9 determines the acceleration AA as a first acceleration AA1. When the transport mechanism 4 does not support the substrate W, the controller 9 determines the acceleration AA as a second acceleration AA2. The second acceleration AA2 is higher than the first acceleration AA1. The first acceleration AA1 is, for example, 70% or less of the second acceleration AA2.

Step S14

The controller 9 controls the transport mechanism 4 (specifically, the hand driving unit 34) with the determined height positions HA, HB, the insertion amounts KA, KB, the moving speed VA, and the acceleration AA.

Step S15

The hand driving unit 34 of the transport mechanism 4 moves the hand 33 in accordance with the control by the controller 9. This causes the transport mechanism 4 to transport the substrate W.

The following exemplary operation will be described specifically.

b1) Exemplary operation of taking the substrate W from the shelf 22 of the carrier C by the transport mechanism 4 b2) Exemplary operation of transporting the substrate W from the carrier C to the mount table 6 by the transport mechanism 4 b3) Exemplary operation of placing the substrate W on the shelf 45 of the mount table 6 by the transport mechanism 4

Exemplary Operation of Taking Substrate W from Shelf 22 of Carrier C by Transport Mechanism 4

FIG. 30A to FIG. 30D are each a diagram schematically showing an exemplary operation in which the transport mechanism 4 takes a substrate W from the shelf 22 of the carrier C.

Figure 30A:
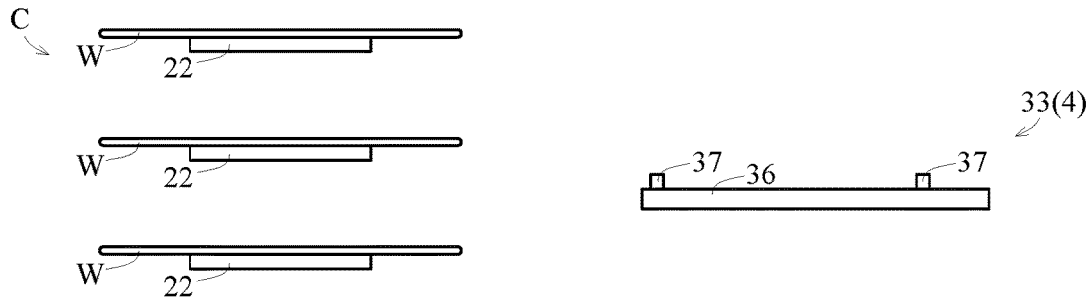
FIG. 30A to FIG. 30D are each a diagram schematically showing an exemplary operation in which the transport mechanism takes a substrate from the shelf of the carrier.

Reference is made to FIG. 30A. The hand 33 does not support a substrate W. The hand 33 moves to a position facing the carrier C. The hand 33 is adjusted to the height position HA determined by the controller 9.

Figure 30B:
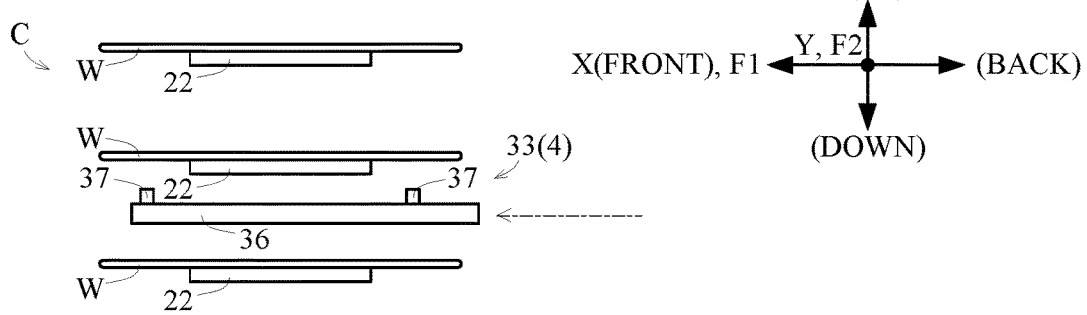

Reference is made to FIG. 30B. The hand 33 enters inside of the carrier C. The hand 33 enters between two of the shelves 22 adjacent to each other in the up-down direction Z at the height position HA determined by the controller 9.

When the hand 33 enters the carrier C, the hand 33 moves in the horizontal direction. Specifically, the hand 33 moves in the front-back direction X. The hand 33 moves forward. The first direction F1 where the rods 36 extends corresponds to a moving direction of the hand 33. In other words, the hand 33 enters between two of the shelves 22 adjacent to each other in the up-down direction Z while the first direction F1 is kept in the moving direction of the hand 33.

The hand 33 advances between two of the shelves 22 adjacent to each other in the up-down direction Z by the insertion amount KA determined by the controller 9, and then stops.

During the procedures up to this point, the hand 33 moves at the second speed VA2 and the second acceleration AA2.

Figure 30C:
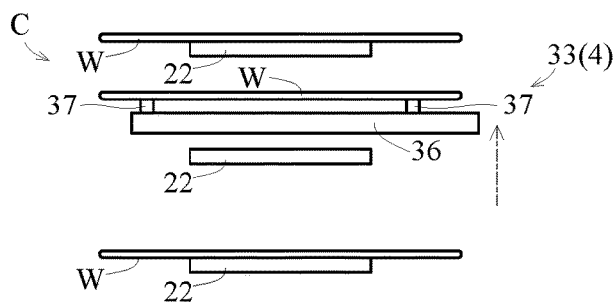

Reference is made to FIG. 30C. The hand 33 moves upward. The hand 33 passes between a first shelf 23 and a second shelf 24 that are both included in one of the shelves 22. This causes the hand 33 to take one substrate W from one of the shelves 22.

Figure 30D:
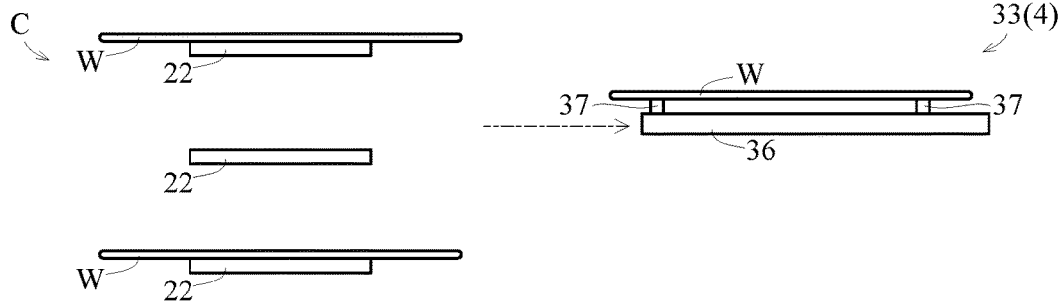

Reference is made to FIG. 30D. The hand 33 moves rearward and exits the carrier C while supporting the substrate W. From this procedure, the hand 33 moves at the first speed VA1 and the first acceleration AA1.

In the above exemplary operation, if the substrate W placed on one of the shelves 22 is the first substrate W1, the hand 33 enters between two of the shelves 22 adjacent to each other in the up-down direction Z at the first height position HA1. If the substrate W placed on one of the shelves 22 is the second substrate W2, the hand 33 enters between two of the shelves 22 adjacent to each other in the up-down direction Z at the second height position HA2. If the substrate W placed on one of the shelves 22 is the third substrate W3, the hand 33 enters between two of the shelves 22 adjacent to each other in the up-down direction Z at the third height position HA3. If the substrate W placed on one of the shelves 22 is the normal diameter substrate WN, the hand 33 advances between two of the shelves 22 adjacent to each other in the up-down direction Z by the first insertion amount KA1, and then stops. If the substrate W placed on one of the shelves 22 is the large diameter substrate WL, the hand 33 advances between two of the shelves 22 adjacent to each other in the up-down direction Z by the second insertion amount KA2, and then stops.

Figure 31A:
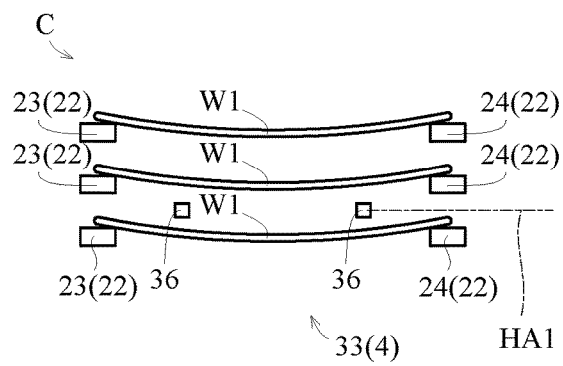
FIG. 31A and FIG. 31B are each a diagram showing a relationship between a substrate placed on the shelf and an insertion height of the hand.
Figure 31B:
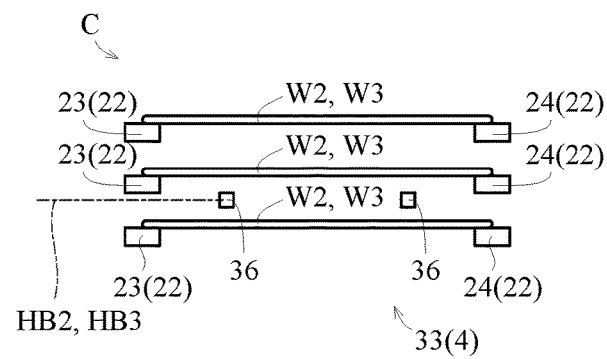

FIG. 31A and FIG. 31B are each a diagram showing a relationship between a substrate W placed on the shelf 22 and an insertion height HA of the hand 33. In FIG. 31A, the first substrates W1 are placed on the shelves 22. In FIG. 31B, the second substrates W2 or the third substrates W3 are placed on the shelves 22.

The first substrates W1 bend more than the second substrates W2 or the third substrates W3. Specifically, the first substrates W1 are curved convexly downward. As described above, the first height position HA1 is lower than the second height position HA2 and the third height position HA3. Accordingly, the hand 33 can enter between two of the shelves 22 adjacent to each other in the up-down direction Z without interfering with the first substrates W1.

A bending amount of a second substrate W2 or a third substrate W3 is smaller than that of a first substrate W1. As described above, both the second height position HA2 and the third height position HA3 are higher than the first height position HA1. Accordingly, the hand 33 can enter between two of the shelves 22 adjacent to each other in the up-down direction Z without interfering with the second substrates W2 or the third substrates W3.

Exemplary Operation of Transporting Substrate W from Carrier C to Mount Table 6 by Transport Mechanism 4

The hand 33 moves from the carrier C to the mount table 6 while supporting the substrate W. This causes the transport mechanism 4 to transport the substrate W from the carrier C to the mount table 6. When the transport mechanism 4 transports the substrate W from the carrier C to the mount table 6, the hand 33 moves at the first speed VA1 and the first acceleration AA1.

Exemplary Operation of Placing Substrate W on Shelf 45 of Mount Table 6 by Transport Mechanism 4

FIG. 32A to FIG. 32D are each another diagram schematically showing an exemplary operation in which the transport mechanism 4 places a substrate W on the shelves 45 of the mount table 6.

Figure 32A:
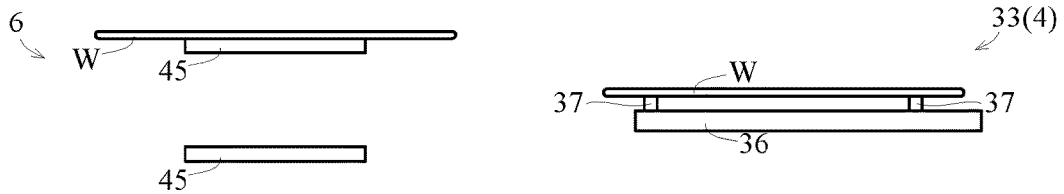
FIG. 32A to FIG. 32D are each a diagram schematically showing an exemplary operation in which the transport mechanism takes a substrate from the shelf of the mount table.

Reference is made to FIG. 32A. The hand 33 supports the substrate W. The hand 33 moves to a position facing the mount table 6. The hand 33 is adjusted to the height position HB determined by the controller 9.

Figure 32B:
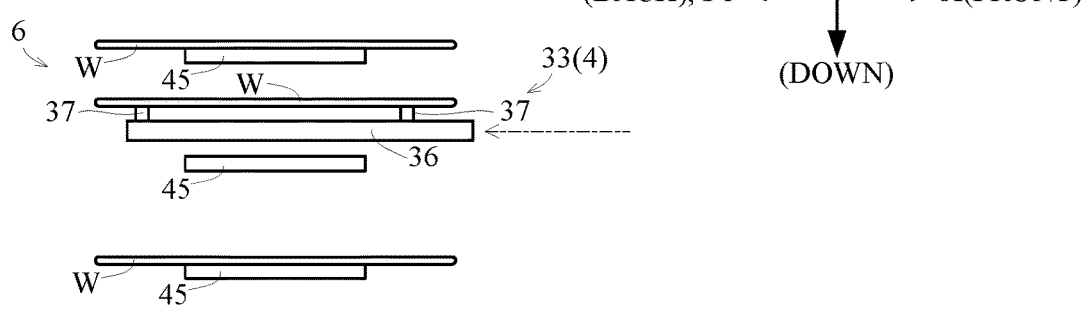

Reference is made to FIG. 32B. The hand 33 moves rearward. The hand 33 enters the mount table 6. The hand 33 enters between two of the shelves 45 adjacent to each other in the up-down direction Z at the height position HB determined by the controller 9. The hand 33 advances between two of the shelves 45 adjacent to each other in the up-down direction Z by the insertion amount KB determined by the controller 9, and then stops.

During the procedures up to this point, the hand 33 moves at the first speed VA1 and the first acceleration AA1.

Figure 32C:
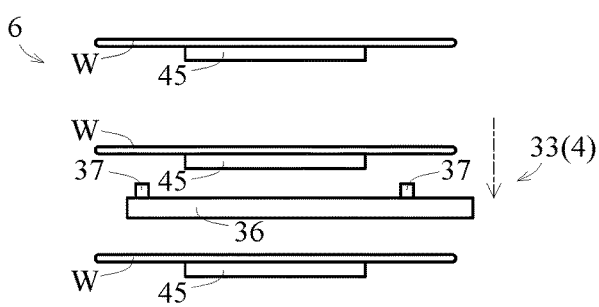

Reference is made to FIG. 32C. The hand 33 moves downward. The hand 33 passes between a first shelf 46 and a second shelf 47 that are both included in one of the shelves 45. This causes the hand 33 to place one substrate W on one of the shelves 45. The hand 33 moves away from the substrate W on one of the shelves 45.

As described above, the distance ET between two of the shelves 45 is larger than the diameter D of the substrate W. Therefore, even if the hand 33 passes the substrates W to the shelves 45 at various positions, the shelves 45 can suitably receive substrates W.

A substrate W is guided by the first slope face 51 and the second slope face of one of the shelves 45. Accordingly, when the substrate W is placed on one of the shelves 45, the substrate W is positioned at a predetermined position. Even if the hand 33 places the substrates W on the shelves 45 at various positions, the shelves 45 adjusts the positions of substrates W in such a manner that variation in positions of the substrates W become small.

Figure 32D:
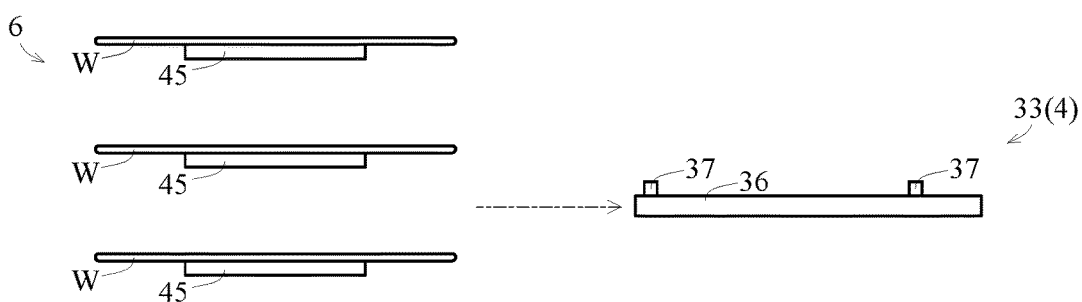

Reference is made to FIG. 32D. The hand 33 moves forward and exits the mount table 6 while not supporting the substrate W. From this procedure, the hand 33 moves at the second speed VA2 and the second acceleration AA2.

In the above exemplary operation, if the substrate W supported by the hand 33 is the first substrate W1, the hand 33 enters between two of the shelves 45 adjacent to each other in the up-down direction Z at the first height position HB1. If the substrate W supported by the hand 33 is the second substrate W2, the hand 33 enters between two of the shelves 45 adjacent to each other in the up-down direction Z at the second height position HA2. If the substrate W supported by the hand 33 is the third substrate W3, the hand 33 enters between two of the shelves 45 adjacent to each other in the up-down direction Z at the third height position HA3. If the substrate W supported by the hand 33 is the normal diameter substrate WN, the hand 33 advances between two of the shelves 45 adjacent to each other in the up-down direction Z by the first insertion amount KB1, and then stops. If the substrate W supported by the hand 33 is a large diameter substrate WL, the hand 33 advances between two of the shelves 45 adjacent to each other in the up-down direction Z by the second insertion amount KB2, and then stops.

Operation of taking a substrate W from one of the shelves 45 of the mount table 6 by the transport mechanism 4 is substantially the same as operation of taking a substrate W from one of the shelves 22 of a carrier C by the transport mechanism 4. Operation of placing a substrate W on one of the shelves 22 of a carrier C by the transport mechanism 4 is substantially the same as operation of placing a substrate W on one of the shelves 45 of the mount table 6 by the transport mechanism 4.

Exemplary Operation of Transport Mechanism 8

FIG. 33 is another flow chart showing procedures of control by the controller 9 and operation of the transport mechanism 8.

Step S21

The controller 9 determines a height position of the hand 61 of the transport mechanism 8 when the hand 61 is inserted into the mount table 6. Specifically, the controller 9 determines a height position of the hand 61 of the transport mechanism 8 when the hand 61 is inserted between two of the shelves 45 adjacent to each other in the up-down direction Z. Hereinafter, the height position of the hand 61 of the transport mechanism 8 when the hand 61 is inserted between two of the shelves 45 adjacent to each other in the up-down direction Z is abbreviated as a "height position HC". The controller 9 changes the height position HC in accordance with the shape of the substrate W. The controller 9 changes the height position HC in accordance with at least either the shape of the substrate W taken from one of the shelves 45 by the transport mechanism 8 or the shape of the substrate W placed on one of the shelves 45 by the transport mechanism 8.

Specifically, when the substrate W taken from or placed on one of the shelves 45 by the transport mechanism 8 is a first substrate W1, the controller 9 determines the height position HC as a first height position HC1. When the substrate W taken from or placed on one of the shelves 45 by the transport mechanism 8 is a second substrate W2, the controller 9 determines the height position HC as a second height position HC2. When the substrate W taken from or placed on one of the shelves 45 by the transport mechanism 8 is a third substrate W3, the controller 9 determines the height position HC as a third height position HC3. The second height position HC2 is higher than the first height position HC1. The third height position HC3 is higher than the first height position HC1. The third height position HC3 is equal in level to the second height position HC2.

Step S22

The controller 9 determines an insertion amount of the hand 61 of the transport mechanism 8 when the hand 61 is inserted between two of the shelves 45 adjacent to each other in the up-down direction Z. The insertion amount of the hand 61 inserted between two of the shelves 45 adjacent to each other in the up-down direction Z corresponds to an amount of movement of the hand 61 of the transport mechanism 8 in the front-back direction X when the hand 61 is inserted between two of the shelves 45 adjacent to each other in the up-down direction Z. Hereinafter, the insertion amount of the hand 61 inserted between two of the shelves 45 adjacent to each other in the up-down direction Z is abbreviated as an "insertion amount KC". The controller 9 changes the insertion amount KC in accordance with the shape of the substrate W. The controller 9 changes the insertion amount KC in accordance with at least either the shape of the substrate W taken from one of the shelves 45 by the transport mechanism 8 or the shape of the substrate W placed on one of the shelves 45 by the transport mechanism 8.

When the substrate W taken from or placed on one of the shelves 45 by the transport mechanism 8 is a normal diameter substrate WN, the controller 9 determines the insertion amount KC as a first insertion amount KC1. When the substrate W taken from or placed on one of the shelves

45 by the transport mechanism 8 is a large diameter substrate WL, the controller 9 determines the insertion amount KC as a second insertion amount KC2. The second insertion amount KC2 is larger than the first insertion amount KC1.

Step S23

The controller 9 determines a flow rate of gas supplied to the suction portion 68. Hereinafter, the flow rate of the gas supplied to the suction portion 68 is abbreviated as a "flow rate M". The controller 9 changes the flow rate M in accordance with the shape of the substrate W transported by the transport mechanism 8.

Specifically, when the transport mechanism 8 transports a first substrate W1, the controller 9 adjusts the flow rate M to a first flow rate M1. When the transport mechanism 8 transports a second substrate W2, the controller 9 adjusts the flow rate M to a second flow rate M2. When the transport mechanism 8 transports a third substrate W3, the controller 9 adjusts the flow rate M to a third flow rate M3. The second flow rate M2 is larger than the first flow rate M1. The third flow rate M3 is larger than the first flow rate M1.

Step S24

The controller 9 determines a treating unit 7 to treat the substrate W. More specifically, the controller 9 determines the treating unit 7 to treat the substrate W from either a first treating unit 7A or a second treating unit 7B depending on the shape of the substrate W.

Specifically, when the substrate W is a first substrate W1, the controller 9 determines that the substrate W is treated in the first treating unit 7A. When the substrate W is a second substrate W2, the controller 9 determines that the substrate W is treated in the second treating unit 7B. When the substrate W is a third substrate W3, the controller 9 determines that the substrate W is treated in the second treating unit 7B.

Step S25 The controller 9 determines a moving speed and an acceleration of the hand 61 of the transport mechanism 8. Hereinafter, the moving speed of the hand 61 of the transport mechanism 8 is abbreviated as a "moving speed VB". Hereinafter, the acceleration of the hand 61 of the transport mechanism 8 is abbreviated as an "acceleration AB". The controller 9 changes the moving speed VB depending on whether or not the transport mechanism 8 supports the substrate W. The controller 9 changes the acceleration AB depending on whether or not the transport mechanism 8 supports the substrate W.

When the controller 9 determines the moving speed VB and the acceleration AB, the controller 9 may refer to the detected results of the substrate detector 89 as appropriate.

Specifically, when the transport mechanism 8 supports the substrate W, the controller 9 determines the moving speed VB as a first speed VB1. When the transport mechanism 8 does not support the substrate W, the controller 9 determines the moving speed VB as a second speed VB2. The second speed VB2 is higher than the first speed VB1. The first speed VB1 is, for example, 50% or less of the second speed VB2.

When the transport mechanism 8 supports the substrate W, the controller 9 determines the acceleration AB as a first acceleration AB1. When the transport mechanism 8 does not support the substrate W, the controller 9 determines the acceleration AB as a second acceleration AB2. The second acceleration AB2 is higher than the first acceleration AB1. The first acceleration AB1 is, for example, 70% or less of the second acceleration AB2.

Step S26

The controller 9 controls the transport mechanism 8 (specifically, the hand driving unit 62) with the determined height position HC, the insertion amount KC, the flow rate M, the treating unit 7, the moving speed VB, and the acceleration AB. The determined treating unit 7 is either a first treating unit 7A or a second treating unit 7B. The determined treating unit 7 is specifically one determined from either the first treating unit 7A or the second treating unit 7B.

Step S27 The hand driving unit 62 of the transport mechanism 8 moves the hand 61 in accordance with the control by the controller 9. This causes the transport mechanism 8 to transport the substrate W.

The following exemplary operation will be described specifically.

c1) Exemplary operation of taking the substrate W from the shelf 45 of the mount table 6 by the transport mechanism 8 c2) Exemplary operation of transporting the substrate W from the mount table 6 to the treating unit 7 by the transport mechanism 8 c3) Exemplary operation of delivering the substrate W to the substrate holder 91 of the treating unit by the transport mechanism 8 c4) Exemplary operation of taking the substrate W from the substrate holder 91 of the treating unit 7 by the transport mechanism 8 c5) Exemplary operation of placing the substrate W on the shelf 45 of the mount table 6 by the transport mechanism 8

Exemplary Operation of Taking Substrate W from Shelf 45 of Mount Table 6 by Transport Mechanism 8

FIG. 34A to FIG. 34D as well as FIG. 35A to FIG. 35D are each a diagram schematically showing an exemplary operation in which the transport mechanism 8 takes a substrate W from the shelf 45 of the mount table 6.

Figure 34A:
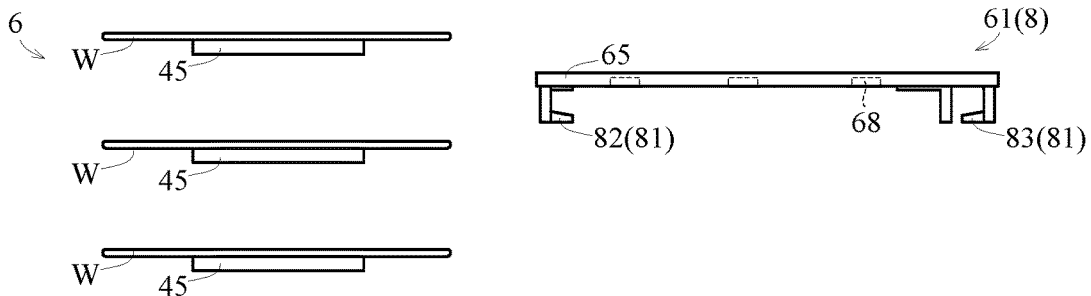
FIG. 34A to FIG. 34D are each a diagram schematically showing an exemplary operation in which the transport mechanism takes a substrate from the shelf of the mount table.

Reference is made to FIG. 34A. The hand 61 supports no substrate W. The suction adjusting unit 73 supplies no gas to the suction portion 68. The suction portion 68 blows no gas. The suction portion 68 suck no substrate W. The second receiver 83 is located at a retreating position. The hand 61 moves to a position facing the mount table 6. The hand 61 is adjusted to the height position HC determined by the controller 9.

Figure 34B:
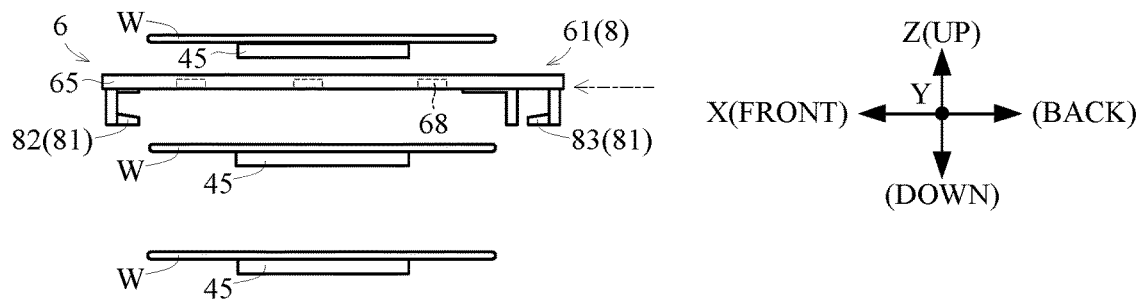

Reference is made to FIG. 34B. The hand 61 moves forward. The hand 61 enters the mount table 6. The hand 61 enters between two of the shelves 45 adjacent to each other in the up-down direction Z at the height position HC determined by the controller 9. The hand 61 advances between two of the shelves 45 adjacent to each other in the up-down direction Z by the insertion amount KC determined by the controller 9, and then stops. When the hand 61 is stopped, the first receiver 82 and the second receiver 83 do not overlap the substrates W placed on one of the shelves 45 in plan view.

Figure 34C:
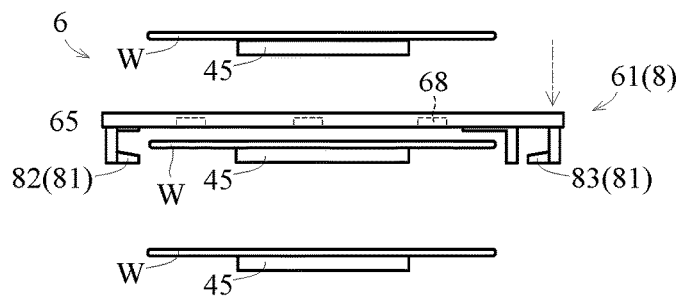

Reference is made to FIG. 34C. The hand 61 moves downward. The first receiver 82 and the second receiver 83 pass laterally of a substrate W placed on one of the shelves 45. The first receiver 82 and the second receiver 83 move to a position lower than the substrate W placed on one of the shelves 45. The suction portion 68 approaches the top face 17 of the substrate W.

Figure 34D:
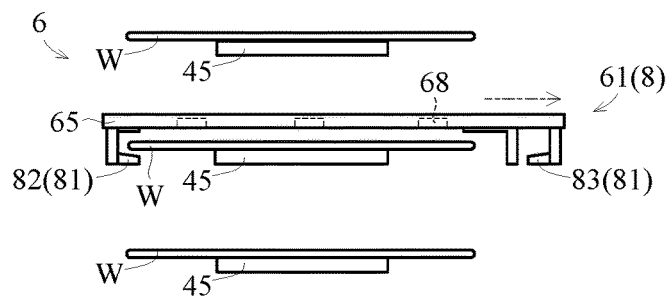

Reference is made to FIG. 34D. The hand 61 moves slightly in the horizontal direction. This causes the first receiver 82 to move to a position where the first receiver 82 overlaps the substrate W placed on one of the shelves 45 in plan view. The second receiver 83 still does not overlap the substrate W placed on one of the shelves 45 in plan view.

During the procedures up to this point, the hand 61 moves at the second speed VB2 and the second acceleration AB2.

Figure 35A:
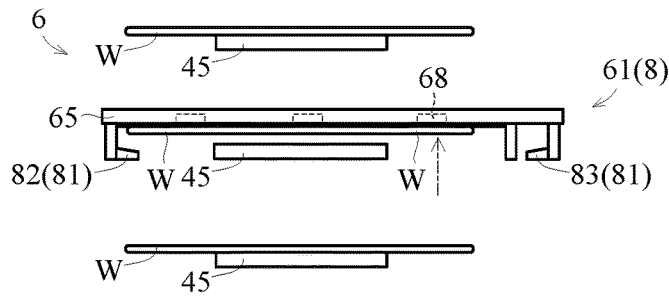
FIG. 35A to FIG. 35D are each a diagram schematically showing an exemplary operation in which the transport mechanism takes a substrate from the shelf of the mount table.

Reference is made to FIG. 35A. The suction adjusting unit 73 supplies gas to the suction portion 68 at the flow rate M determined by the controller 9. The suction portion 68 flows gas over the top face 17 of the substrate W. This causes the suction portion 68 to suck the substrate W upward. The substrate W floats upward. The substrate W moves away from the shelves 45. The top face 17 of the substrate W contacts a contact portion 74. This causes the hand 61 to take one substrate W from one of the shelves 45. The hand 61 holds the substrate W.

Figure 35B:
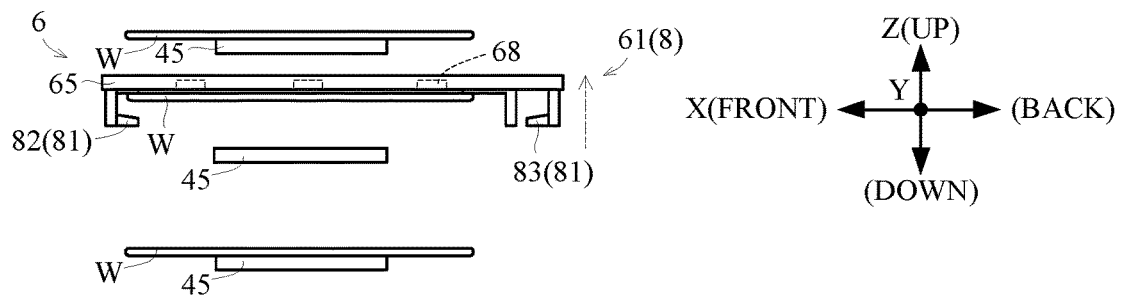

Reference is made to FIG. 35B. The hand 61 moves upward. From this procedure, the hand 61 moves at the first speed VB1 and the first acceleration AB1.

Figure 35C:
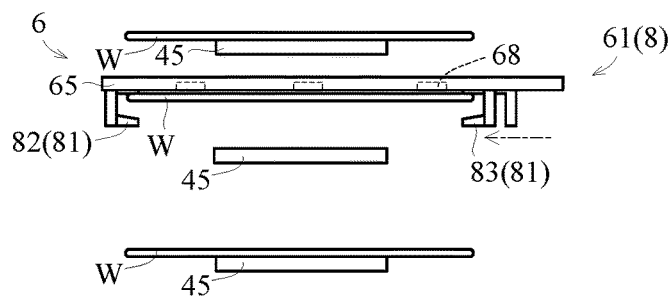

Reference is made to FIG. 35C. The receiver driving unit 86 moves the second receiver 83 from the retreating position to the drop-preventing position. This causes both the first receiver 82 and the second receiver 83 to overlap the substrate W sucked by the suction portion 68 in plan view.

For this reason, even if the substrate W falls downward off the contact portion 74, the receiver 81 receives the substrate W. That is, the hand 61 is not likely to drop the substrate W.

Figure 35D:
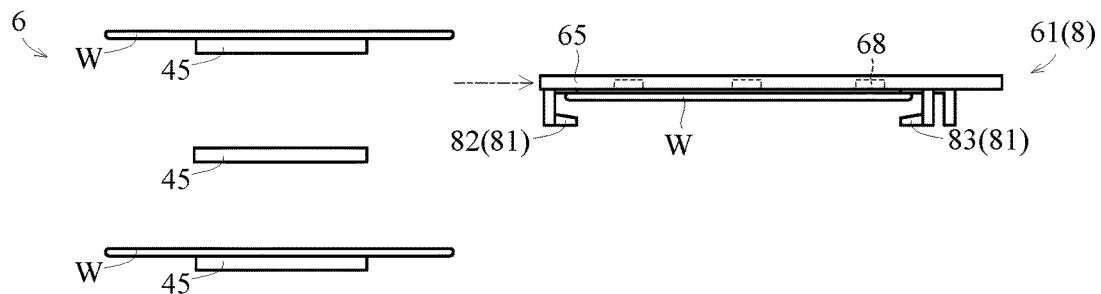

Reference is made to FIG. 35D. The hand 61 moves rearward and exits the mount table 6 while holding the substrate W.

In the above exemplary operation, if the substrate W placed on one of the shelves 45 is the first substrate W1, the hand 61 enters between two of the shelves 45 adjacent to each other in the up-down direction Z at the first height position HC1. Moreover, the suction adjusting unit 73 supplies gas to the suction portion 68 at the first flow rate M1. If the substrate W placed on one of the shelves 45 is the second substrate W2, the hand 61 enters between two of the shelves 45 adjacent to each other in the up-down direction Z at the second height position HC2. Moreover, the suction adjusting unit 73 supplies gas to the suction portion 68 at the second flow rate M2. If the substrate W placed on one of the shelves 45 is the third substrate W3, the hand 61 enters between two of the shelves 45 adjacent to each other in the up-down direction Z at the third height position HC3. Moreover, the suction adjusting unit 73 supplies gas to the suction portion 68 at the third flow rate M3. If the substrate W placed on one of the shelves 45 is the normal diameter substrate WN, the hand 61 advances between two of the shelves 45 adjacent to each other in the up-down direction Z by the first insertion amount KC1, and then stops. If the substrate W placed on one of the shelves 45 is the large diameter substrate WL, the hand 61 advances between two of the shelves 45 adjacent to each other in the up-down direction Z by the second insertion amount KC2, and then stops.

Exemplary Operation of Transporting Substrate W from Mount Table 6 to Treating Unit 7 by Transport Mechanism 8

The hand 61 holds the substrate W. Specifically, the suction adjusting unit 73 supplies gas to the suction portion 68 at the flow rate M determined by the controller 9. If the substrate W held by the hand 61 is a first substrate W1, the suction adjusting unit 73 supplies gas to the suction portion 68 at the first flow rate M1. If the substrate W held by the hand 61 is a second substrate W2, the suction adjusting unit 73 supplies gas to the suction portion 68 at the second flow rate M2. If the substrate W held by the hand 61 is a third substrate W3, the suction adjusting unit 73 supplies gas to the suction portion 68 at the third flow rate M3. The suction portion 68 flows gas over the top face 17 of the substrate W. The suction portion 68 suck the substrate W.

The second receiver 83 is in the drop-preventing position. Both the first receiver 82 and the second receiver 83 overlap the substrate W sucked by the suction portion 68 in plan view.

The hand 61 moves from the mount table 6 to the treating unit 7 determined by the controller 9. This causes the transport mechanism 8 to transport the substrate W to the treating unit 7 determined by the controller 9. If the substrate W held by the hand 61 is a first substrate W1, the transport mechanism 8 transports the substrate W to the first treating unit 7A. If the substrate W held by the hand 61 is a second substrate W2 or a third substrate W3, the transport mechanism 8 transports the substrate W to the second treating unit 7B.

When the transport mechanism 8 transports the substrate W from the mount table 6 to the treating unit 7, the hand 61 moves at the first speed VB1 and the first acceleration AA1.

Exemplary Operation of Delivering Substrate W to Substrate Holder 91 of Treating Unit 7 by Transport Mechanism 8

FIG. 36A to 36F are each a diagram schematically showing an exemplary operation in which the transport mechanism 8 delivers a substrate W to the substrate holder 91 of the treating unit 7. Whether the substrate holder 91 is the first substrate holder 91A or the second substrate holder 91B, operation of delivering the substrate W to the substrate holder 91 by the transport mechanism 8 is performed in the same manner.

Figure 36A:
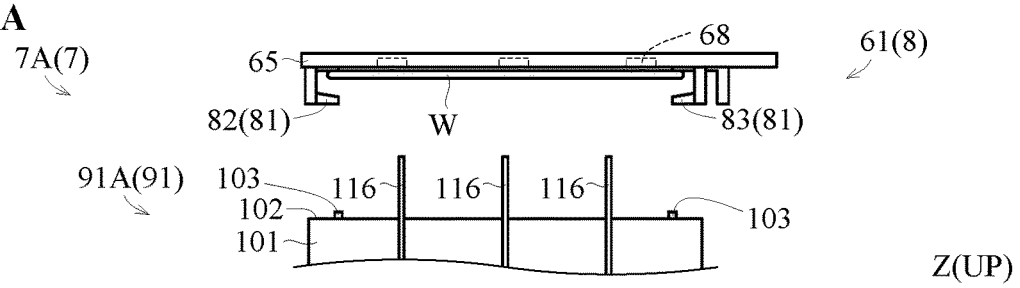
FIG. 36A to 36F are each a diagram schematically showing an exemplary operation in which the transport mechanism delivers a substrate to a substrate holder of the treating unit.

Reference is made to FIG. 36A. The hand 61 holds the substrate W. Specifically, the suction adjusting unit 73 supplies gas to the suction portion 68 at the flow rate M determined by the controller 9. The suction portion 68 flows gas over the top face 17 of the substrate W. The suction portion 68 suck the substrate W.

The second receiver 83 is in the drop-preventing position. The hand 61 enters inside of the treating unit 7. The hand 61 is located above the substrate holder 91. The lift pins 116 are located in the upper position.

Figure 36B:
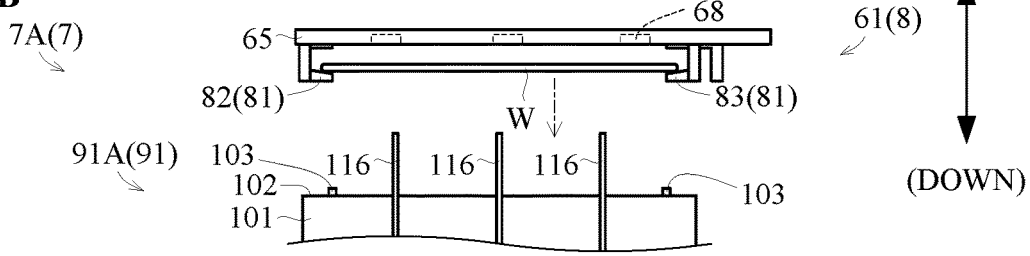

Reference is made to FIG. 36B. The suction adjusting unit 73 stops supplying gas to the suction portion 68. The suction portion 68 stops sucking the substrate W. The substrate W falls downward. The receiver 81 receives the substrate W. More specifically, the first receiver 82 and the second receiver 83 receive the back face 16 of the substrate W. In such a manner as above, the suction portion 68 stops suction of the substrate W so that the substrate W is placed on the first receiver 82 and the second receiver 83.

Figure 36C:
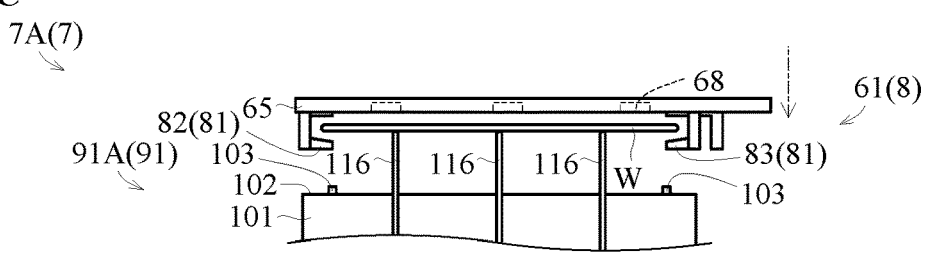

Reference is made to FIG. 36C. The hand 61 moves slightly downward. This causes the first receiver 82 and the second receiver 83 to deliver the substrate W to the lift pins 116. The lift pins 116 receive the substrate W from the receiver 81. The lift pins 116 receive the substrate W in the upper position. The lift pins 116 support the substrate W in the upper position. The first receiver 82 and the second receiver 83 move to a position lower than the substrate W supported by the lift pins 116. The first receiver 82 and the second receiver 83 move away from the substrate W supported by the lift pins 116.

During the procedures up to this point, the hand 61 moves at the first speed VB1 and the first acceleration AB1.

Figure 36D:
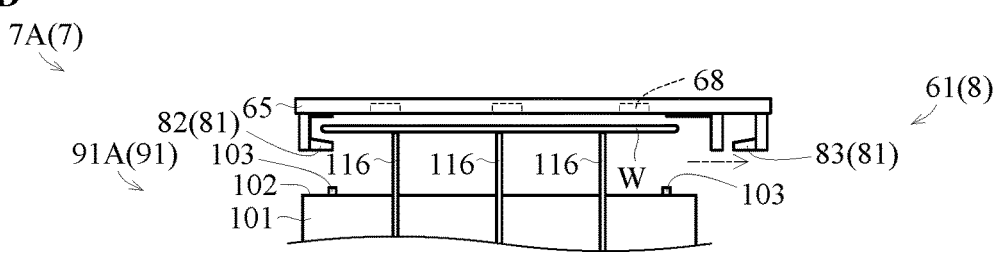

Reference is made to FIG. 36D. The receiver driving unit 86 moves the second receiver 83 from the drop-preventing position to the retreating position. This causes the second receiver 83 to move to a position where the second receiver 83 does not overlap the substrate W supported by the lift pins 116 in a plan view. The first receiver 82 still overlaps the substrate W supported by the lift pins 116 in plan view.

Figure 36E:
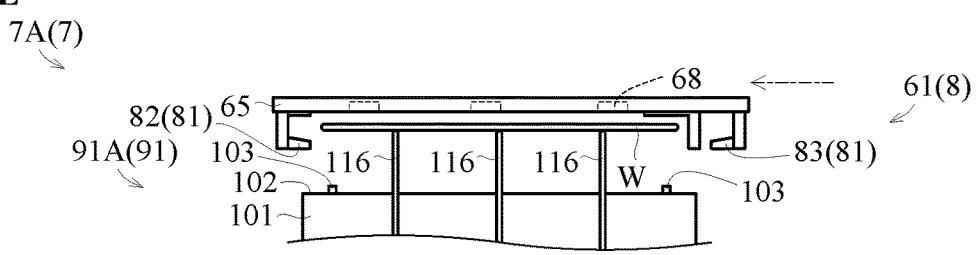

Reference is made to FIG. 36E. The hand 61 moves slightly in the horizontal direction. This causes both the first receiver 82 and the second receiver 83 to move to a position where both the first receiver 82 and the second receiver 83 do not overlap the substrate W supported by the lift pins 116 in a plan view. From this procedure, the hand 61 moves at the second speed VB2 and the second acceleration AB2.

Figure 36F:
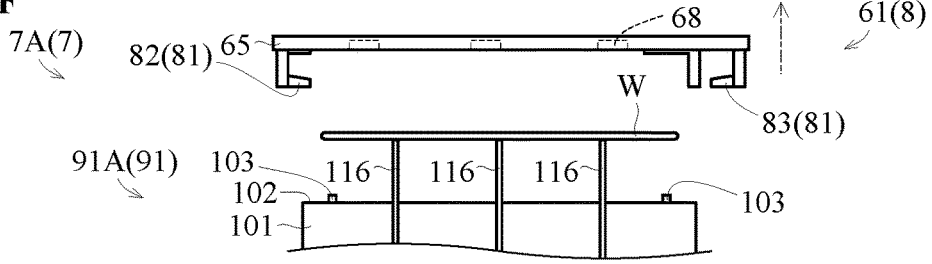

Reference is made to FIG. 36F. The hand 61 moves upward. The first receiver 82 and the second receiver 83 pass laterally of the substrate W supported by the lift pins 116, and move to positions higher than the substrate W supported by the lift pins 116.

Thereafter, the hand 61 moves away from the upper position of the substrate holder 91, and exits the treating unit 7 in a state where the hand 61 does not hold the substrate W, which is not shown.

Exemplary Operation of Taking Substrate W from Substrate Holder 91 of Treating Unit 7 by Transport Mechanism 8

FIG. 37A to FIG. 37F are each a diagram schematically showing an exemplary operation in which the transport mechanism 8 takes a substrate W from the substrate holder 91 of the treating unit 7. Whether the substrate holder 91 is the first substrate holder 91A or the second substrate holder 91B, operation of taking the substrate W from the substrate holder 91 by the transport mechanism 8 is performed in the same manner.

Figure 37A:
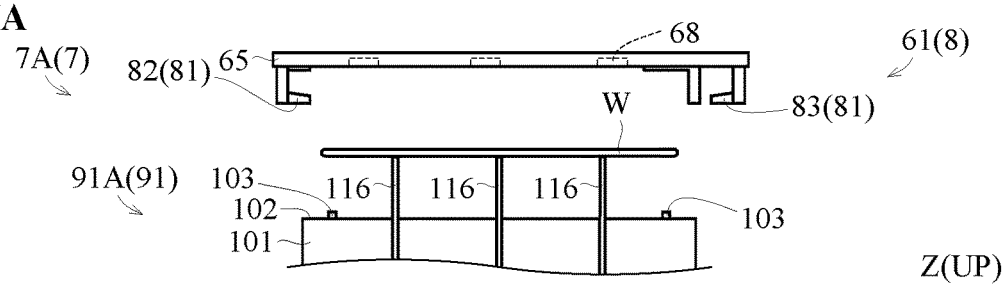
FIG. 37A to FIG. 37F are each a diagram schematically showing an exemplary operation in which the transport mechanism takes a substrate from the substrate holder of the treating unit.

Reference is made to FIG. 37A. The hand 61 holds no substrate W. The suction adjusting unit 73 supplies no gas to the suction portion 68. The suction portion 68 flows no gas over the top face 17 of the substrate W. The suction portion 68 sucks no substrate W. The second receiver 83 is located at a retreating position. The hand 61 enters inside of the treating unit 7. The hand 61 is located above the substrate holder 91. The lift pins 116 support the substrate W in the upper position. The first receiver 82 and the second receiver 83 do not overlap the substrate W supported by the lift pins 116 in plan view.

Figure 37B:
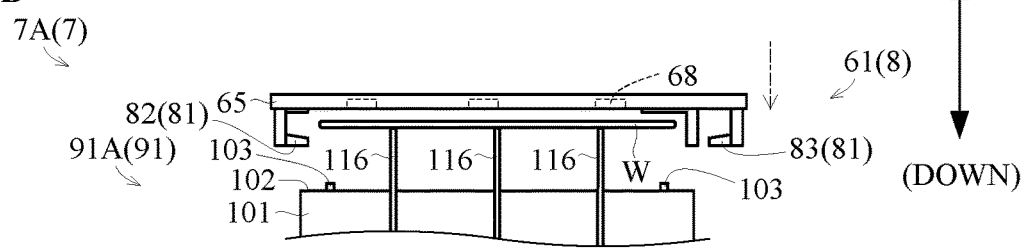

Reference is made to FIG. 37B. The hand 61 moves slightly downward. The first receiver 82 and the second receiver 83 pass laterally of the substrate W supported by the lift pins 116. The first receiver 82 and the second receiver 83 move to a position lower than the substrate W supported by the lift pins 116. The suction portion 68 approaches the top face 17 of the substrate W.

Figure 37C:
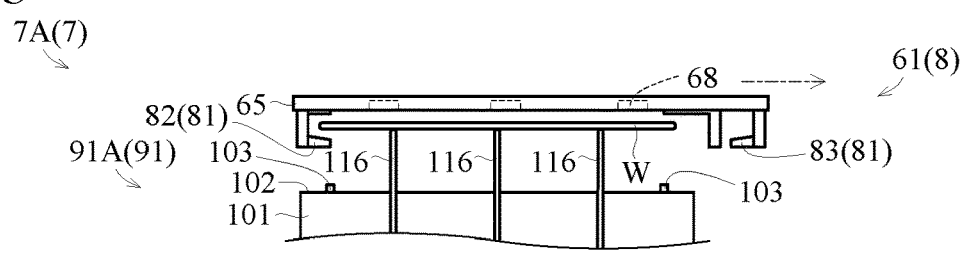

Reference is made to FIG. 37C. The hand 61 moves slightly in the horizontal direction. This causes the first receiver 82 to move to a position where the first receiver 82 overlaps the substrate W supported by the lift pins 116 in a plan view. The second receiver 83 still does not overlap the substrate W supported by the lift pins 116 in plan view.

Figure 37D:
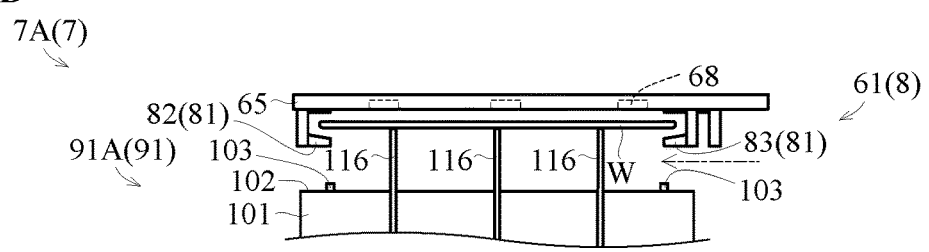

Reference is made to FIG. 37D. The receiver driving unit 86 moves the second receiver 83 from the retreating position to the drop-preventing position. This causes both the second receiver 83 and the first receiver 82 to overlap the substrate W supported by the lift pins 116 in a plan view.

During the procedures up to this point, the hand 61 moves at the second speed VB2 and the second acceleration AB2.

Figure 37E:
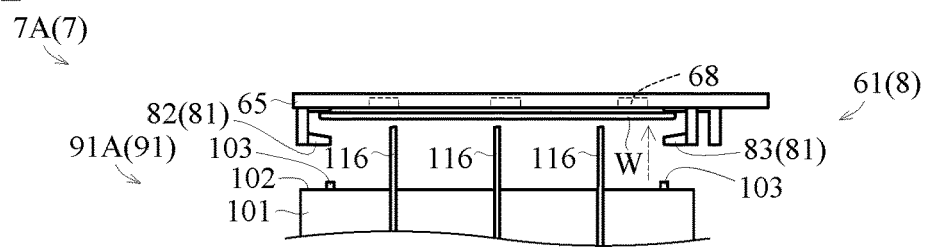

Reference is made to FIG. 37E. The suction adjusting unit 73 supplies gas to the suction portion 68 at the flow rate M determined by the controller 9. The suction portion 68 flows gas over the top face 17 of the substrate W. This causes the suction portion 68 to suck the substrate W upward. The substrate W floats upward. The substrate W moves away from the lift pins 116. The top face 17 of the substrate W contacts a contact portion 74. In this manner, the hand 61 takes one substrate W from the lift pins 116. The hand 61 holds the substrate W.

Figure 37F:
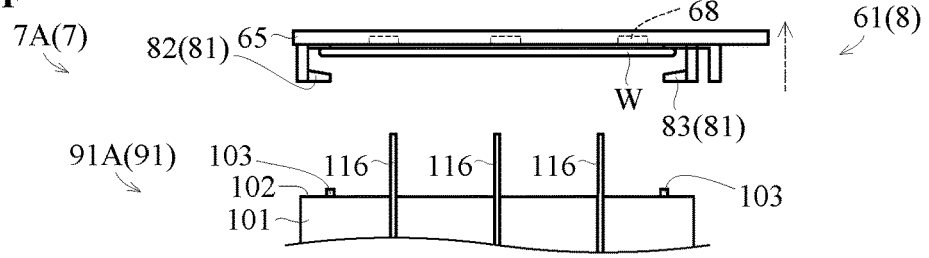

Reference is made to FIG. 37F. The hand 61 moves upward while holding the substrate W.

From this procedure, the hand 61 moves at the first speed VB1 and the first acceleration AB1.

Thereafter, the hand 61 moves away from the upper position of the substrate holder 91, and exits the treating unit 7 in a state where the hand 61 holds the substrate W, which is not shown.

Exemplary Operation of Placing Substrate W on Shelf 45 of Mount Table 6 by Transport Mechanism 8

FIGS. 38A to 38D as well as FIGS. 39A to 39D are each another diagram schematically showing an exemplary operation in which the transport mechanism 8 places a substrate W on the shelves 45 of the mount table 6.

Figure 38A:
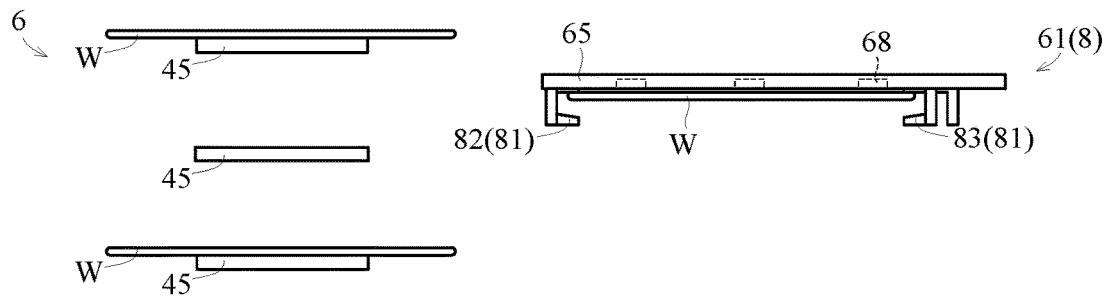
FIG. 38A to FIG. 38D are each a diagram schematically showing an exemplary operation in which the transport mechanism places a substrate in a shelf of the mount table.

Reference is made to FIG. 38A. The hand 61 holds the substrate W. The suction adjusting unit 73 supplies gas to the suction portion 68 at the flow rate M determined by the controller 9. The suction portion 68 flows gas over the top face 17 of the substrate W. The suction portion 68 sucks the substrate W. The second receiver 83 is in the drop-preventing position. The hand 61 moves to a position facing the mount table 6. The hand 61 is adjusted to the height position HC determined by the controller 9.

Figure 38B:
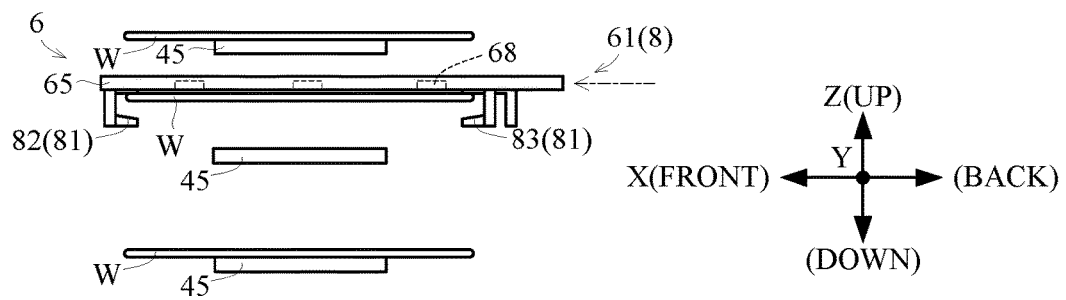

Reference is made to FIG. 38B. The hand 61 moves forward. The hand 61 enters the mount table 6. The hand 61 enters between two of the shelves 45 adjacent to each other in the up-down direction Z at the height position HC determined by the controller 9. The hand 61 advances between two of the shelves 45 adjacent to each other in the up-down direction Z by the insertion amount KC determined by the controller 9, and then stops.

Figure 38C:
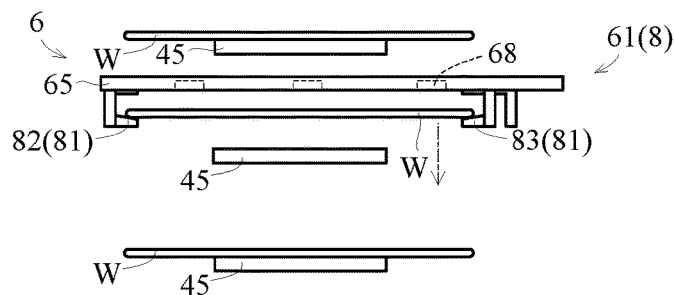

Reference is made to FIG. 38C. The suction adjusting unit 73 stops supplying gas to the suction portion 68. The suction portion 68 stops sucking the substrate W. The substrate W falls downward. The receiver 81 receives the substrate W. More specifically, the first receiver 82 and the second receiver 83 receive the back face 16 of the substrate W. In such a manner as above, the suction portion 68 stops suction of the substrate W so that the substrate W is placed on the first receiver 82 and the second receiver 83.

Figure 38D:
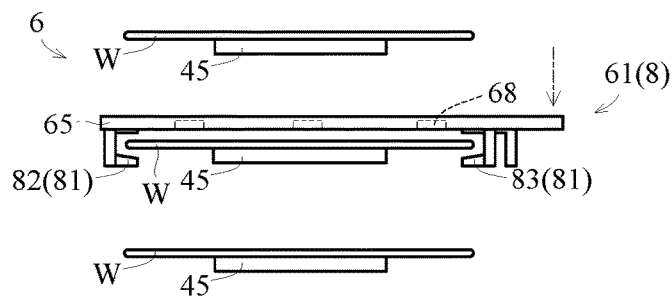

Reference is made to FIG. 38D. The hand 61 moves slightly downward. This causes the first receiver 82 and the second receiver 83 to deliver the substrate W to the shelf 45. The shelf 45 receives the substrate W from the receiver 81. The shelf supports the substrate W. The first receiver 82 and the second receiver 83 move to a position lower than the substrate W supported by the shelf 45. The first receiver 82 and the second receiver 83 move away from the substrate W supported by the shelf 45.

During the procedures up to this point, the hand 61 moves at the first speed VB1 and the first acceleration AB1.

Figure 39A:
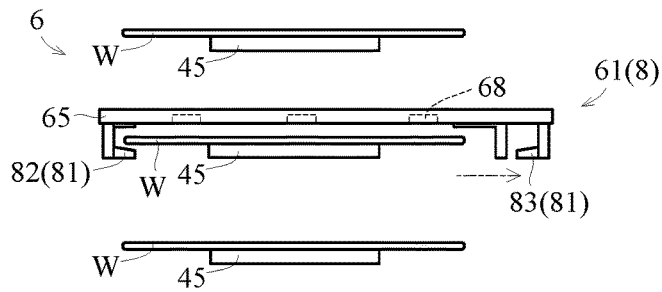
FIG. 39A to FIG. 39D are each another diagram schematically showing an exemplary operation in which the transport mechanism places a substrate in a shelf of the mount table.

Reference is made to FIG. 39A. The receiver driving unit 86 moves the second receiver 83 from the drop-preventing position to the retreating position. This causes the second receiver 83 to move to a position where the second receiver 83 does not overlap the substrate W supported by the shelf 45 in a plan view. The first receiver 82 still overlaps the substrate W supported by the shelf 45 in plan view.

Figure 39B:
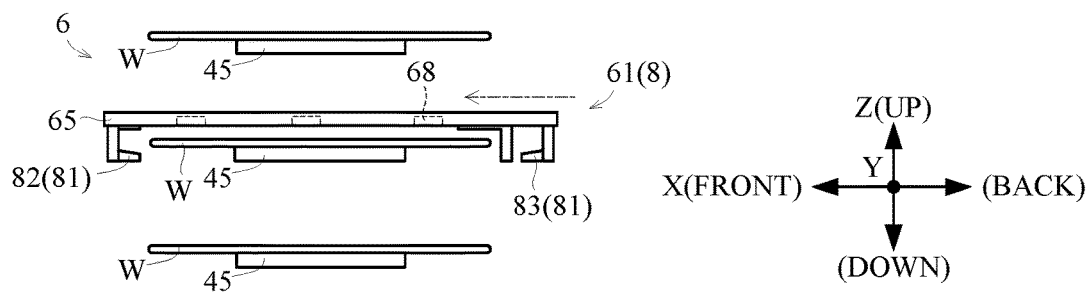

Reference is made to FIG. 39B. The hand 61 moves slightly in the horizontal direction. This causes both the first receiver 82 and the second receiver 83 not to overlap the substrate W supported by the shelf 45 in a plan view. From this procedure, the hand 61 moves at the second speed VB2 and the second acceleration AB2.

Figure 39C:
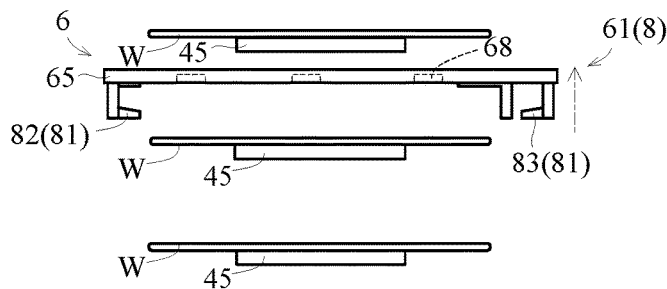

Reference is made to FIG. 39C. The hand 61 moves upward. The first receiver 82 and the second receiver 83 pass laterally of the substrate W supported by the shelf 45, and move to positions higher than the substrate W supported by the shelf 45.

Figure 39D:
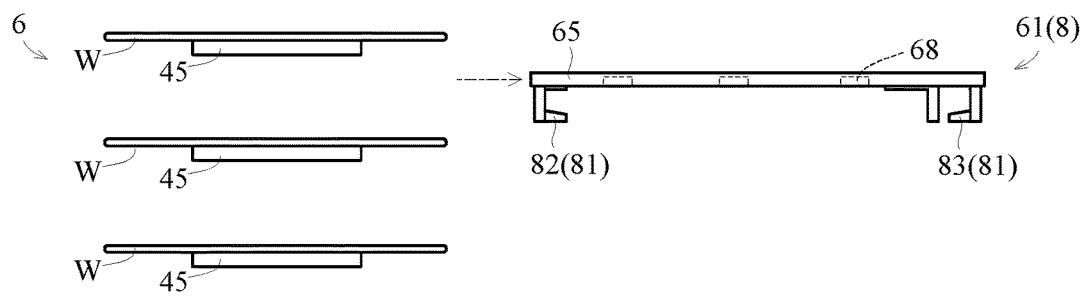

Reference is made to FIG. 39D. The hand 61 retreats and exits the mount table 6 while not supporting the substrate W.

Exemplary Operation of First Treating Unit 7A

Figure 40:
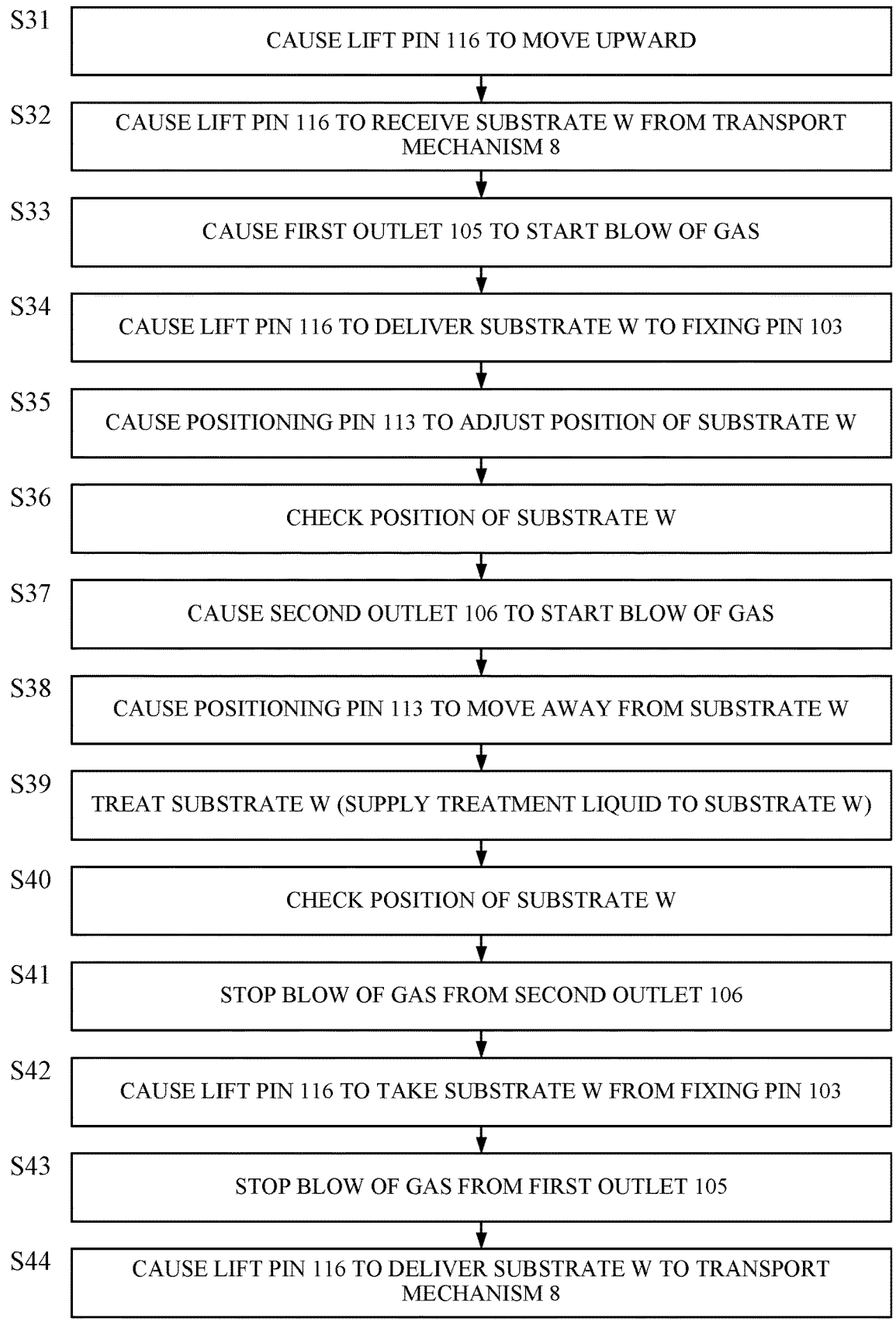
FIG. 40 is a flowchart showing procedures of an exemplary operation of the first treating unit.
Figure 41:
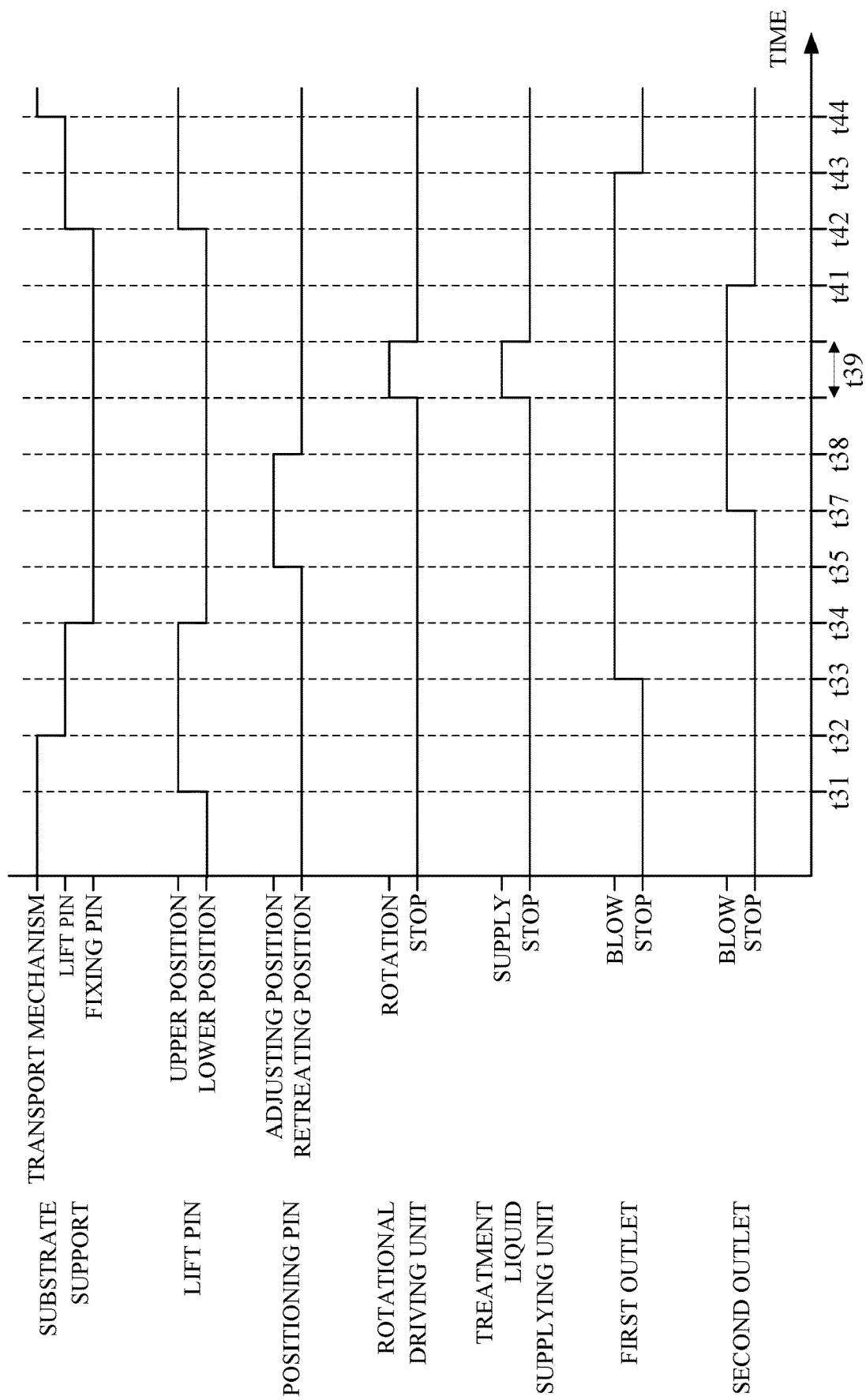
FIG. 41 is a timing chart showing an exemplary operation of the first treating unit.

FIG. 40 is a flowchart showing procedures of an exemplary operation of the first treating unit 7A. FIG. 41 is a timing chart showing an exemplary operation of the first treating unit 7A. The numeral number "t31" shown in FIG. 41 corresponds to the time at which step S31 shown in FIG. 40 is performed. Likewise, the numeral numbers t32 to t35, t37 to t39, and t41 to t44 shown in FIG. 41 correspond to the times at which the steps S32 to S35, S37 to S39, and S41 to S44 shown in FIG. 40 are performed, respectively. The operation of the elements described below is controlled by the controller 9. Exemplary operations described below partially overlap with the exemplary operations of the transport mechanism 8 described above.

Step S31 (time t31): Cause Lift Pin 116 to Move Upward

The lift pins 116 move to the upper position.

Step S32 (time t32): Cause Lift Pin 116 to Receive Substrate W from Transport Mechanism 8

The transport mechanism 8 delivers the substrate W to the lift pins 116. More specifically, the transport mechanism 8 delivers one first substrate W1 to the lift pins 116. The lift pins 116 receive the substrate W from the transport mechanism 8. The lift pins 116 support the substrate W in the upper position. The substrate W is located above the fixing pins 103. The substrate W does not contact the fixing pins 103.

Step S33 (time t33): Cause First Outlet 105 to Start Blow of Gas

The first blowout adjusting unit 111 starts supply of gas to the first outlet 105. The first outlet 105 starts blow of gas. The first outlet 105 blows gas upward. The second blowout adjusting unit 112 does not start supply of gas to the second outlets 106. The second outlets 106 do not blow out any gas.

Step S34 (time t34): Cause Lift Pin 116 to deliver Substrate W to Fixing Pin 103

The lift pins 116 move from the upper position to the lower position. This causes the lift pins 116 to move the substrate W downward from a position higher than the fixing pins 103. The lift pins 116 deliver the substrate W to the fixing pins 103. The fixing pins 103 receive the substrate W from the lift pins 116. The fixing pins 103 support the substrate W. The lift pins 116 move away from the substrate W supported by the fixing pins 103.

Step S35 (time t35): Cause Positioning Pin 113 to Adjust Position of Substrate W The positioning pins 113 move from the retreating position to the adjusting position. This causes the positioning pins 113 to contact the substrate W supported by the fixing pins 103. The positioning pins 113 adjust the position of the substrate W in the horizontal direction.

Step S36: Check Position of Substrate W

It is checked whether the substrate W is located at a predetermined position. Specifically, the substrate detector 127 detects the substrate W. The substrate detector 127 outputs the detected result of the substrate detector 127 to the controller 9. The controller 9 determines whether the substrate W is located at the predetermined position. If the controller 9 determines that the substrate W is located at the predetermined position, the process proceeds to step S37. If the controller 9 determines that the substrate W is not located at the predetermined position, the process does not proceed to step S37, but an abnormality process is performed. The abnormality process includes, for example, returning to step S35. The abnormality process includes, for example, informing a user that an abnormality has occurred.

Step S37 (time t36): Cause Second Outlet 106 to Start Blow of Gas

The second blowout adjusting unit 112 starts supply of gas to the second outlets 106. The second outlets 106 start blow of gas. The second outlets 106 blow gas upward. The flow rate of the gas blown through the second outlets 106 is larger than the flow rate of the gas blown through the first outlet 105.

Step S38 (time t38): Cause Positioning Pin 113 to Move away from Substrate

The positioning pins 113 move from the adjusting position to the retreating position. This causes the positioning pins 113 to move away from the substrate W.

Step S39 (time t39): Treat Substrate W (Supply Treatment Liquid to Substrate W)

The first rotational driving unit 92A rotates the first substrate holder 91A and the substrate W. The treatment liquid supplying unit 121 supplies a treatment liquid to the substrate W supported by the fixing pins 103. Even when the treatment liquid supplying unit 121 supplies the treatment liquid to the substrate W, the first outlet 105 blows gas, and the second outlets 106 blow gas at a flow rate larger than the first outlet 105.

After a specified period of time elapses, the substrate treatment is finished. Then, the process proceeds to step S40.

Step S40: Check Position of Substrate W

It is again checked whether the substrate W is located at a predetermined position. This step S40 is substantially the same as step S36.

Step S41 (time t41): Stop Blow of Gas from Second Outlet 106

The second blowout adjusting unit 112 stops supply of gas to the second outlet 106. The second outlets 106 stop blow of gas.

Step S42 (time t42): Cause Lift Pin 116 to Take Substrate W from Fixing Pin 103

The lift pins 116 move from the lower position to the upper position. This causes the lift pins 116 to take the substrate W from the fixing pins 103. The lift pins 116 support the substrate W. The lift pins 116 move the substrate W upward. Specifically, the lift pins 116 move the substrate W upward to a position higher than the fixing pins 103. The substrate W moves away from the fixing pins 103. The lift pins 116 support the substrate W in the upper position. The substrate W is supported at a position higher than the fixing pins 103.

Step S43 (time t43): Stop Blow of Gas from First Outlet 105

The first blowout adjusting unit 111 stops supply of gas to the first outlet 105. The first outlet 105 stops blow of gas.

Step S44 (time t44): Cause Lift Pin 116 to Deliver Substrate W to Transport Mechanism 8

The transport mechanism 8 takes the substrate W from the lift pins 116. Thereafter, the transport mechanism 8 transports the substrate W to the outside of the first treating unit 7A.

Exemplary Operation of Second Treating Unit 7B

The exemplary operation of the second treating unit 7B is similar to the exemplary operation of the first treating unit 7A with steps S33, S35 to S38, and S40 to S41 omitted. The following briefly describes exemplary operation of the second treating unit 7B.

The lift pins 116 move to the upper position. The lift pins 116 receive one the substrate W (specifically, a second substrate W2 or a third substrate W3) from the transport mechanism 8. The lift pins 116 deliver the substrate W to the back face contact pins 135. The back face contact pins 135 support the substrate W. The edge contact pin 133 contacts the edge 20 of the substrate W supported by the back face contact pin 135. This causes the edge contact pins 133 to hold the substrate W.

The substrate W is treated while being held by the edge contact pins 133. Specifically, the second rotational driving unit 92B rotates the second substrate holder 91B and the substrate W. When the second rotational driving unit 92B rotates the second substrate holder 91B, the edge contact pins 133 hold the edge 20 of the substrate W in such a manner that the substrate W does not slip with respect to the edge contact pins 133. The treatment liquid supplying unit 121 supplies a treatment liquid to the substrate W supported by edge contact pins 133.

When the treatment to the substrate W is finished, the edge contact pins 133 move away from the substrate W. The lift pins 116 take the substrate W from the back face contact pins 135. The transport mechanism 8 takes the substrate W from the lift pins 116.

Advantageous Effect of Embodiments

The substrate treating apparatus 1 includes the carrier platform 3 configured to place a carrier C thereon. The carrier includes the shelves 22 arranged in the up-down direction Z. The shelves 22 are each configured to place one substrate thereon in a horizontal posture. The substrate treating apparatus 1 further includes the transport mechanism 4 and the controller 9. The transport mechanism 4 is configured to transport a substrate W to a carrier C placed on the carrier platform 3. The transport mechanism 4 includes the hand 33 configured to support a substrate W and the hand driving unit 34 configured to move the hand 33. The controller 9 controls the transport mechanism 4. The controller 9 changes the height position HA of the hand 33 when the hand 33 is inserted between two of the shelves 22 adjacent to each other in the up-down direction Z, depending on the shape of the substrate W. Specifically, the controller 9 changes the height position HA of the hand 33 when the hand 33 is inserted between two of the shelves 22 adjacent to each other in the up-down direction Z, depending on at least either a shape of the substrate W taken from one of the shelves 22 by the transport mechanism 4 or a shape of the substrate W placed on one of the shelves 22 by the transport mechanism 4. Accordingly, the hand 33 can enter between two of the shelves 22 adjacent to each other in the up-down direction Z suitably regardless of the shape of the substrate W. For instance, the hand 33 can enter between two of the shelves 22 adjacent to each other in the up-down direction Z without interfering with the substrates W placed on the shelves 22. For instance, the hand 33 can enter between two of the shelves 22 adjacent to each other in the up-down direction Z while the substrates W supported by the hand 33 do not interfere with the shelves 22 or the substrates W placed on the shelves 22. Accordingly, the transport mechanism 4 can transport a substrate W suitably to a carrier C placed on the carrier platform 3.

As described above, the substrate treating apparatus 1 can transport the substrate W suitably.

The substrate treating apparatus 1 includes the mount table 6. The mount table 6 includes the shelves 45 arranged in the up-down direction Z. The shelves are each configured to place one substrate thereon in a horizontal posture. The transport mechanism 4 transports substrates W to the mount table 6. The controller 9 changes the height position HB of the hand 33 when the hand 33 is inserted between two of the shelves 45 adjacent to each other in the up-down direction Z, depending on a shape of the substrate W taken from one of the shelves 45 by the transport mechanism 4 or a shape of the substrate W placed on one of the shelves by the transport mechanism 4. Accordingly, the hand 33 can enter between two of the shelves 45 adjacent to each other in the up-down direction Z suitably regardless of the shape of the substrate W. Consequently, the transport mechanism 4 can transport the substrate W to the mount table 6 suitably.

The substrate treating apparatus 1 includes the transport mechanism 8. The transport mechanism 8 transports substrates W to the mount table 6. The transport mechanism 8 includes the hand 61 configured to support a substrate W and the hand driving unit 62 configured to move the hand 61. The controller 9 controls the transport mechanism 8. The controller 9 changes the height position HC of the hand 61 when the hand 61 is inserted between two of the shelves 45 adjacent to each other in the up-down direction Z, depending on the shape of the substrate W. Specifically, the controller 9 changes the height position HC of the hand 61 when the hand 61 is inserted between two of the shelves 45 adjacent to each other in the up-down direction Z, depending on at least either a shape of the substrate W taken from one of the shelves 45 by the transport mechanism 8 or a shape of the substrate W placed on one of the shelves 45 by the transport mechanism 8. Accordingly, the hand 61 can enter between two of the shelves 45 adjacent to each other in the up-down direction Z suitably regardless of the shape of the substrate W. Consequently, the transport mechanism 8 can transport the substrate W to the mount table 6 suitably.

The controller 9 changes the height position HA in accordance with the thickness of the main portion 13 of the substrate W. Accordingly, the hand 33 can enter between two of the shelves 22 adjacent to each other in the up-down direction Z suitably regardless of the thickness of the main portion 13 of the substrate W. Consequently, the transport mechanism 4 can transport the substrate W to the carrier C suitably.

The controller 9 changes the height position HB in accordance with the thickness of the main portion 13 of the substrate W. Accordingly, the hand 33 can enter between two of the shelves 45 adjacent to each other in the up-down direction Z suitably regardless of the thickness of the main portion 13 of the substrate W. Consequently, the transport mechanism 4 can transport the substrate W to the mount table 6 suitably.

The controller 9 changes the height position HC in accordance with the thickness of the main portion 13 of the substrate W. Accordingly, the hand 61 can enter between two of the shelves 45 adjacent to each other in the up-down direction Z suitably regardless of the thickness of the main portion 13 of the substrate W. Consequently, the transport mechanism 8 can transport the substrate W to the mount table 6 suitably.

The substrates W include first substrates W1 and second substrates W2. When the substrate W taken from or placed on one of the shelves 22 by the transport mechanism 4 is a first substrate W1, the hand 33 enters between two of the shelves 22 adjacent to each other in the up-down direction Z at the first height position HA1. When the substrate W taken from or placed on one of the shelves 22 by the transport mechanism 4 is a second substrate W2, the hand 33 enters between two of the shelves 22 adjacent to each other in the up-down direction Z at the second height position HA2 higher than the first height position HA1. The first height position HA1 is lower than the second height position HA2. Accordingly, when the substrate W taken from or placed on one of the shelves 22 by the transport mechanism 4 is a first substrate W1, the hand 33 can suitably enter between two of the shelves 22 adjacent to each other in the up-down direction Z. The second height position HA2 is higher than the first height position HA1. Accordingly, when the substrate W taken from or placed on one of the shelves 22 by the transport mechanism 4 is a second substrate W2, the hand 33 can suitably enter between two of the shelves 22 adjacent to each other in the up-down direction Z.

When the substrate W taken from or placed on one of the shelves 45 by the transport mechanism 4 is a first substrate W1, the hand 33 enters between two of the shelves 45 adjacent to each other in the up-down direction Z at the first height position HB1. When the substrate W taken from or placed on one of the shelves 45 by the transport mechanism 4 is a second substrate W2, the hand 33 enters between two of the shelves 45 adjacent to each other in the up-down direction Z at the second height position HB2 higher than the first height position HB1. The first height position HB1 is lower than the second height position HB2. Accordingly, when the substrate W taken from or placed on one of the shelves 45 by the transport mechanism 4 is a first substrate W1, the hand 33 can suitably enter between two of the shelves 45 adjacent to each other in the up-down direction Z. The second height position HB2 is higher than the first height position HB1. Accordingly, when the substrate W taken from or placed on one of the shelves 45 by the transport mechanism 4 is a second substrate W2, the hand 33 can suitably enter between two of the shelves 45 adjacent to each other in the up-down direction Z.

When the substrate W taken from or placed on one of the shelves 45 by the transport mechanism 8 is a first substrate W1, the hand 61 enters between two of the shelves 45 adjacent to each other in the up-down direction Z at the first height position HC1. When the substrate W taken from or placed on one of the shelves 45 by the transport mechanism 8 is a second substrate W2, the hand 61 enters between two of the shelves 45 adjacent to each other in the up-down direction Z at the second height position HC2 higher than the first height position HC1. The first height position HC1 is lower than the second height position HC2. Accordingly, when the substrate W taken from or placed on one of the shelves 45 by the transport mechanism 8 is a first substrate W1, the hand 61 can suitably enter between two of the shelves 45 adjacent to each other in the up-down direction Z. The second height position HC2 is higher than the first height position HC1. Accordingly, when the substrate W taken from or placed on one of the shelves 45 by the transport mechanism 8 is a second substrate W2, the hand 61 can suitably enter between two of the shelves 45 adjacent to each other in the up-down direction Z.

The substrates W include first substrates W1 and third substrates W3. When the substrate W taken from or placed on one of the shelves 22 by the transport mechanism 4 is a third substrate W3, the hand 33 enters between two of the shelves 22 adjacent to each other in the up-down direction Z at the third height position HA3 higher than the first height position HA1. The first height position HA1 is lower than the third height position HA3. Accordingly, when the substrate W taken from or placed on one of the shelves 22 by the transport mechanism 4 is a first substrate W1, the hand 33 can suitably enter between two of the shelves 22 adjacent to each other in the up-down direction Z. The third height position HA3 is higher than the first height position HA1. Accordingly, when the substrate W taken from or placed on one of the shelves 22 by the transport mechanism 4 is a third substrate W3, the hand 33 can suitably enter between two of the shelves 22 adjacent to each other in the up-down direction Z.

When the substrate W taken from or placed on one of the shelves 45 by the transport mechanism 4 is a third substrate W3, the hand 33 enters between two of the shelves 45 adjacent to each other in the up-down direction Z at the third height position HB3 higher than the first height position HB1. The first height position HB1 is lower than the third height position HB3. Accordingly, when the substrate W taken from or placed on one of the shelves 45 by the transport mechanism 4 is a first substrate W1, the hand 33 can suitably enter between two of the shelves 45 adjacent to each other in the up-down direction Z. The third height position HB3 is higher than the first height position HB1. Accordingly, when the substrate W taken from or placed on one of the shelves 45 by the transport mechanism 4 is a third substrate W3, the hand 33 can suitably enter between two of the shelves 45 adjacent to each other in the up-down direction Z.

When the substrate W taken from or placed on one of the shelves 45 by the transport mechanism 8 is a third substrate W3, the hand 61 enters between two of the shelves 45 adjacent to each other in the up-down direction Z at the third height position HC3 higher than the first height position HC1. The first height position HC1 is lower than the third height position HC3. Accordingly, when the substrate W taken from or placed on one of the shelves 45 by the transport mechanism 8 is a first substrate W1, the hand 61 can suitably enter between two of the shelves 45 adjacent to each other in the up-down direction Z. The third height position HC3 is higher than the first height position HC1. Accordingly, when the substrate W taken from or placed on one of the shelves 45 by the transport mechanism 8 is a third substrate W3, the hand 61 can suitably enter between two of the shelves 45 adjacent to each other in the up-down direction Z.

The controller 9 changes the insertion amount KA of the hand 33 when the hand 33 is inserted between two of the shelves 22 adjacent to each other in the up-down direction Z, depending on a shape of the substrate W taken from one of the shelves 22 by the transport mechanism 4 or a shape of the substrate W placed on one of the shelves 22 by the transport mechanism 4. Accordingly, regardless of the shape of the substrate W, the hand 33 can take the substrate W from one of the shelves 22 at an appropriate position, and the hand 33 can place the substrate W on one of the shelves 22 at an appropriate position.

The controller 9 changes the insertion amount KB of the hand 33 when the hand 33 is inserted between two of the shelves 45 adjacent to each other in the up-down direction Z, depending on the shape of the substrate W taken from or placed on one of the shelves 45 by the transport mechanism 4. Accordingly, regardless of the shape of the substrate W, the hand 33 can take the substrate W from one of the shelves 45 at an appropriate position, and the hand 33 can place the substrate W on one of the shelves 45 at an appropriate position.

The controller 9 changes the insertion amount KC of the hand 61 when the hand 61 is inserted between two of the shelves 45 adjacent to each other in the up-down direction Z, depending on the shape of the substrate W taken from or placed on one of the shelves 45 by the transport mechanism 8. Accordingly, regardless of the shape of the substrate W, the hand 61 can take the substrate W from one of the shelves 45 at an appropriate position, and the hand 61 can place the substrate W on one of the shelves 45 at an appropriate position.

The substrates W include normal diameter substrates WN and large diameter substrates WL. When the substrate W taken from or placed on one of the shelves 22 by the transport mechanism 4 is a normal diameter substrate WN, the insertion amount KA corresponds to a first insertion amount KA1. When the substrate W taken from or placed on one of the shelves 22 by the transport mechanism 4 is a large diameter substrate WL, the insertion amount KA corresponds to a second insertion amount KA2 larger than the first insertion amount KA1. Accordingly, regardless of the diameter D of the substrate W, the hand 33 can take the substrate W from one of the shelves 22 at an appropriate position, and the hand 33 can place the substrate W on one of the shelves 22 at an appropriate position.

When the substrate W taken from or placed on one of the shelves 45 by the transport mechanism 4 is a normal diameter substrate WN, the insertion amount KB corresponds to a first insertion amount KB1. When the substrate W taken from or placed on one of the shelves 45 by the transport mechanism 4 is a large diameter substrate WL, the insertion amount KB corresponds to a second insertion amount KB2 larger than the first insertion amount KB1. Accordingly, regardless of the diameter D of the substrate W, the hand 33 can take the substrate W from one of the shelves 45 at an appropriate position, and the hand 33 can place the substrate W on one of the shelves 45 at an appropriate position.

When the substrate W taken from or placed on one of the shelves 45 by the transport mechanism 8 is a normal diameter substrate WN, the insertion amount KC corresponds to a first insertion amount KC1. When the substrate W taken from or placed on one of the shelves 45 by the transport mechanism 8 is a large diameter substrate WL, the insertion amount KC corresponds to a second insertion amount KC2 larger than the first insertion amount KC1. Accordingly, regardless of the diameter D of the substrate W, the hand 61 can take the substrate W from one of the shelves 45 at an appropriate position, and the hand 61 can place the substrate W on one of the shelves 45 at an appropriate position.

The hand 33 supports the substrate W by contacting a back face 16 of the substrate W. Even when the hand 33 supports the substrate W in such a manner as above, the hand 33 can place the substrate W on one of the shelves 22, 45 suitably and can take the substrate W from one of the shelves 22, 45 suitably.

The hand 33 includes two rods 36 configured to support the substrate W. The two rods 36 are arranged in the first direction F1. Each of the rods 36 has the length equal to or larger than the diameter D of the substrate W. Each of the rods 36 has a cross-sectional shape which is substantially uniform along the first direction F1. When the hand 33 enters between two of the shelves 22, 45 adjacent to each other in the up-down direction Z, the hand 33 moves along the first direction F1. Accordingly, even if the space between two of the shelves 22, 45 adjacent to each other in the up-down direction Z is small, the rods 36 can enter between the two of the shelves 22, 45 adjacent to each other in the up-down direction Z suitably.

The hand 61 includes a suction portion 68. The suction portion 68 flows gas over the top face 17 of the substrate W. The suction portion 68 sucks the substrate W without contacting the substrate W. Accordingly, the hand 61 can support the substrate W suitably.

The shelves 22 each include a first shelf 23 configured to receive a first side portion 18 of the substrate W and a second shelf 24 configured to receive a second side portion 19 of the substrate W. Even when the shelves 22 support the substrates in such a manner as above, the transport mechanism 4 can transport the substrates W to the carriers C suitably.

The shelves 45 each include a first shelf 46 configured to receive a first side portion 18 of the substrate W and a second shelf 47 configured to receive a second side portion 19 of the substrate W. Even when the shelves 45 support the substrates in such a manner as above, the transport mechanism 4 can transport the substrates W to the mount table 6 suitably. Even when the shelves 45 support the substrates in such a manner as above, the transport mechanism 8 can transport the substrates W to the mount table 6 suitably.

This invention is not limited to the foregoing examples, but may be modified as follows.

In the embodiments described above, the shelves 22 contact the back face 16 of the substrate W. However, this is not limitative. For instance, the shelves 22 may contact at least either the back face 16 of the substrate W or the edge 20 of the substrate W. For instance, the shelves 22 may contact the edge 20 of the substrate W from diagonally below.

In the embodiments described above, the hand 33 contacts the back face 16 of the substrate W. However, this is not limitative. For instance, the hand 33 may contact at least either the back face 16 of the substrate W or the edge 20 of the substrate W. For instance, the hand 33 may contact the edge 20 of the substrate W from diagonally below.

In the embodiments described above, the shelves 45 contact the back face 16 of the substrate W. However, this is not limitative. For instance, the shelves 45 may contact at least either the back face 16 of the substrate W or the edge 20 of the substrate W. For instance, the shelves 45 may contact the edge 20 of the substrate W from diagonally below.

In the embodiments described above, the contact portion 74 contacts the top face 17 of a substrate W. However, this is not limitative. For instance, the contact portion 74 may contact at least either the top face 17 of the substrate W or the edge of the substrate W. For instance, the contact portion 74 may contact the edge 20 of the substrate W from diagonally above.

In the embodiments described above, the first receiver 82 can receive the back face 16 of the substrate W. However, this is not limitative. For instance, the first receiver 82 may receive at least either the back face 16 of the substrate W or the edge 20 of the substrate W. For instance, the first receiver 82 may receive the edge 20 of the substrate W from diagonally below.

In the embodiments described above, the second receiver 83 can receive the back face 16 of the substrate W. However, this is not limitative. For instance, the second receiver 83 may receive at least either the back face 16 of the substrate W or the edge 20 of the substrate W. For instance, the second receiver 83 may receive the edge 20 of the substrate W from diagonally below.

In the embodiments described above, the fixing pins 103 contact the back face 16 of the substrate W. However, this is not limitative. For instance, the fixing pins 103 may contact at least either the back face 16 of the substrate W or the edge of the substrate W. For instance, the fixing pins 103 may contact the edge 20 of the substrate W from diagonally below.

In the embodiments described above, the first receivers 82 are fixed to the base 65. However, this is not limitative. That is, the first receivers 82 may be movable with respect to the base 65. In this modification, the hand 61 may also include a driving unit (second receiver driving unit) for moving the first receiver 82 with respect to the base 65.

In the embodiments described above, the suction portion 68 flows gas over the top face 17 of the substrate W. The suction portion 68 sucks the substrate W upward. However, this is not limitative. The suction portion 68 may flow gas over the back face 16 of the substrate W. The suction portion 68 may suck the substrate W downward.

In the embodiments described above, the hand 33 of the transport mechanism 4 does not include any suction portion. However, this is not limitative. The hand 33 of the transport mechanism 4 may include a suction portion configured to flow gas over the first face of the substrate W. Here, the first face is either the top face of the substrate W or the back face of the substrate W. The hand 33 of the transport mechanism 4 may include a suction portion configured to suck the substrate W. The transport mechanism 4 may further include a receiver to prevent the substrate W from falling off the hand 33.

When the hand 33 of the transport mechanism 4 includes a suction portion, the transport mechanism 4 also corresponds to an example of the first transport mechanism of the present invention. The carrier C is one example of either the first position or the second position in the present invention. The mount table 6 is the other example of either the first position or the second position in the present invention.

In the embodiments described above, the controller 9 changes the height positions HA, HB, and HC depending on which of a first substrate W1, a second substrate W2, or a third substrate W3 corresponds to the substrate W. However, this is not limitative. For instance, the controller 9 may change the height positions HA, HB, and HC depending on the thickness of the main portion 13 of the substrate W. For instance, the controller 9 may increase the height positions HA, HB, and HC as the main portion 13 of the substrate W becomes thicker.

In the embodiments described above, the controller 9 determines the treating unit 7 to treat the substrate W from either the first treating unit 7A or the second treating unit 7B depending on which of a first substrate W1, a second substrate W2 or a third substrate W3 corresponds to the substrate W. However, this is not limitative. For instance, the controller 9 may determine the treating unit 7 to treat the substrate W from either a first treating unit 7A or a second treating unit 7B depending on the thickness of the main portion 13 of the substrate W. For instance, the controller 9 may transport the substrate W with the main portion 13 having a first thickness to the first treating unit 7A. For instance, the controller 9 may transport the substrate W with the main portion 13 having a second thickness larger than the first thickness, to the second treating unit 7B. For instance, the controller 9 may cause the first treating unit 7A to treat the substrate W with the main portion 13 having the first thickness. The controller 9 may cause the second treating unit 7B to treat the substrate W with the main portion 13 having the second thickness larger than the first thickness.

In the embodiments described above, the controller 9 changes the flow rate M depending on which of a first substrate W1, a second substrate W2, or a third substrate W3 corresponds to the substrate W. However, this is not limitative. For instance, the controller 9 may change the flow rate M depending on the thickness of the main portion 13 of the substrate W. For instance, the controller 9 may increase the flow rate M as the main portion 13 of the substrate W becomes thicker.

In the embodiments described above, the moving speed VA may be further subdivided. For instance, the moving speed VA may be divided into a horizontal moving speed VAH, a vertical moving speed VAZ, and a rotational speed VAR. Here, the horizontal moving speed VAH corresponds to a moving speed of the hand 33 in the horizontal direction. The vertical moving speed VAZ corresponds to a moving speed of the hand 33 in the up-down direction Z. The rotational speed VAR corresponds to a moving speed of the hand 33 which rotates around the rotation axis A1. In step S13, the controller 9 may determine the horizontal moving speed VAH, the vertical moving speed VAZ, and the rotational speed VAR individually.

In the embodiments described above, the acceleration AA may be further subdivided. For instance, the acceleration AA may be divided into a horizontal acceleration AAH, a vertical acceleration AAZ, and a rotational acceleration AAR. Here, the horizontal acceleration AAH corresponds to an acceleration of the hand 33 in the horizontal direction. The vertical acceleration AAZ corresponds to an acceleration of the hand 33 in the up-down direction Z. The rotational acceleration AAR corresponds to an acceleration of the hand 33 that rotates around the rotation axis A1. In step S13, the controller 9 may determine the horizontal acceleration AAH, the vertical acceleration AAZ, and the rotational acceleration AAR individually.

In the embodiments described above, the moving speed VB may be further subdivided. For instance, the moving speed VB may be divided into a horizontal moving speed VBH, a vertical moving speed VBZ, and a rotational speed VBR. Here, the horizontal moving speed VBH corresponds to a moving speed of the hand 61 in the horizontal direction. The vertical moving speed VBZ corresponds to a moving speed of the hand 61 in the up-down direction Z. The rotational speed VBR corresponds to a moving speed of the hand 61 which rotates around the rotation axis A2. In step S25, the controller 9 may determine the horizontal moving speed VBH, the vertical moving speed VBZ, and the rotational speed VBR individually.

In the embodiments described above, the acceleration AB may be further subdivided. For instance, the acceleration AB may be divided into a horizontal acceleration ABH, a vertical acceleration ABZ, and a rotating acceleration ABR. Here, the horizontal acceleration ABH corresponds to an acceleration of the hand 61 in the horizontal direction. The vertical acceleration ABZ corresponds to an acceleration of the hand 61 in the up-down direction Z. The rotational acceleration ABR corresponds to an acceleration of the hand 61 which rotates around the rotation axis A2. In step S25, the controller 9 may determine the horizontal acceleration ABH, the vertical acceleration ABZ, and the rotational acceleration ABR individually.

In the embodiments described above, one first outlet 105 is formed in the first plate 101. However, this is not limitative. Two or more first outlets 105 may be formed in the first plate 101.

In the embodiments described above, the lift pins 116 receive the substrate W from the transport mechanism 8 (step S32), then the first outlet 105 starts blowing gas (step S33). However, this is not limitative. For instance, the first outlet 105 may start blowing gas before the lift pins 116 receive the substrate W from the transport mechanism 8.

With this modification, the lift pins 116 can receive the substrate W from the transport mechanism 8 while the first outlet 105 blows gas.

In the above-described embodiment, the first outlet 105 stops blowing gas (step S43), then the lift pins 116 deliver the substrate W to the transport mechanism 8 (step S44). However, this is not limitative. For instance, the first outlet 105 may stop blowing gas after the lift pins 116 delivers the substrate W to the transport mechanism 8. With this modification, the lift pins 116 can deliver the substrate W to the transport mechanism 8 while the first outlet 105 blows gas.

In the present modifications, it is preferred that the flow rate of the gas blown through the first outlet 105 is smaller than the flow rate of the gas supplied to the suction portion 68 of the transport mechanism 8. This achieves easy suction of the substrate W by the suction portion 68 when the transport mechanism 8 takes the substrate W from the lift pins 116. In other words, when the transport mechanism 8 takes the substrate W from the lift pins 116, the hand 61 can easily hold the substrate W.

In the embodiments described above, the lift pins 116 receive the substrate W from the transport mechanism 8. However, this is not limitative. The fixing pins 103 may receive the substrate W from the transport mechanism 8. In other words, the transport mechanism 8 may deliver the substrate W directly to the fixing pins 103 without using the lift pins 116.

In the embodiments described above, the lift pins 116 deliver the substrate W to the transport mechanism 8. However, this is not limitative. The fixing pins 103 may deliver the substrate W to the transport mechanism 8. In other words, the transport mechanism 8 may take the substrate W directly from the fixing pins 103 without using the lift pins 116.

In the embodiments described above, the first outlet 105 of the first treating unit 7A may dispense deionized water in addition to gas.

Figure 42:
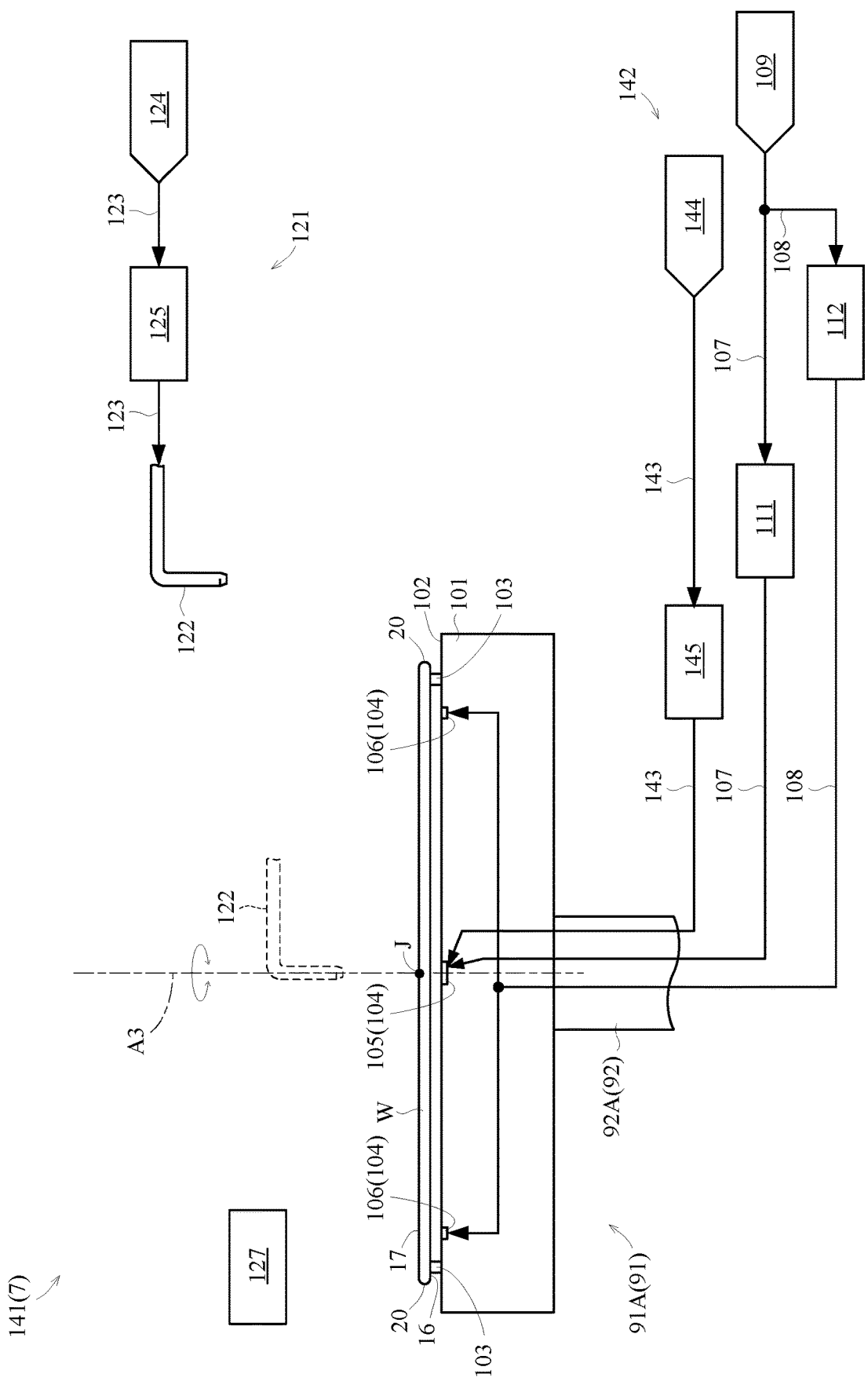
FIG. 42 is a diagram schematically showing the first treating unit in one modification.

FIG. 42 is a diagram schematically showing a first treating unit 141 in another modification. Like numerals are used to identify like components which are the same as that of the first treating unit 7A in the embodiments, and the components will not particularly be described.

In the modified embodiment, the first treating unit 141 includes a deionized water supplying unit 142. The deionized water supplying unit 142 dispenses deionized water to the substrate W through the first outlet 105.

The deionized water supplying unit 142 includes a pipe 143. The pipe 143 supplies deionized water to the first outlet 105. The pipe 143 has a first end and a second end. The first end of the pipe 143 is connected to a deionized water supply source 144. The second end of the pipe 143 is connected to the first outlet 105.

The first treating unit 141 includes a flow rate adjusting unit 145. The flow rate adjusting unit 145 is provided in the pipe 143. The flow rate adjusting unit 145 adjusts a flow rate of deionized water supplied to the substrate W by the deionized water supplying unit 142. That is, the flow rate adjusting unit 145 adjusts a flow rate of the deionized water dispensed through the first outlet 105. The flow rate adjusting unit 145 is controlled by the controller 9.

The first outlet 105 may discharge gas and deionized water simultaneously. Alternatively, the first outlet 105 may discharge deionized water without blowing gas. This causes deionized water, discharged from the first outlet 105 to contact against the back face 16 in the central portion of the substrate W, achieving more suitable prevention of the back face 16 in the central portion of the substrate W from bending downward. Accordingly, the substrate W can be more suitably prevented from contacting the top face 102 of the first plate 101.

When the treatment liquid is supplied to the substrate W (step S39), the first outlet 105 may discharge gas and deionized water simultaneously. Alternatively, when the treatment liquid is supplied to the substrate W (step S39), the first outlet 105 may discharge deionized water without blowing gas. This achieves prevention of the substrate W from contacting the top face 102 of the first plate 101 more suitably when the treatment liquid supplying unit 121 supplies the treatment liquid to the substrate W.

In the present modifications, it is preferred that the space between the top face 102 of the first plate 101 and the back face 16 of the substrate W supported by the fixing pins 103 is not filled with deionized water (not liquid-tight). Such is performed in order to cause gas to flow through the space between the top face 102 of the first plate 101 and the back face 16 of the substrate W supported by the fixing pins 103, and to cause an appropriate suction force to act on the substrate W supported by the fixing pins 103.

In the embodiments described above, the first outlet 105 may discharge the treatment liquid in addition to gas. The treatment liquid supplying unit 121 may dispense the treatment liquid to the substrate W through the first outlet 105.

Figure 43:
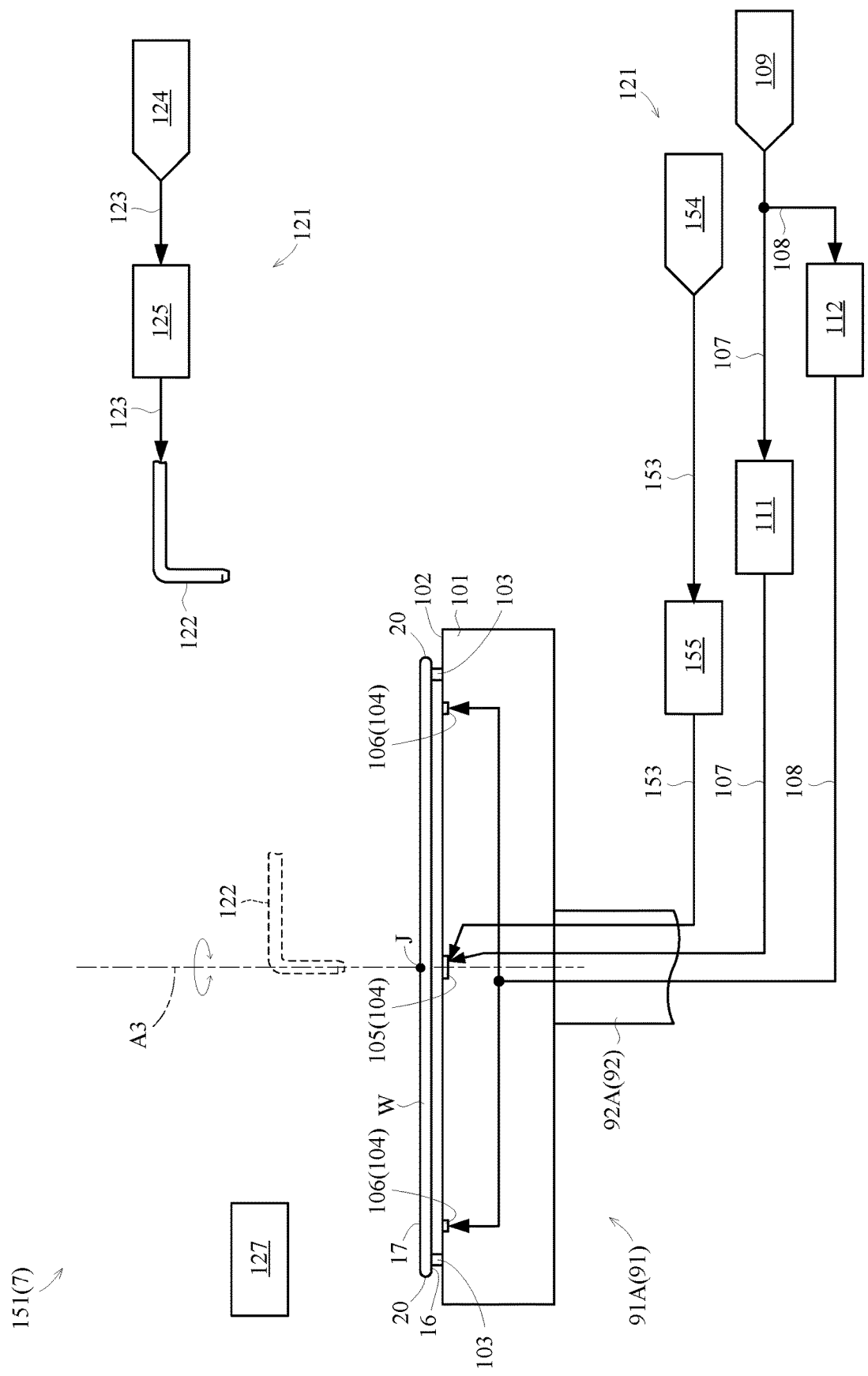
FIG. 43 is a diagram schematically showing the first treating unit in another modification.

FIG. 43 is a diagram schematically showing a first treating unit 151 in another modification. Like numerals are used to identify like components which are the same as that of the first treating unit 7A in the embodiments, and the components will not particularly be described.

The treatment liquid supplying unit 121 includes a pipe 153. The pipe 153 supplies the treatment liquid to the first outlet 105. The pipe 153 has a first end and a second end. The first end of the pipe 153 is connected to a treatment liquid supply source 154. The second end of the pipe 153 is connected to the first outlet 105.

The first treating unit 141 includes a flow rate adjusting unit 155. The flow rate adjusting unit 155 is provided in the pipe 153. The flow rate adjusting unit 155 adjusts a flow rate of the treatment liquid supplied by the treatment liquid supplying unit 121 to the substrate W. More specifically, the flow rate adjusting unit 155 adjusts the flow rate of the treatment liquid dispensed through the first outlet 105. The flow rate adjusting unit 155 is controlled by the controller 9.

When the treatment liquid is supplied to the substrate W (step S39), the first outlet 105 may discharge gas and the treatment liquid simultaneously. This achieves supply of the treatment liquid to the back face 16 of the substrate W. Accordingly, the back face 16 of the substrate W can be suitably treated.

In the present modifications, it is preferred that the space between the top face 102 of the first plate 101 and the back face 16 of the substrate W supported by the fixing pins 103 is not filled with the treatment liquid (not liquid-tight). Such is performed in order to apply an appropriate suction force to the substrate W supported by the fixing pins 103.

In the above-described embodiment, the controller 9 obtains the shape of the substrate W in accordance with the detected result of the barcode reader 31. However, this is not limitative. The following exemplifies four examples as modifications in which the controller 9 obtains the shape of the substrate W.

First Example

The substrate treating apparatus 1 may include a substrate information detecting unit configured to read substrate information affixed to the substrate W. The controller 9 may determine the shape of the substrate W in accordance with the detected result of the substrate information detecting unit. Here, substrate information affixed to the substrate W is, for example, an identification code printed on the substrate W. The substrate information detecting unit is, for example, a reader.

Second Example

The substrate treating apparatus 1 may include an imaging unit for imaging the substrate W. The controller 9 may determine the shape of the substrate W in accordance with the detected result of the imaging unit. The imaging unit is, for example, a one-dimensional image sensor or a two-dimensional image sensor.

Third Example

The controller 9 may obtain information about the shape of the substrate W from an external device of the substrate treating apparatus 1. The external device of the substrate treating apparatus 1 is, for example, a host computer. The controller 9 may transmit the detected result of the barcode reader 31 to the external device, for example, before the controller 9 obtains information about the shape of the substrate W from the external device. The controller 9 may transmit the detected result of the substrate detectors 38, 89, and 127 to the external device, for example, before the controller 9 obtains information about the shape of the substrate W from the external device.

Fourth Example

The substrate treating apparatus 1 may include an input unit capable of inputting information about the shape of substrate. The controller 9 may obtain information about the shape of the substrate W received by the input unit.

In the third or fourth example, the information about the shape of the substrate W may be information that directly indicates the shape of the substrate W. The information directly indicating the shape of the substrate W is, for example, information directly indicating which of a first substrate W1, a second substrate W2, and a third substrate W3 corresponds to the substrate W. If the controller 9 obtains information that directly indicates the shape of the substrate W, the controller 9 does not perform step S2 for determining the shape of the substrate W.

In the third or fourth example, the information about the shape of the substrate W may be information that indirectly indicates the shape of the substrate W. If the controller 9 obtains information that indirectly indicates the shape of the substrate W, the controller 9 performs step S2 for determining the shape of the substrate W in accordance with the information that indirectly indicates the shape of the substrate W.

In the embodiments described above, the controller 9 performs step S11 for determining the height positions HA, HB, step S12 for determining the insertion amounts KA, KB, and step S13 for determining the moving speed VA and the acceleration AA. However, this is not limitative. For instance, at least either of steps S11, S12 and S13 may be omitted. For instance, the controller 9 does not need to perform at least either of steps S11, S12 and S13.

In the embodiments described above, the controller 9 performs step S21 for determining the height position HC, step S22 for determining the insertion amount KC, step S23 for determining the flow rate M, step S24 for determining the treating unit 7, and step S25 for determining the moving speed VB and the acceleration AB. However, this is not limitative. For instance, at least either of steps S21, S22, S23, S24 and S25 may be omitted. For instance, the controller 9 does not need to perform at least either of steps S21, S22, S23, S24 and S25.

In the embodiments described above, the configurations of the transport mechanisms 4, 8 are exemplified. However, this is not limitative. For instance, the transport mechanism 4 may include an articulated arm instead of the rotating portion 34*d* and the advancing/retreating portion 34*e*. The articulated arm is supported by the vertical moving portion 34*c*, and supports the hand 33. For instance, the transport mechanism 4 may omit the rail 34*a* and the horizontal moving portion 34*b*, and may include a pedestal or strut. The pedestal or strut is fixedly installed and supports the vertical moving portion 34*c*. For instance, the transport mechanism 8 may include an articulated arm instead of the rotating portion 62*c* and the advancing/retreating portion 62*d*. The articulated arm is supported by the vertical moving portion 62*b*, and supports the hand 61.

In the embodiments described above, one transport mechanism is provided in the treating block 5. However, the invention is not limited to this. Two or more transport mechanisms may be provided in the treating block 5. That is, the treating block 5 may include two or more the transport mechanisms. For instance, a plurality of transport mechanisms may be installed in the transportation space 41 of the treating block 5. For instance, a plurality of transport mechanisms may be arranged to align in the front-back direction X. The number of the treating units 7 may be increased in accordance with the number of the transport mechanisms in the treating block 5. The number of the treating units 7 arranged in the front-back direction X may be changed as appropriate.

The embodiments and the modifications described above may be variable appropriately by replacing or combining the unit of the present embodiments with other thereof.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus, comprising:
a mount table;
a transport mechanism configured to transport a substrate to the mount table; and
a controller configured to control the transport mechanism, wherein
the mount table includes a plurality of shelves arranged in an up-down direction,
the shelves are each configured to place the substrate thereon in a horizontal posture,
the transport mechanism includes:
a hand configured to support the substrate and configured to include a suction portion, the suction portion configured to flow gas along a first face of the substrate and configured to suck the substrate without contacting the substrate on any part of the hand;
a hand driving unit configured to move the hand; and
a suction adjusting unit configured to adjust a flow rate of the gas supplied to the suction portion, and
the controller receives, before the hand is inserted between two of the shelves adjacent to each other in the up-down direction, a detected result which indicates a detected shape of a substrate either taken from one of the shelves by the transport mechanism or placed on one of the shelves by the transport mechanism, and changes a flow rate of the gas to be supplied to the suction portion, depending on the detected shape of the substrate;

a plurality of the substrates are classified into, a first substrate that has a recess and does not include a protective plate made of glass, the recess being formed by a main portion of the substrate, located inward of a peripheral portion of the substrate, being recessed from the peripheral portion of the substrate; and a second substrate that does not have the recess, when a substrate taken from or placed on one of the shelves by the transport mechanism corresponds to the first substrate, the controller causes the suction adjusting unit to adjust the flow rate of the gas to be supplied to the suction portion, before the suction portion starts sucking the substrate, to a first flow rate, and when a substrate taken from or placed on one of the shelved by the transport mechanism corresponds to the second substrate, the controller causes the suction adjusting unit to adjust the flow rate of the gas, supplied to the suction portion when the suction portion starts sucking the substrate, to a second flow rate larger than the first flow rate.

2. The substrate treating apparatus according to claim 1, wherein the controller changes the flow rate of the gas supplied to the suction portion, depending on a thickness of a main portion of a substrate either taken from one of the shelves by the transport mechanism or placed on one of the shelves by the transport mechanism, the main portion located inward of a peripheral portion of the substrate.

3. The substrate treating apparatus according to claim 2, wherein the controller increases the flow rate of the gas supplied to the suction portion as the thickness of the main portion of the substrate taken from or placed on one of the shelves by the transport mechanism becomes thicker.

4. The substrate treating apparatus according to claim 1, wherein the suction portion is configured to flow gas along a top face of the substrate and configured to suck the substrate upward.

5. The substrate treating apparatus according to claim 4, wherein the hand includes:
  a base;
  a first receiver supported on the base and disposed below the substrate sucked by the suction portion, and capable of receiving at least either a back face of the substrate or an edge of the substrate;
  a second receiver supported on the base and disposed below the substrate sucked by the suction portion, and capable of receiving of at least either the back face of the substrate or the edge of the substrate; and
  a receiver driving unit configured to cause the second receiver to move with respect to the base so that the second receiver accesses the first receiver and moves away from the first receiver.

6. A substrate treating apparatus, comprising:
a mount table;
a transport mechanism configured to transport a substrate to the mount table; and
a controller configured to control the transport mechanism, wherein
the mount table includes a plurality of shelves arranged in an up-down direction,
the shelves are each configured to place the substrate thereon in a horizontal posture,
the transport mechanism includes:
a hand configured to support the substrate and configured to include a suction portion, the suction portion configured to flow gas along a first face of the substrate and configured to suck the substrate without contacting the substrate on any part of the hand;
a hand driving unit configured to move the hand; and
a suction adjusting unit configured to adjust a flow rate of the gas supplied to the suction portion, and
the controller receives, before the hand is inserted between two of the shelved adjacent to each other in the up-down direction, a detected result which indicates a detected shape of a substrate either taken from one of the shelves by the transport mechanism or placed on of the shelves by the transport mechanism, and changes a flow rate of the gas to be supplied to the suction portion, depending on the detected shape of the substrate,
a plurality of the substrates are classified into:
  a first substrate that has a recess and does not include a protective plate made of glass, the recess being formed by a main portion of the substrate, located inward of a peripheral portion of the substrate, being recessed from the peripheral portion of the substrate; and
  a third substrate that has a recess and includes a protective plate made of glass,
when a substrate taken from or placed on one of the shelves by the transport mechanism corresponds to the first substrate, the controller causes the suction adjusting unit to adjust the flow rate of the gas, supplied to the suction portion when the suction portion starts sucking the substrate, to a first flow rate, and
when a substrate taken from or placed on one of the shelves by the transport mechanism corresponds to the third substrate, the controller causes the suction adjusting unit to adjust the flow rate of the gas, to be supplied to the suction portion, before the suction portion starts sucking the substrate, to a third flow rate larger than the first flow rate.

7. A substrate treating apparatus, comprising:
a mount table;
a transport mechanism configured to transport a substrate to the mount table; and
a controller configured to control the transport mechanism, wherein
the mount table includes a plurality of shelves arranged in an up-down direction,
the shelves are each configured to place the substrate thereon in a horizontal posture,
the transport mechanism includes:
a hand configured to support the substrate and configured to include a suction portion, the suction portion configured to flow gas along a first face of the substrate and configured to suck the substrate without contacting the substrate on any part of the hand;
a hand driving unit configured to move the hand; and
a suction adjusting unit configured to adjust a flow rate of the gas supplied to the suction portion, and
the controller receives, before the hand is inserted between two of the shelved adjacent to each other in the up-down direction, a detected result which indicates a detected shape of a substrate either taken from one of the shelves by the transport mechanism or placed on of the shelves by the transport mechanism, and changes a flow rate of the gas to be supplied to the suction portion, depending on the detected shape of the substrate, a plurality of the substrates are classified into— a first substrate having a first predetermined shape; and a second substrate having a second predetermined shape; and the controller receives from a detector the detected result which indicates a detected shape of said substrate, and the controller responsively changes said flow rate of the gas supplied to the suction portion, before the suction portion starts sucking the substrate, depending on whether the detected shape is the first predetermined shape or the second predetermined shape.

* * * * *